United States Patent [19]
Ignjatovic

[11] Patent Number: 6,115,726
[45] Date of Patent: Sep. 5, 2000

[54] SIGNAL PROCESSOR WITH LOCAL SIGNAL BEHAVIOR

[75] Inventor: Aleksandar Ignjatovic, Union City, Calif.

[73] Assignee: Kromos Technology, Inc., Los Altos, Calif.

[21] Appl. No.: 09/144,360

[22] Filed: Aug. 31, 1998

Related U.S. Application Data

[60] Provisional application No. 60/061,109, Oct. 3, 1997, and provisional application No. 60/087,006, May 28, 1998.

[51] Int. Cl.[7] .................................................... G06F 17/10
[52] U.S. Cl. ............................................................ 708/300
[58] Field of Search ..................................... 708/702, 300, 708/309, 311; 702/53, 73, 74, 75, 76, 776; 324/76.12, 76.15, 76.17, 76.24, 76.38

[56] References Cited

U.S. PATENT DOCUMENTS

| | | | |
|---|---|---|---|
| 4,730,257 | 3/1988 | Szeto | 702/77 |
| 5,530,720 | 6/1996 | Marguinaud . | |
| 5,555,507 | 9/1996 | Oosawa et al. | 364/470.07 |
| 5,771,299 | 6/1998 | Melanson | 381/316 |

FOREIGN PATENT DOCUMENTS

0315366A2  5/1989  European Pat. Off. .

OTHER PUBLICATIONS

Naito, Yukihiro, et al., "An Adaptive Algorithm Based on Nonuniform Resolution Filter", Electronic & Communication in Japan, Part 3, vol. 79, No. 9, pp. 54–66, 1996.

*Primary Examiner*—Chuong Dinh Ngo
*Attorney, Agent, or Firm*—Flehr Hohbach Test Albritton & Herbert LLP

[57] ABSTRACT

A new signal processing method and a signal processing engine which can achieve extremely fast responsiveness to instantaneous changes in the behavior of the signal, and maintain the accuracy of standard harmonic methods. The signal processing engine unifies Nyquist's theorem and Taylor's theorem by means of polynomial approximations using linear operators, e.g. differential and integral operators. The signal processing engine samples the signal at a rate which is n times the band limit of the signal, where n is greater than 2, i.e. greater than the Nyquist rate, produces a digital representation of the sampled signal, and calculates the outputs of linear operators applied to polynomial approximations of the sampled signal. A switch mode power amplifier which incorporates the signal processing method and engine of the overcomes shortcomings of existing switching amplifiers, e.g. class "D" amplifiers. These shortcomings include: poor handling of highly reactive complex loads (e.g., speakers), usually requiring a duty cycle or feed-back adjustment with the change of the load; poor performance in the upper part of the bandwidth, including numerous switching artifacts; and high distortion, especially in the upper part of the spectrum. These shortcomings are all overcome using the local signal behavior signal processing method and engine of the invention.

35 Claims, 25 Drawing Sheets

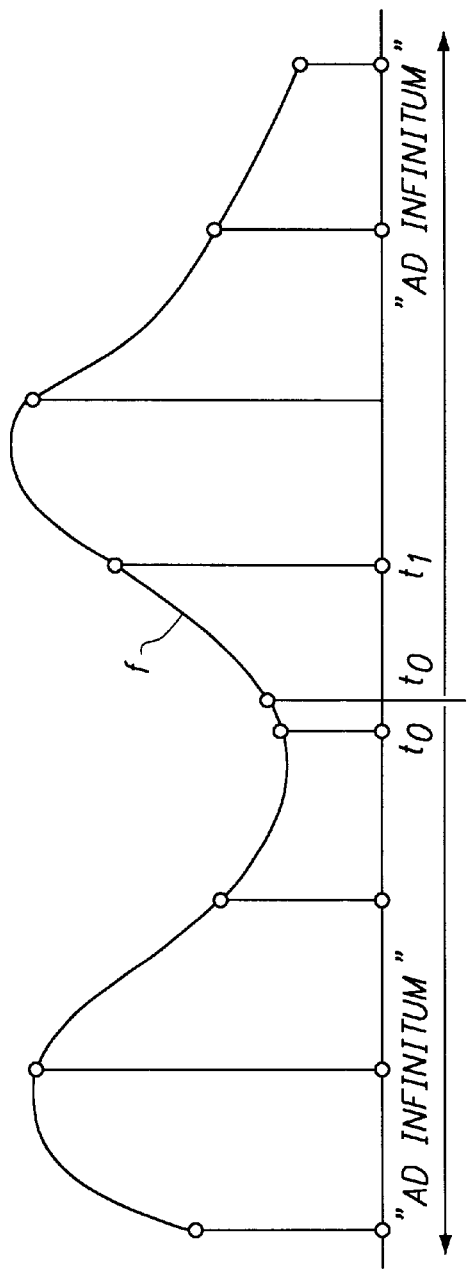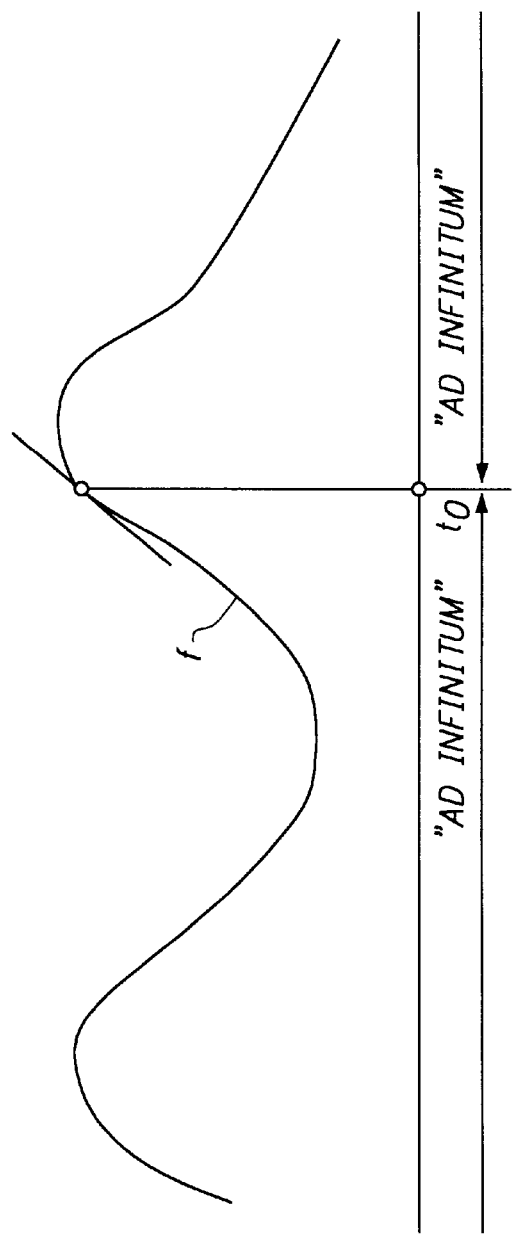
FIG. 1
FIG. 2

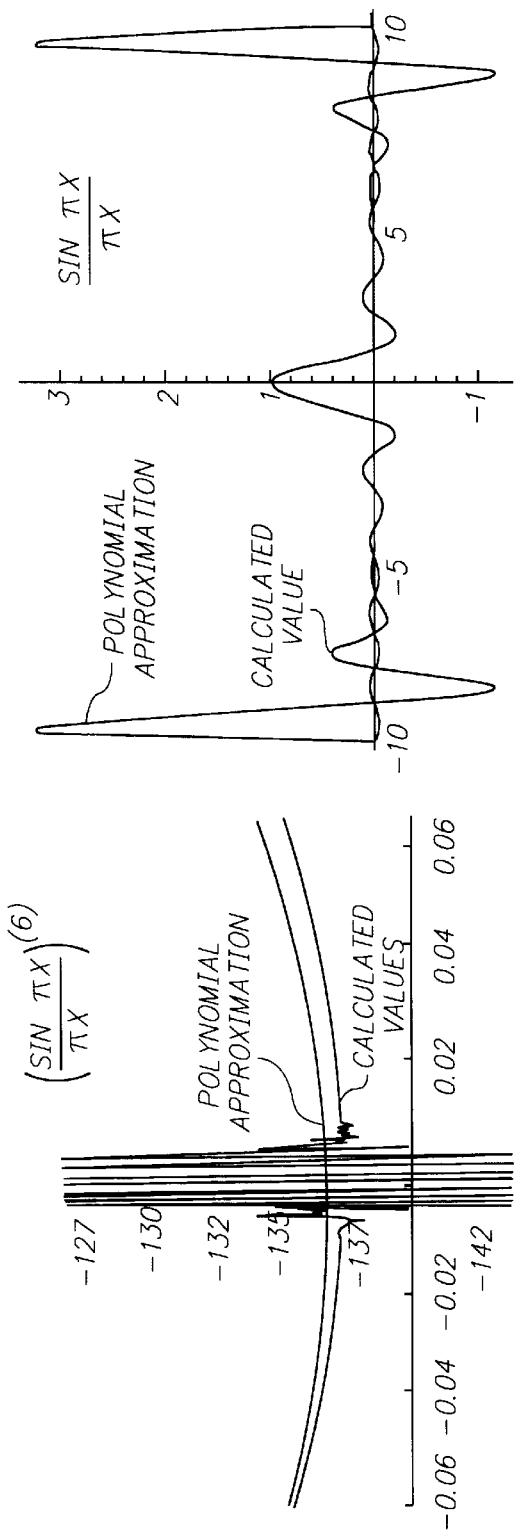
FIG. 4
FIG. 3
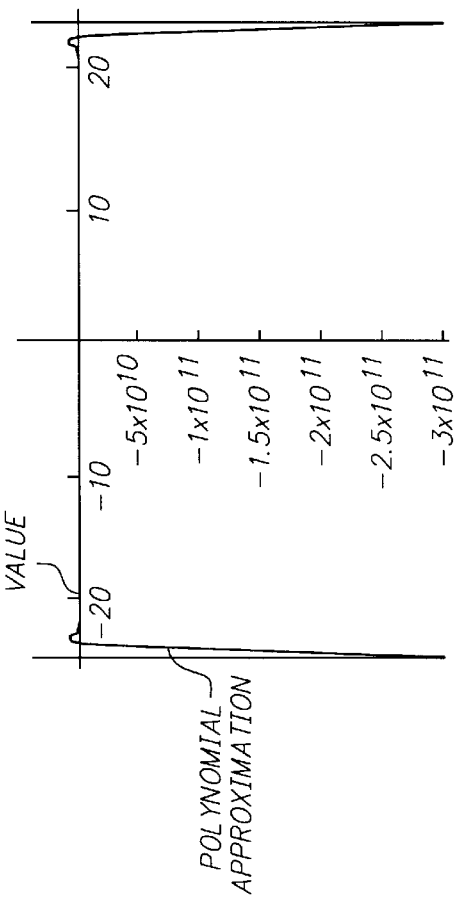
FIG. 5

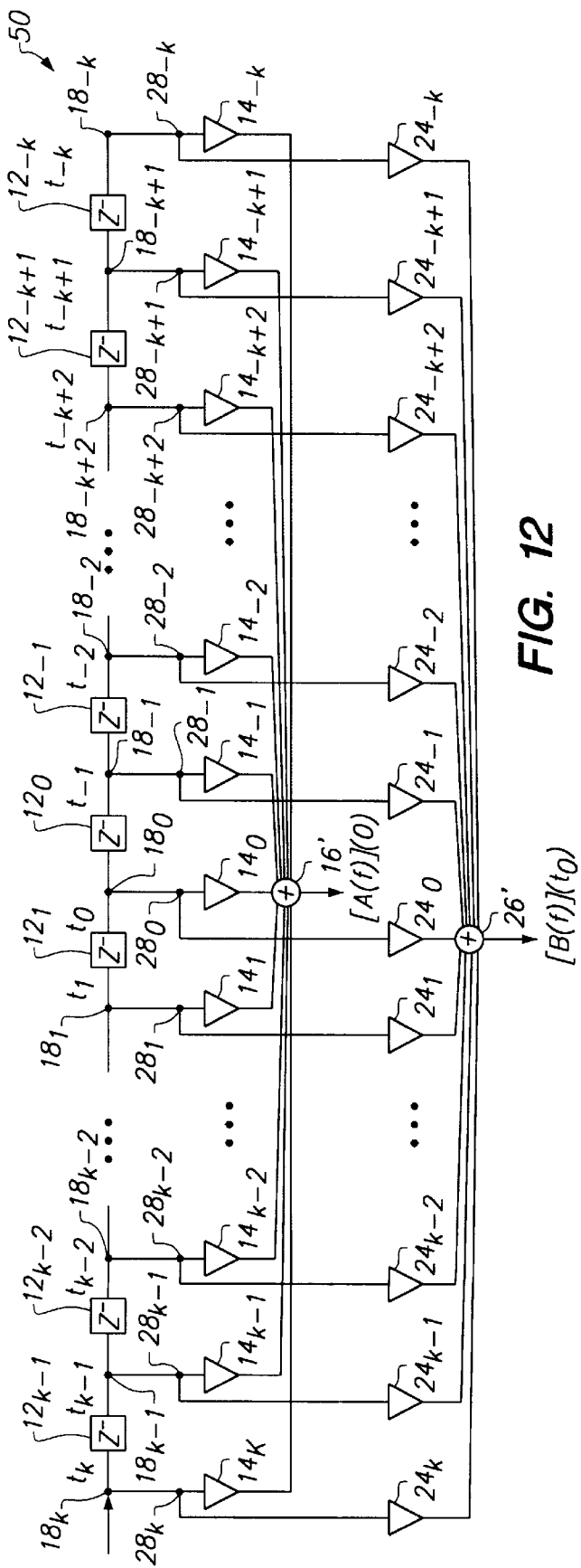
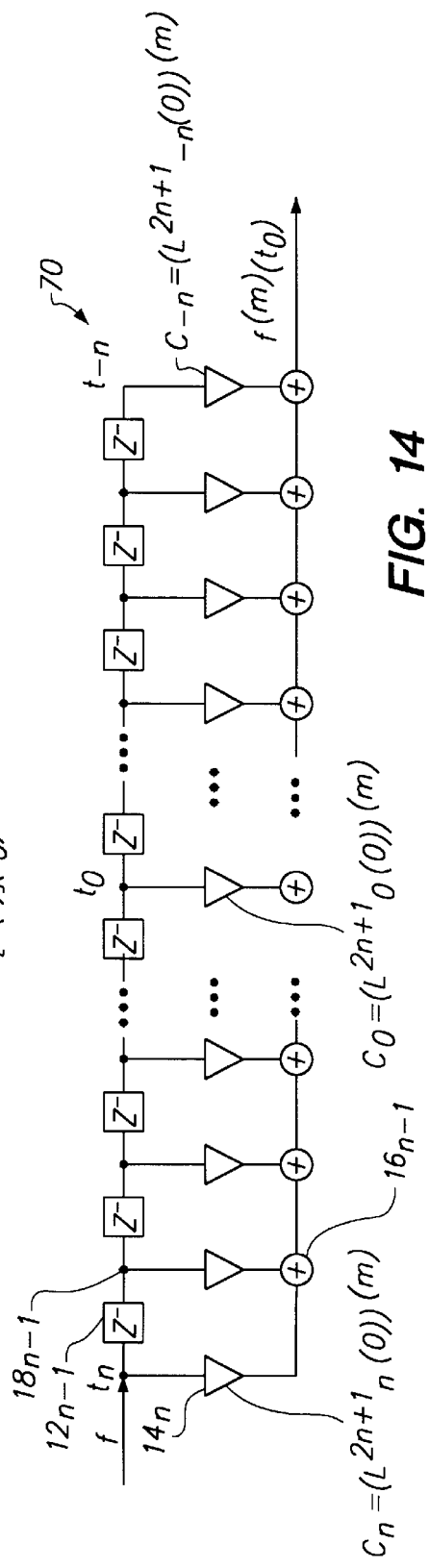
FIG. 12
FIG. 14

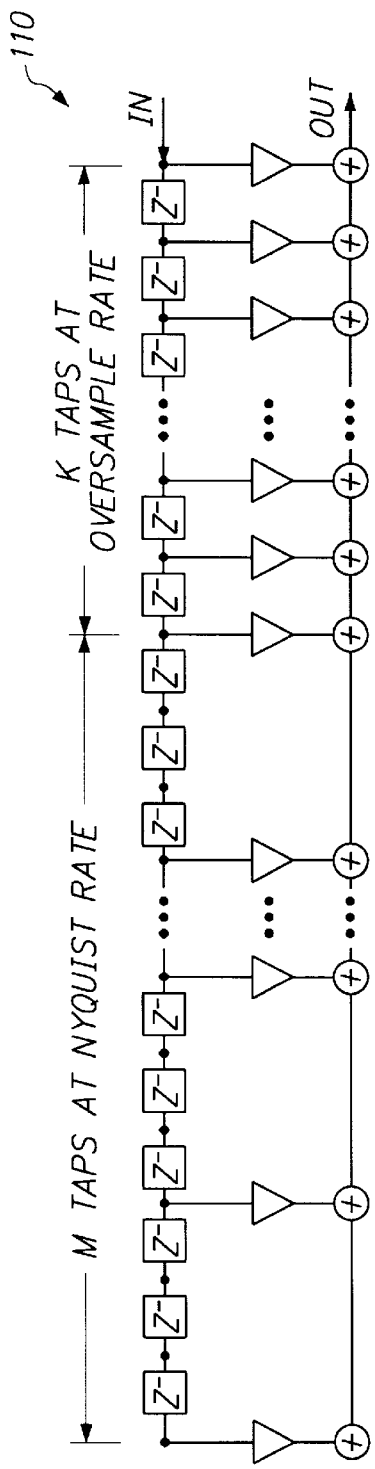
FIG. 28
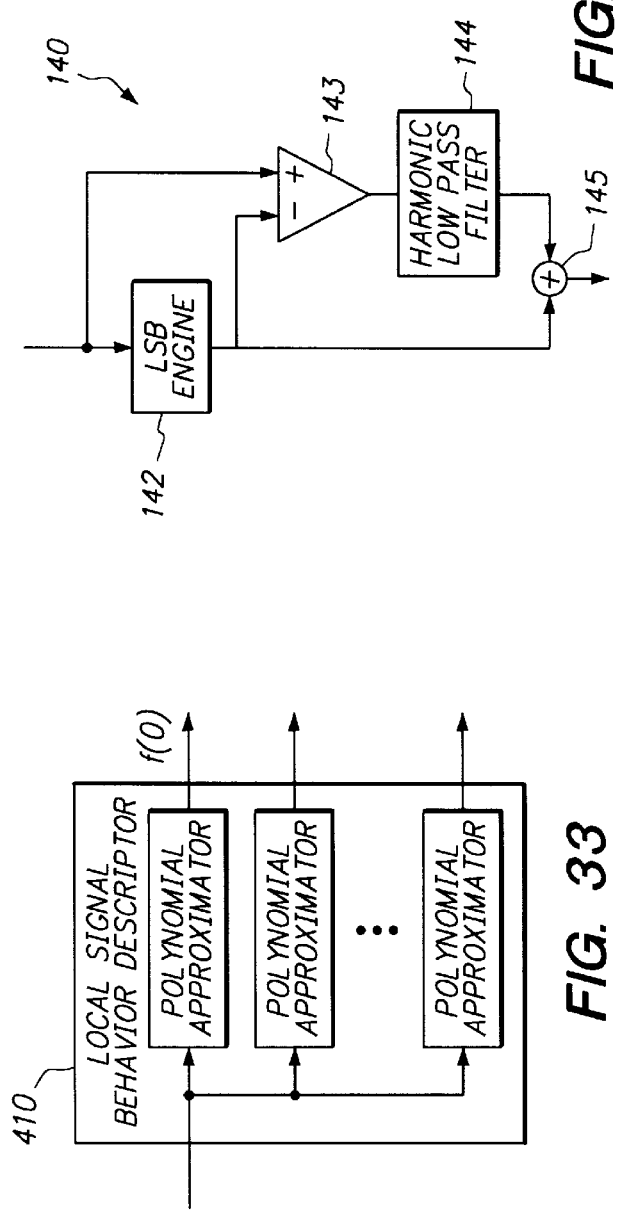
FIG. 34
FIG. 33

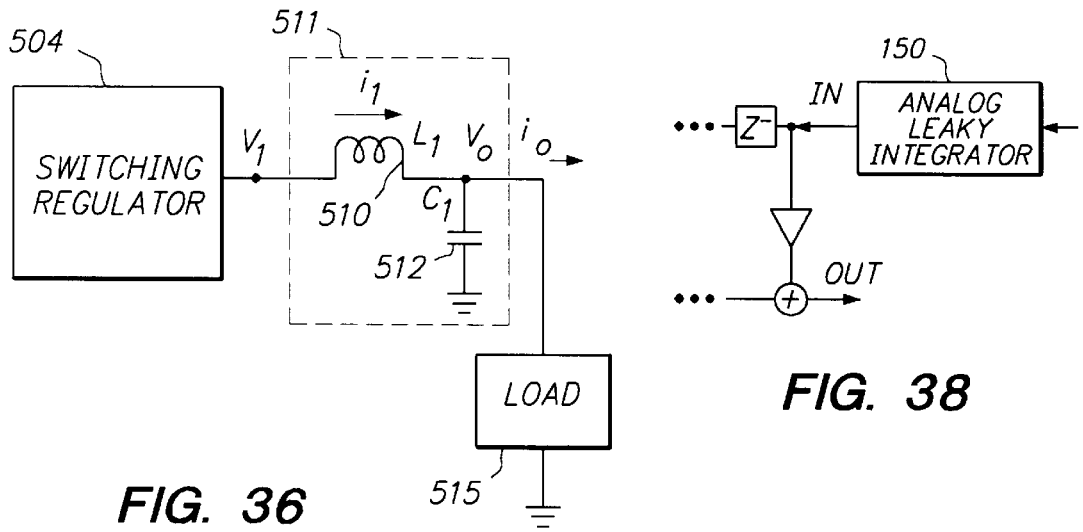
FIG. 36
FIG. 38
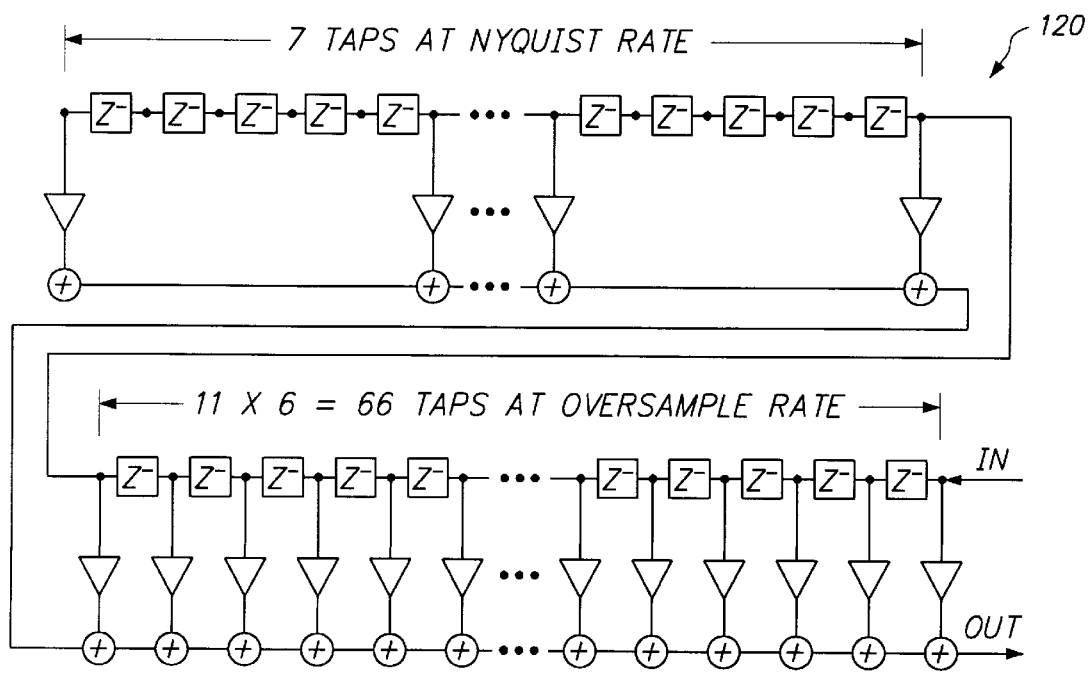
FIG. 37

6,115,726

SIGNAL PROCESSOR WITH LOCAL SIGNAL BEHAVIOR

CROSS REFERENCE TO RELATED APPLICATIONS

This application claims priority from my copending provisional U.S. patent applications 60/061,109, filed Oct. 3, 1997, and 60/087,006, filed May 28, 1998, the disclosures of both of which are incorporated herein by reference.

FIELD OF THE INVENTION

This invention relates to signal processing, and particularly to a method and apparatus for highly accurate real-time signal processing with essentially no delay. More particularly, the invention relates to a signal processing method and apparatus having predictive features which allow extremely fast responsiveness to instantaneous changes in the behavior of a signal.

BACKGROUND OF THE INVENTION

Numerical harmonic analysis was developed before the advent of computing machines for the purpose of analyzing motions which can be adequately represented as compositions of harmonic oscillations. It was important that the analysis methods were as efficient as possible because the computations were done by hand. In this respect, Fourier analysis is the fastest method which uses the minimal amount of data to analyze such signals. Also, the first digital computers and analog to digital (A/D) converters had limited speed and resolution, so the same methods used in manual computation were developed for automated computation. In recent years the processing speeds of computers, and speed and accuracy of A/D converters have dramatically improved. However, the same harmonic analysis methods which predated the advances in computing devices and A/D converters are still in dominant use. Harmonic methods were not intended for use in conditions requiring extremely small processing delay, and are deficient when used under such conditions for intrinsic reasons.

Present day digital signal processing relies primarily on computationally intensive Fourier analysis based methods which use a relatively large number of samples taken at the Nyquist rate. Such long sequences of samples encode the "global" behavior of the input signal, i.e., as used herein, the behavior of the signal over a relatively long period of time lasting many Nyquist rate sampling intervals. However, when the signal is represented by such values, sampled at the Nyquist rate, any direct access to the information about the "local" behavior of the input signal, i.e., as used herein, the behavior of the signal over short intervals of time, in a neighborhood between two consecutive Nyquist rate samples, is lost.

Harmonic analysis represents the signal using trigonometric functions. Local variations of a signal in time are very poorly represented by periodic functions which are highly uniform in time and are suitable only for global representations of the signal over longer periods of time, i.e., many tens, or hundreds or even thousands of Nyquist rate intervals.

Not having accurate information about the local behavior of a signal makes it difficult to act in real time because, at any given instant of time, action can only be based upon the instantaneous value of the signal and values from the past. Due to the uncertainty principle, harmonic analysis requires that the signal be "seen" over a relatively long period of time, i.e. a large number of consecutive Nyquist rate samples are needed, often windowed toward the ends of the interval. Thus, harmonic analysis can only be used in instances in which delay and/or phase shifts inherent in such methods may be tolerated.

Some of the most sophisticated real time applications currently used rely on wavelet methods with cardinal splines, however, these methods still use signal processing operators which are similar to those used in harmonic analysis.

Moreover, while Nyquist's theorem enables a complete representation of a band-limited signal using only the values of the signal sampled at the Nyquist rate, if the signal is given by values sampled at the Nyquist rate only up to a time $t_0$, then no past values between the sampling times are fully determined. If the value of the signal at a time t is approximated using the Nyquist rate values up to time $t_0 > t$, then the error of the interpolation (oversampling) depends on the energy of the signal contained in its part after $t_0$, and no a-priori bound can be given only in terms of $t_0 - t$, i.e. the number of samples between times t and $t_0$. This problem is usually solved by replacing the original signal by an (overlapping) sequence of signals obtained by windowing the original signal over a sufficiently long interval of time, thus restricting the number of samples on which the interpolated values can depend.

On the other hand, Taylor's theorem provides all past and future values of the signal from the values of all derivatives of the signal at a single instant in time $t_0$. However, Taylor's theorem is difficult to use in practice because the higher order derivatives, being extremely noise sensitive, cannot be evaluated precisely. Also, the truncated Taylor formula quickly accumulates error moving away from the point of expansion, $t_0$. Taylor's theorem implies that the signal is determined by all of its values in the past (i.e., not just the Nyquist rate values, but values at every instant). This determinism makes such a model, even if it were feasible, inadequate for practice.

There is a need for a signal processing method and a signal processor which can characterize the local behavior of a band limited signal in terms of some suitable parameters, and which can relate such signals' local behavior parameters to the spectrum of the signal, and thus also to the global behavior of the signal. Such a method should provide a computationally effective way of achieving extremely fast responsiveness to instantaneous changes in the behavior of the signal while maintaining the spectral accuracy achieved with standard harmonic methods.

SUMMARY OF THE INVENTION

The present invention provides a new signal processing method and a signal processor, referred to herein as the "engine," which can achieve extremely fast responsiveness to instantaneous changes in the behavior of the signal, and maintain the spectral accuracy of standard harmonic methods. The signal processing engine of the invention is useful primarily, but not exclusively, in real time applications.

A main feature of the signal processing method of the invention is in the manner by which it reconciles the limitations imposed by the Uncertainty Principle on low delay signal processing. Observing a signal over a short period of time implies insufficient accuracy of the representation of the signal's spectral content. However, in the method of the invention, this is overcome by a powerful aliasing principle (a Finite Local ε-base Theorem, set forth herein below) which allows local signal processing based on "spectral consistency" rather than absolute spectral accuracy, by locally defined operators, by a non-uniform representation of the spectrum of the signal which is more detailed for higher frequencies, and which require shorter windows for adequate resolution. These features allow local operations which "anticipate" the future values of the signal by unifying two paradigms, Nyquist's theorem and Taylor's theorem, using polynomial approximations of the input signal, and of the outputs of linear operators applied to polynomial approximations of the input signal, most notably various differential operators. The predicted values are fully adequate for computing parameters describing local signal behavior at the very end of the data stream of sampled values of the signal.

In a first aspect, the invention provides a signal processor comprising data description means for characterizing the local behavior of a band limited signal, the data description means comprising data acquisition means for sampling the signal at a rate which is n times the band limit of the signal, where n is greater than 2, and local signal behavior descriptor means for calculating the output of a linear operator applied to a polynomial approximation of the sampled signal. This representation can be either in a digital or in an analog format.

As used herein, the term "oversampling" refers to sampling a signal at a rate which is n times the band limit of the signal, where n is greater than 2, i.e., greater than the Nyquist rate. Since it is common to select sampling rates which are multiples of powers of 2, multiples of powers of 10, convenient components of available clock rates, and the like, it is understood that, as used herein, samples taken at the Nyquist rate may be at a rate which is at least, but not necessarily exactly twice the band limit of the signal.

The method of the invention is a form of a multirate signal processing. From the sequence of oversampled data, a Nyquist rate subsequence is selected, and this subsequence and the total oversampled data are used with very different roles both methodologically and computationally. In a multi-layered local signal behavior (LSB) method, sub-Nyquist rate sequences are also selected and used in a similar manner.

In a second aspect, the invention provides a signal processing method for characterizing the local behavior of a band limited signal, the signal processing method comprising the steps of sampling the signal at a rate which is n times the band limit of the signal, where n is greater than 2, and calculating the output of a linear operator applied to a polynomial approximation of the sampled signal.

In a third aspect, the invention provides a signal processing method for characterizing the local behavior of a band limited signal, the signal processing method comprising the steps of sampling the signal at a rate which is m times the Nyquist rate for the band limit of the signal, where m is greater than 1, and calculating a local signal description parameter for a sampled value of the signal at a time $t_0$, the local signal description parameter comprising the output of a linear operator applied to a polynomial approximation of the signal at the time $t_0$, the polynomial approximation comprising not more than about 12 to 24 Nyquist rate samples of the signal and substantially all of the samples of the signal from not more than about 1 to 5 Nyquist rate intervals.

In preferred embodiments, the linear operator comprises either a locally supported operator or an operator defined by recursion from locally supported operators, which may be a differential operator, an integral operator, an interpolation operator, an extrapolation operator or a combination of these operators.

In preferred embodiments, the invention provides a new class of differential operators, identified herein as chromatic derivatives because they encode the spectral features of the signal.

In preferred embodiments of the invention, the signal processing method and engine employ a polynomial approximation of an input signal which comprises a Lagrange polynomial approximation of the signal.

In preferred embodiments of the invention, the signal processing method and engine employ a polynomial approximation of an input signal which comprises a piecewise polynomial approximation of the signal.

In preferred embodiments of the invention, the signal processing method and engine may employ a transversal filter to implement a polynomial approximation of an input signal, and may employ a transversal filter to implement a linear operator applied to a polynomial approximation of the input signal.

In preferred embodiments of the invention, the data acquisition means employs a method which naturally rejects the out of band noise, including the quantization noise, and an adaptive technique for establishing the dynamic range of the A/D conversion. The data acquisition means has settings for full scale and resolution. Taking advantage of the predictive capabilities of the invention, a predicted value of the sampled signal is determined, the difference between the value of the sampled signal and the predicted value of the sampled signal are calculated, and the full scale and the resolution are adjusted in response to the difference between the value of the sampled signal and the predicted value of the sampled signal. In preferred embodiments, the data acquisition means also has a soft-start capability for dampening initialization transients.

In a fourth aspect, the invention provides switch mode amplifier comprising input means for receiving an input voltage, a low pass filter for providing an output voltage and output current to the load, a switching regulator for regulating a voltage input to the low pass filter, pulse width modulation control means for controlling the switching regulator, correction means for comparing the output voltage with the input voltage and supplying a correction current to the load based on the results of the comparison, an inner feedback loop for sensing a switching regulator output voltage at an output of the switching regulator and providing an inner feedback loop input to the pulse width modulation control means, the inner feedback loop input responsive to the switching regulator output voltage, the inner feedback loop comprising a first signal processor according to the first aspect of the invention, the first signal processor adapted to input the switching regulator output voltage and providing the audible component of the switching regular output voltage, an outer feedback loop for sensing the output current and the correction current and providing an outer feedback loop input to the pulse width modulation control means, the outer feedback loop input responsive to the output current and the correction current, the outer feedback loop comprising a second signal processor according to first aspect of the invention, the second signal processor adapted to input the sensed value of the correction current and to output a first derivative of the correction current, and a third signal processor according to the first aspect of the invention, the third signal processor adapted to input the sensed value of the output current, and to output a first derivative of the output current, and a fourth signal processor according to the first aspect of the invention, the fourth signal processor adapted to receive the input voltage and to output a second derivative of the input voltage to the pulse width modulation control means.

The present invention provides not merely a signal processing algorithm, but rather an entirely new approach to signal processing and an entirely new signal processing technology. The signal processing method and engine of the invention can be used to advantage in communications, analog to digital and digital to analog conversion, signal encoding, control, power electronics, signal compression, digital image encoding and processing, and empirical data processing and forecasting in economics and the social sciences.

BRIEF DESCRIPTION OF THE DRAWINGS

FIG. 1 is a graph which illustrates the nature and a limitation of Nyquist's theorem.

FIG. 2 is a graph which illustrates the nature and a limitation of Taylor's theorem.

FIG. 3 compares a graph of the sixth order derivative of (sin $\pi x$)/($\pi x$) with a graph of a corresponding polynomial approximation of the sixth order derivative of (sin $\pi x$)/($\pi x$) with both graphs calculated and plotted by the program Mathematica.

FIGS. 4 and 5 are graphs which compare a polynomial approximation of (sin $\pi x$)/($\pi x$) with the function (sin $\pi x$)/($\pi x$) on two different scales.

FIG. 12 is a diagram of an embodiment of a fourth general transversal filter which may be used to compute the outputs of a plurality of linear operators applied to polynomial approximations of a signal.

FIG. 14 is a diagram of an embodiment of a transversal filter which may be used to compute the $m^{th}$ derivative of a polynomial approximation of a signal.

FIG. 28 is a block diagram illustrating the components of an embodiment of a prediction filter of a signal processing engine according to a first aspect of the invention.

FIG. 33 is a block diagram illustrating components of an embodiment of a Local Signal Behavior Descriptor according to the invention.

FIG. 34 is a diagram which illustrates how filtering can be implemented in a mix of local signal behavior plus harmonic technologies.

FIG. 36 is a circuit diagram of certain components of the switch mode amplifier illustrated in FIG. 35.

FIG. 37 is a diagram of an embodiment of a transversal filter suitable for use in LSB Engine 2 and LSB Engine 3 in the switch mode amplifier illustrated in FIG. 35.

FIG. 38 is a diagram of a portion of the transversal filter illustrated in FIG. 37 with an analog leaky integrator coupled to the input of the filter.

DETAILED DESCRIPTION OF THE INVENTION

Figure 6:
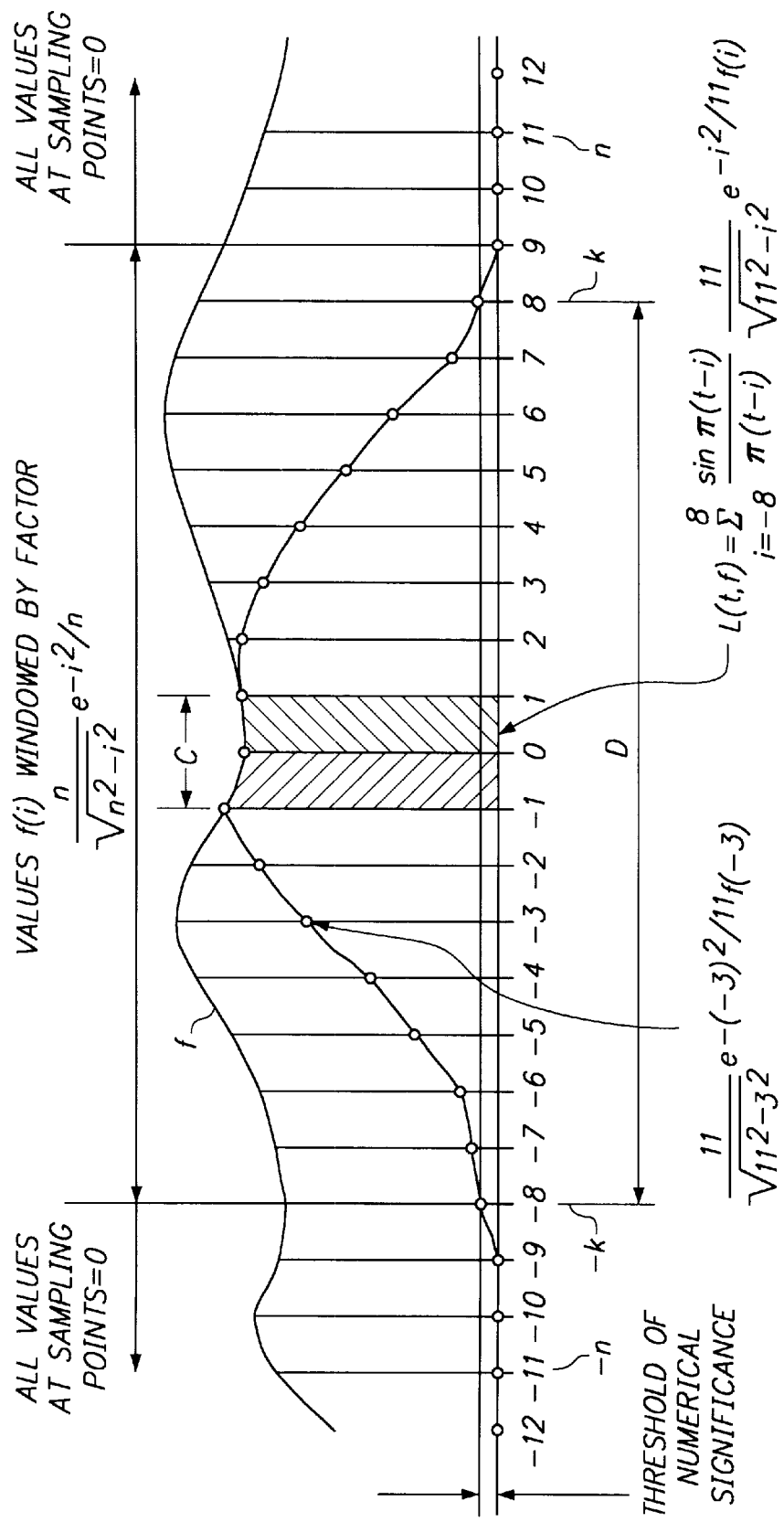
FIG. 6 is a graph which illustrates the effects of windowing.
Figure 7C:
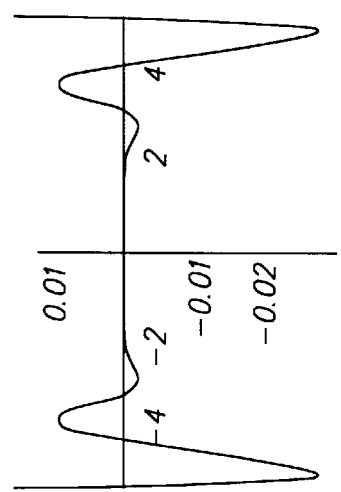
FIGS. 7A–7F are graphs which illustrate the error of approximation of (sin $\pi x$)/($\pi x$) by the Lagrangian polynomial $L_0^{47}(t)$.
Figure 7B:
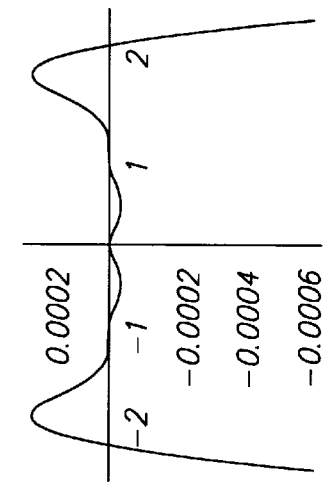
Figure 7A:
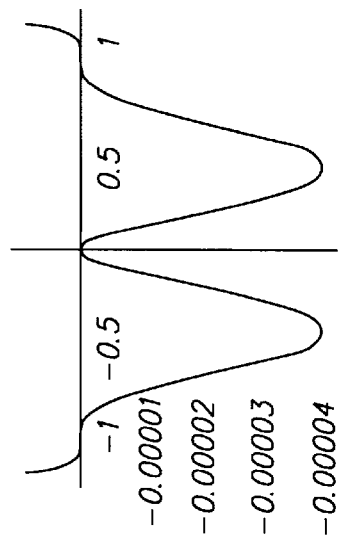
Figure 7F:
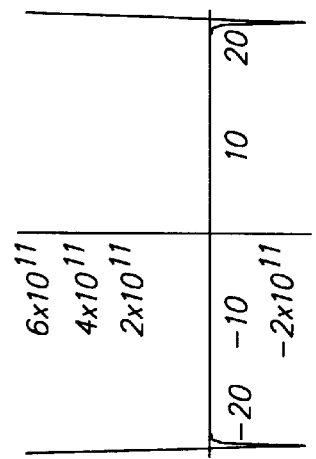
Figure 7E:
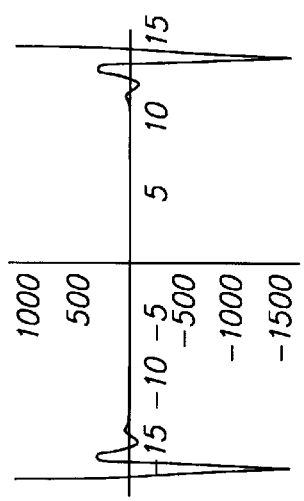
Figure 7D:
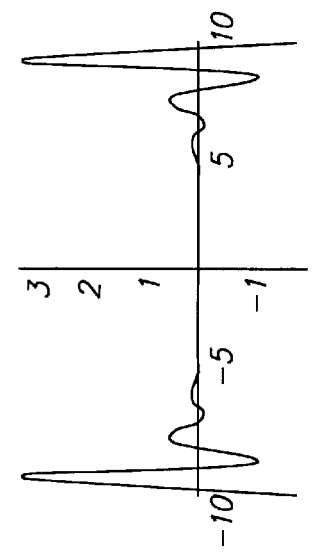

The signal processing method and engine of the invention represent an entirely new signal processing technology. In order to present a detailed description of preferred embodiments of the invention, it is appropriate to define certain principles of the mathematical basis of the invention, and certain operations employed by the invention. The following description includes the mathematical principles of the invention as they pertain to preferred embodiments of the signal processing method and engine of the invention, and also includes a description of an embodiment of a switch mode amplifier employing the signal processing method and engine in accordance with the invention.

The detailed description of the invention is presented according to the following outline:

I. Nyquist's Theorem

II. Taylor's Theorem

III. Polynomial Approximation and Differential and Integral Operators
  A. Differential Operators
  B. Integral Operators
  C. Locally Supported Operators
  D. Polynomial Approximations
  E. Lagrange Approximation Polynomials
  F. Polynomial Approximation Theorem IV. Signal Processing Based on Lagrangian Approximation Polynomials
  A. Approximation Polynomials Represented by Transversal Filters
  B. Differentiation
  C. Integration
  D. Σ-Δ Procedures
  E. Solving Linear Differential Equations Using Lagrangian Polynomial Approximations V. Basic Signal Processing Local Universes
  A. Finite Local ε-Base Theorem
  B. k-Monad
  C. p-Simplex
  D. m-Complex, Sequences of Local Universes VI. Local Signal Behavior Parameters VII. Interpolation Polynomials in General VIII. Derivation of Local Signal Behavior Processing Parameters IX. Signal Processing Engine X. Switch Mode Amplifier XI. Summary: Harmonic Analysis and Local Signal Behavior Processing If not stated explicitly otherwise, a unit interval of time is the interval between two Nyquist rate sampling points.

I. Nyquist's Theorem

According to Nyquist's theorem, every band limited signal can be reconstructed from its samples taken at a rate equal to twice the band limit of the signal. However, as illustrated in FIG. 1, many samples are needed to interpolate between the sampling points, e.g. at the point τ. FIG. 1 is a graph which illustrates the nature and a limitation of Nyquist's theorem. FIG. 1 is a graph of a band-limited signal f which is being sampled at the Nyquist rate. As indicated on the graph, in order to determine the value of f at time τ, which falls between sampling times $t_0$ and $t_1$, it is necessary to obtain samples essentially "ad infinitum" in both directions.

The reconstruction formula is:

$$f^*(t) = \sum_{i=-\infty}^{\infty} \frac{\sin\pi(t-i)}{\pi(t-i)} f(t_i).$$

In practice, many continuous signals can be entirely reconstructed from their discrete samples, taken sufficiently frequently. However, signal processing based on Nyquist's theorem poses several problems because it requires Nyquist rate samples from a very long interval of time, and intensive computations based on harmonic analysis. For example, in the reconstruction formula, the impact of the $n^{th}$ term on the values of the signal around t=0 can be on the order of magnitude $1/(n\pi)$. Thus, the impact of the terms decreases only linearly in n. Since the series $$\sum_{n=1}^{\infty} 1/n$$

diverges, the Nyquist interpolation formula converges only by virtue of the fact that f has finite energy, i.e., that $$\sum_{n=-\infty}^{\infty} f^2(n) < \infty.$$

This means that, in general, the values of the signal at very distant sampling points might be needed in order to reconstruct the signal even with limited accuracy and in a small interval around $t_0$. On the other hand, if the reconstruction formula is truncated up to a fixed large n, then the approximation remains accurate over a significant central interval of time between the points −n and n. Thus, the local behavior of the signal, i.e., its behavior over short intervals of time between two consecutive Nyquist sampling times is poorly encoded by Nyquist rate samples, while the global behavior is encoded accurately by Nyquist rate samples.

The value of a derivative of a signal, f, at a sampling point, $t_0$, is a local operation because the value of the derivative is entirely determined by values of f in an arbitrarily small neighborhood around $t_0$. However, since the local behavior of the signal is poorly encoded by Nyquist rate samples, local operations including derivatives are difficult to perform precisely on signals given at the Nyquist rate using the standard methods which are based essentially on the Nyquist reconstruction formula. To obtain the values of such local operations by the standard methods requires the use of samples, some of which are very far away from $t_0$. While possible in principle, clearly such calculations easily accumulate error.

In general, operations like differentiation which depend on the values of the signal only in a small interval of time (referred to herein as locally supported operators), cannot be accurately computed using methods which rely on a trigonometric representation of the signal. Such representations, as noted above, are responsible for the extreme inefficiency of harmonic analysis techniques when dealing with the local signal behavior.

On the other hand, operations based on the global behavior of the signal, e.g. taking the Fourier transform, or filtering in the frequency domain, can be performed very accurately using standard, global methods based on Fourier analysis and representation of the signal using trigonometric functions.

II. Taylor's Theorem

Band limited signals have several important characteristics. They are infinitely differentiable, and the $n^{th}$ derivative of f(t) is denoted by $f^{(n)}$(t). (As used herein, the first derivative of a function is denoted by a "prime," e.g. f'(t), and the $n^{th}$ derivative, where n>1, is denoted by the superscript, n, in parentheses, e.g. $f^{(n)}$(t), $f^{(2)}$(t), etc.) Also, it can be proven that the Taylor series of a band-limited signal converges everywhere to the value of the signal:

$$f(t) = \sum_{j=0}^{\infty} \frac{f^{(j)}(t_0)}{j!}(t-t_0)^j.$$

Since the value of a derivative of a signal at a point $t_0$ is defined as a limit, this value is uniquely determined by an arbitrarily small neighborhood of the point $t_0$. This is illustrated in FIG. 2 which illustrates the nature and a limitation of Taylor's theorem. FIG. 2 is a graph of a band-limited signal f. As indicated on the graph, in order to determine the value of the derivative of f at time $t_0$, it is necessary to obtain the values of the signal f(t) "ad infinitum" close to the point $t_0$.

Taylor's theorem can be important in practice because every band limited signal, f, can be entirely reconstructed from the values of all of its derivatives at a single instant in time, $t_0$. Thus, since the local behavior of f, i.e. the behavior of f in an arbitrarily small interval around to, determines the values of all derivatives of f at $t_0$, the behavior of the entire signal f at any instant in time is completely determined by its behavior in an arbitrarily small interval around $t_0$. This may be contrasted with Nyquist's theorem, which, for an ideal reconstruction, requires samples of the signal at infinitely many sampling instants, spread throughout the entire time.

However, due to noise and round-off error, it is difficult to determine high order derivatives with high accuracy. Also, while the local behavior of a signal is represented much better with Taylor's theorem than by Nyquist's theorem, global behavior is very poorly represented by Taylor's theorem since the error of the truncated Taylor's theorem up to some n increases very fast as t-$t_0$. increases.

This error is given by the following formula:
Let $$f^*_{n,t_0}(t) = \sum_{j=0}^{n} \frac{f^{(j)}(t_0)}{j!}(t-t_0)^{n-j}.$$

Then $$|f(t) - f^*_{n,t_0}(t)| \le \frac{\sqrt{E}\left(\frac{e\pi|t-t_0|}{n+1}\right)^{n+1}}{\sqrt{2\pi(n+1)(2n+3)}}.$$

Here E is the energy of the signal, i.e.

$$E = \frac{1}{2\pi}\int_{-\pi}^{\pi} |H(\omega)|^2 d\omega = \int_{-\infty}^{\infty} f^2(t)dt.$$

Clearly, if (n+1)>(eπ|t-$t_0$|), then (eπ|t-$t_0$|)/(n+1)<1, and the error drops rapidly as n further increases. Thus, n=9 provides an accurate representation of f, within one unit interval on the left and one unit interval on the right. To have the same accuracy within 2 Nyquist rate intervals requires Taylor's formula of degree 17. However, due to the inconvenient filtering features of differentiation, Taylor's formula is not used in this invention in its original form. The derivatives are replaced with certain linear differential operators which are much better suited for expanding band limited signals.

Comparing Nyquist's theorem with Taylor's theorem, it is apparent that the global (Nyquist's) and local (Taylor's) paradigms suffer from complementary problems. In the global paradigm, one must go too far away from a point of interest, $t_0$, in order to accumulate enough information from sampled values. In the local paradigm, one must get too close $t_0$ to in order to evaluate the derivatives at $t_0$.

I have determined that the two paradigms can be combined by means of certain linear operators, particularly certain differential operators, applied to polynomial approximations of signals, and by using certain quadratic minimizations.

III. Polynomial Approximations and Differential and Integral Operators

The signal processing method and engine of the invention use significantly modified versions of both the truncated Nyquist and Taylor formulas applied to band limited signals to allow real time processing.

A. Linear Differential Operators

For an input signal f(t), a differential operator D produces an output signal D(f), which is given by $$D(f) = a_0 f + a_1 f' + \ldots + a_n f^{(n)}$$

where $a_0, a_1, \ldots, a_n$ are real numbers.

B. Linear Integral Operators

For an input signal f(t), an integral operator I produces an output signal I(f), satisfying $$a_0(I(f)) + a_1(I(f))' + \ldots + a_n(I(f))^{(n)} = f.$$

The differential and integral operators are inverses to each other, i.e. integral operators provide solutions to differential equations corresponding to inverses of differential operators.

C. Locally Supported Operators

As defined herein, an operator F acting on band limited signals is a locally supported operator if the value [F(f)] at a point $t_0$, i.e. [F(f)]($t_0$), depends only on the values of f in the interval containing $t_0$, one unit length to the left and one unit length to the right, i.e. (t−1, t+1). This means that the values of outputs of such operators at any point $t_0$ can be determined from the values of the signal only in a small interval around the point $t_0$. Differentiation of any order, and integration over any interval contained within the interval ($t_{-1}$, $t_1$) are examples of locally supported operators. Integration procedures over longer intervals are defined using recursion, i.e. as infinite impulse response (IIR) operators.

D. Polynomial Approximations

Noise prevents differentiating a signal directly. For example, for a 60 Hz signal from an AC power supply with an amplitude of 110 volts contaminated by a 60 kHz switching noise of amplitude of only 1.1 mV, the 60 kHz noise component of the second derivative is 10 times higher than the amplitude of the main 60 Hz component.

In order to be able to use differential operators for processing signals, instead of relying on filtering out the noise, the invention uses methods which are naturally frequency selective and noise robust. These methods use a special kind of polynomial approximation, derived from Lagrangian interpolation polynomials, to collect the global information contained in the Nyquist rate samples taken over an interval of time T, where T is from several to several tens of Nyquist rate sampling intervals. These methods transform such global information into local information associated with the central subinterval C of T of length one or two Nyquist rate unit intervals.

One of the main features of such polynomials is the notion of scale which they inherit from the Lagrangian interpolation polynomials which are used to derive the polynomial approximations used. The scale provides filtering features of such polynomials which gives the necessary noise robustness. A second important feature of such polynomials is that they naturally provide (essentially exponential) windowing of the signal without any additional multiplication of the signal by a windowing function.

Polynomial approximations are extremely smooth. For example, round-off error prevents accurate evaluation of the sixth order derivative of (sin $\pi x$)/($\pi x$), even in double precision. FIG. 3 compares a graph of the sixth order derivative of (sin $\pi x$)/($\pi x$) with a graph of a corresponding polynomial approximation of the sixth order derivative of (sin $\pi x$)/($\pi x$). Both graphs were produced using the Mathematica program. It can be seen that in the neighborhood of the origin, the calculations of the sixth order derivative of (sin $\pi x$)/($\pi x$) produce values which oscillate violently. The oscillatory behavior of the graph of the sixth order derivative of (sin $\pi x$)/($\pi x$) is due entirely to the round-off error. Differentiation of the sixth order of (sin $\pi x$)/($\pi x$) produces an error of $2 \times 10^{15}$ around 0 with double precision accuracy, while a polynomial approximation is perfectly stable. Despite the fact that, from the analytical point of view, (sin $\pi x$)/($\pi x$) is infinitely differentiable at 0, from the point of view of numerical analysis, this function has a "singularity" at 0. Since for x=0 the denominator vanishes, and since differentiation increases the power of the denominator, the fact that the $n^{th}$ derivative of (sin $\pi x$)/($\pi x$) converges becomes grossly affected even by small round-off errors of double precision.

The sixth order derivative of the polynomial approximation of (sin $\pi x$)/($\pi x$) used in the method and signal processing engine of the invention is accurate to about one percent of the full scale of the sixth order derivative of (sin $\pi x$)/($\pi x$), and is perfectly stable and nearly insensitive to the round-off noise due to the large (Nyquist rate) spacing of interpolation points. This is an important feature of the Nyquist rate-spaced Lagrangian interpolation polynomials used in the method and engine of the invention.

When a signal is oversampled, the method and signal processing engine of the invention use Lagrangian approximation polynomials to capture the shape of the signal in a small interval around a sampling point. This is done by a special procedure using a quadratic optimization. Applying differential and integral operators can be made with exceedingly high accuracy, even at the end points of the data stream which explains why the method of the invention is the best method for real-time signal processing.

E. Lagrange Approximation Polynomials

Consider the standard Lagrangian approximation polynomial constructed over a set of sampling points. With n sampling times, $t_1, t_2, \ldots, t_n$, and the corresponding sampled values of the input signal $f(t_1), f(t_2), \ldots, f(t_n)$, then, with the variable t representing time, $$L_j^n(t) = \frac{(t-t_1)(t-t_2)\ldots(t-t_{j-1})(t-t_{j+1})\ldots(t-t_{n-1})(t-t_n)}{(t_j-t_1)(t_j-t_2)\ldots(t_j-t_{j-1})(t_j-t_{j+1})\ldots(t_j-t_{n-1})(t_j-t_n)}.$$

The polynomial, in the variable t $$L^n(t, f) = L_1^n(t)f(t_1) + L_2^n(t)f(t_2) + \ldots +$$
$$L_{n-1}^n(t)f(t_{n-1}) + L_n^n(t)f(t_n) = \sum_{i=1}^n L_i(t)f(t_i)$$

is the Lagrange interpolation polynomial, and $L_i(t)$ are the Lagrange coefficients. The superscript, n, is omitted whenever possible. The interpolating polynomial obtained from n sampled values $f(t_i)$ of the input signal f(t) at the sampling times $t_i$ for $1 \leq i \leq n$, is of degree n−1.

The values of $L_i(t)$ depend only on the spacing of the sampling times and the spacing of the time t of interpolation (or extrapolation). If the spacing of the samples is fixed, then the values of $L_i(t)$ depend only on the position of time t relative to the sampling times used in the interpolation. If this position is also fixed, then the interpolated (or extrapolated) value $L_n(t,f)$ is a linear combination with constant coefficients of the sampled values $f(t_i)$ of the signal. If the samples are equally spaced, then this distance will be called the scale of the Lagrangian polynomial. The scale can be shown to give filtering features to polynomials, and thus to provide noise robustness.

It can be shown that the accuracy of polynomial approximations is excellent in the unit subinterval in the center of the approximation interval, and rapidly decays from the center of the approximation toward the edge of the approximation interval, i.e., the interval spanned by sampling times used in the interpolation polynomial. This is illustrated in FIGS. 4 and 5 which compare a polynomial approximation of (sin $\pi x$)/($\pi x$) with the function (sin $\pi x$)/($\pi x$) on two different scales.

As shown in FIG. 4, around 0, the polynomial approximation of (sin $\pi x$)/($\pi x$) is indistinguishable from the function (sin $\pi x$)/($\pi x$) with an error of $4 \times 10^{-5}$. Between about −4 to +4, the error is indistinguishable at the resolution of the graph. However, the error grows to $10^2$ at around 10, and, as shown in FIG. 5, the error grows to $10^{11}$ at around 23, showing again the difference in nature between the polynomial and trigonometric interpolations.

Therefore, the signal processing method and engine of the invention replace the original signal by piecewise highly smooth replicas, allowing the use of locally supported operators, while overall producing minimal distortion of the spectrum. For this reason, while unsuitable for global methods, Lagrange's interpolation polynomial provides an excellent starting point for obtaining a class of polynomials which convert global signal behavior information into local signal behavior information.

This transformation of the global signal behavior information into the local signal behavior information also encodes spectral features of the windowed sampled values of the signal used in the approximation polynomial by the values of differential operators evaluated at points belonging to the central unit interval of approximation.

This transformation of the global signal behavior information into the local signal behavior information is based on a Polynomial Approximation Theorem which I posed and proved, and which is next presented.

F. Polynomial Approximation Theorem

As used herein, a $\pi$-band limited signal is a band limited signal wherein the band limit is expressed in terms of radians rather than Hz.

Let f be a π-band limited signal such that $$\sum_{i=-\infty}^{\infty} f^2(i)$$

is finite, and let $$L^n(t, f) = \sum_{i=-n}^{n} L_i^n(t) f(i)$$

be the Lagrange interpolation polynomial with Nyquist rate interpolation points f(i). Then, for sufficiently large n, $$L^n(t, f) \approx \sum_{i=-n}^{n} \frac{\sin\pi(t-i)}{\pi(t-i)} \frac{(n!)^2}{(n-i)!(n+i)!} f(i)$$

$$\approx \sum_{i=-n}^{n} \frac{\sin\pi(t-i)}{\pi(t-i)} \frac{n}{\sqrt{n^2-i^2}} e^{-i^2/n} f(i).$$

Conversely, assume that $a_i$'s are real numbers so that $$\sum_{i=-\infty}^{\infty} a_i^2$$

is finite. Then $$\sum_{i=-n}^{n} L_i^n(t) a_i$$

converges to a π-band limited signal f, such that $f(i)=a_i$. The rate of convergence depends directly on the distribution of the "energy" $\Sigma a_i^2$.

The above theorem is extensively used in the method of the invention to produce weights, e.g.

$$\frac{(n!)^2}{(n-i)!(n+i)!}$$

or to define operators.

One important feature of the above theorem is that Lagrangian interpolation polynomials of a band limited signal f(t) do not approximate the signal f(t) "directly" but through a sequence of the windowed signals $$\frac{n}{\sqrt{n^2-t^2}} e^{-t^2/n} f(t).$$

This is a useful feature since exponential windows provide a good representation of the upper part of the spectrum of the entire signal by its finite windowed piece. This fact actually has a different meaning for the method of the invention. The signal is so sharply windowed that its Fourier transform is entirely dominated by the transform of the window. However, such windowing provides more faithful behavior of the "chromatic derivatives" (to be introduced below), which in turn produces a smoothing effect on the approximation of the Fourier transform of the resulting signal.

However, for smaller values of n, e.g. n less than about 25 to 65, depending on the desired accuracy, the window is too narrow, i.e. $L^n_i(t)$ tend to be very small for all but a few values of i near the center of the approximation interval, and the polynomials $L^n_i(t)$ are not sufficiently accurate approximations of functions $$\lambda_i^n(t) = \frac{\sin\pi(t-i)}{\pi(t-i)} \frac{n}{\sqrt{n^2-i^2}} e^{-i^2/n}.$$

Large values of n, e.g. n greater than about 30 to 60, provide a very suitable window and an excellent approximation of functions $\lambda^n_i(t)$ by $L^n_i(t)$. But such large n produces too many polynomials $L^n_i(t)$ and the polynomials are of too large degree for practical purposes. An inspection of the values of these polynomials for −1<t<1 shows that a substantial fraction of the polynomials do not have numerically significant values, and thus can be omitted.

As used herein, the threshold of numerical significance is defined as follows: A coefficient c multiplying a sampled value f(i) in an expression is below the threshold of numerical significance if the product of c and the maximum value of the signal is below the resolution of the system and on the level of or below the round-off error. The threshold of numerical significance is illustrated in FIG. 6 which is described below.

The threshold of numerical significance here depends on the particular use of approximation polynomials. In some instances interpolation polynomials are used to interpolate from the Nyquist rate data. In such cases n is relatively large (e.g. 32–64), so that the corresponding window is sufficiently wide. In such case, k is sufficiently large that the value of $L^n_k(t)$ multiplied by the full scale of the input signal is below the resolution of the signal processing system, i.e. below the threshold of numerical significance. Such interpolations will be nearly always applied to the values of differential operators and thus will be followed by or be a part of an integration procedure attenuating the high frequency part of the spectrum of the interpolation error. In other applications, both n and k will be much smaller, since thus obtained Nyquist rate data will be used only as a constraint for a least square fit, and a much smaller number of sampled values will be sufficient.

Thus, instead of using the polynomial $$\sum_{i=-n+1}^{n} L_i^{2n}(t) f(i) \text{ (even number of points)},$$

or $$\sum_{i=-n}^{n} L_i^{2n+1}(t) f(i) \text{ (odd number of points)},$$

the method of the invention uses $$\sum_{i=-k+1}^{k} L_i^{2n}(t) f(i), \sum_{i=-k}^{k-1} L_i^{2n}(t) f(i), \sum_{i=-k}^{k} L_i^{2n}(t) f(i), \sum_{i=-k}^{k} L_i^{2n+1}(t) f(i)$$

where k is substantially smaller than n. For example, in one embodiment, n=23, and k=8.

Further, inspecting the coefficients of $L^{2n}_i(t)$ and $L^{2n+1}_i(t)$, shows that the highest powers of t have small coefficients, and that only a small subset of all of these powers have numerically significant coefficients such that for −1<t<1 their impact can be significant. Thus, after multiplication and regrouping of the same powers of t, the highest powers of t in $L^{2n}{}_i(t)$ and $L^{2n+1}{}_i(t)$ can be dropped. In an embodiment in which n=23 and k=8, the polynomial is of degree 16.

In this way, k approximation polynomials, $\tilde{L}^{2n+1}{}_i(t)$ and $\tilde{L}^{2n}{}_i(t)$ (the tilde, "~", indicating approximation), are obtained of degree m (<n). The exact values of k and m depend on the particular application, but are usually between 6 and 12 for k and between 12 and 18 for m. The corresponding interpolation polynomials $$\sum_{i=-k}^{k} \tilde{L}_i^{2n+1}(t)f(i) \text{ and } \sum_{i=-k_1}^{k_2} \tilde{L}_i^{2n}(t)f(i)$$

for $k1, k2$ equal to $k$ or $k - 1$ are denoted (here, using a bold L) by $$\mathbf{L}^{2n+1}{}_{2k+1}(t,f), \mathbf{L}^{2n}{}_{k1,k2}(t,f)$$

or may be denoted by just L(t,f) if no confusion (in the superscripts and subscripts) occurs, and is referred to herein as the basic approximation polynomial. Note that while t must belong to a small central sub-interval of the entire interpolation interval consisting of 2n or 2n+1 points, $k_1$ can be taken slightly different from $k_2$ if needed. In the signal processing engine of the invention, this basic approximation polynomial may be implemented in the form of a transversal filter. This is illustrated below. The above polynomials are all centered at 0. They can be shifted to obtain polynomials centered at an arbitrary sampling point s thus obtaining, for example $$\sum_{i=-k}^{k} \tilde{L}_i^{2n+1}(t-s)f(j+s), \text{ and } \sum_{i=-k_1}^{k_2} \tilde{L}_i^{2n}(t-s)f(j+s).$$

However, polynomial approximations used in the method and engine of the invention are unlike the wavelets used in the wavelet technique in that there is no single "mother wavelet." Each of the functions (sin π(t−j))/(π(t−j)) must have a separate interpolation polynomial. This is due to the fact that polynomial approximations are accurate only in their central area, and so for different j and k, the approximation polynomial for (sin π(t−j))/(π(t−j)) cannot be obtained by simply moving t to a new position within the approximation interval of the approximation polynomial for (sin π(t−k))/(π(t−k)).

The described construction of approximation polynomials has the following effects:

Let D be the interval of time containing exactly the sampling points appearing in the approximation polynomial L(t,f), including the zero values corresponding to $L^{2n}{}_i(t)$ and $L^{2n+1}{}_i(t)$ which were dropped (n≧|i|>k);

Let S be $\{i:|i|\geq k\}$;

D is called the interpolation domain and S is called the support of the approximation polynomial;

Let C be the central subinterval of D of length equal to one or two unit intervals;

Then, the values of the polynomial approximation in the central subinterval C are obtained by:

(i) Setting f(i) to 0 at all sampling points outside the interval S, the interval S having length 2k or 2k+1 (only these non-zero points will be counted and thus the corresponding approximation polynomial will be said to have an even (2k) number of points or an odd number of points (2k+1)).

(ii) The values of the polynomial approximation L(t,f) in the interval C obtained from the sampled values in S approximate a band limited signal which, outside D equals 0, and at any sampled values within D equals the windowed sample values $$\frac{1}{\sqrt{n^2 - i^2}} e^{-i^2/n} f(i).$$

Thus, for an odd number of interpolation points (2k+1), $$L(t,f) \approx \sum_{i=-k}^{k} \frac{\sin\pi(t-i)}{\pi(t-i)} \frac{n}{\sqrt{n^2 - i^2}} e^{-i^2/n} f(i),$$

and, for an even number of interpolation points (2k), $$L(t,f) \approx \sum_{i=-k+1}^{k} \frac{\sin\pi(t-i)}{\pi(t-i)} \sqrt{\frac{n+i}{n-i}} e^{-i^2/n} f(i),$$

and $$L(t,f) \approx \sum_{i=-k \text{ to } k+1} \frac{\sin\pi(t-i)}{\pi(t-i)} \sqrt{\frac{n-i}{n+i}} e^{-i^2/n} f(i).$$

The effects of such windowing can be seen in the graph illustrated in FIG. 6. FIG. 6 is a graph of a signal f which is being sampled, and, in an interval D from sampled points −k to k, windowed by the factor $$\frac{1}{\sqrt{n^2 - i^2}} e^{-i^2/n}.$$

Outside the interval D, all sampled values are forced to 0. Within a central interval C, the windowed values are represented by a Lagrangian approximation polynomial.

The graphs of FIGS. 7A–7F represent the error of approximation of (sin πt)/(πt) by the Lagrangian polynomial $L^{2\times 23+1}(t)$, i.e. $L^{47}{}_0(t)$:

$$\text{Error}_i^{47}(t) = L_i^{47}(t) - \frac{\sin\pi(t-i)}{\pi(t-i)}.$$

The graphs of FIGS. 7A–7F show that Lagrangian approximations are extremely accurate in the interval (−1,1) with an error≦4×10$^{-5}$, which sharply drops to 6×10$^{-4}$, i.e., by an order of magnitude, in the interval (−2,2). In the interval (−10,10), the error reaches a value of 3, while (sin πx)/(πx) at x=10.5 is less than 1/30, i.e., the error is more than one hundred times larger than the value of the function approximated. Finally, on the edges of the interpolation interval, the error approaches 10$^{11}$. Thus, the difference between Lagrangian approximations and trigonometric approximations is complementary. Polynomial approximations fail globally and are excellent locally, while trigonometric approximations fail badly locally and are excellent globally.

Thus, trigonometric interpolation of $$\sum_{i=-k}^{k} \frac{\sin\pi(x-i)}{\pi(x-i)} f(i)$$

"spreads" the Nyquist rate data provided by f(i) over long intervals, while polynomial approximations $$\sum_{i=-k}^{k} L_i(t) f(i)$$

concentrate such data to the small central subinterval of the approximation interval, but there they provide a very smooth and (for sufficiently large k) reasonably accurate approximation of the signal. This is also true of the first few derivatives of $(\sin \pi x)/(\pi x)$ and the corresponding derivatives of the polynomial approximation.

IV. Signal Processing Based on Lagrangian Approximation Polynomials

The fact that Lagrangian polynomials with Nyquist rate equally spaced interpolation points can approximate arbitrarily accurately any given $\pi$-band limited signal through a sequence of approximations obtained by windowing, has several important consequences. In general, increasing the number of interpolation points does not increase the accuracy of a polynomial approximation of an arbitrary function. Often only low degree polynomials can be used, e.g. for prediction-correction methods for solving differential equations.

The fact that increasing the number of interpolation points increases the accuracy makes it possible to design numerical algorithms for calculus on band limited signals which can apply only to such signals, but which, for such signals, are extremely efficient.

A. Approximation Polynomials Represented by Transversal Filters

Linear operators applied to polynomial approximations may be represented by transversal filters in the following manner. Let A be a linear operator which will be applied to a signal f. Then, the linear operator A, applied to a polynomial approximation of the signal f, at a central point 0 of the approximation, may be expressed as $$[A(f)](0) = \sum_{i=-k}^{k} [A(L_i^{2n+1})](0) f(i).$$

Figure 8:
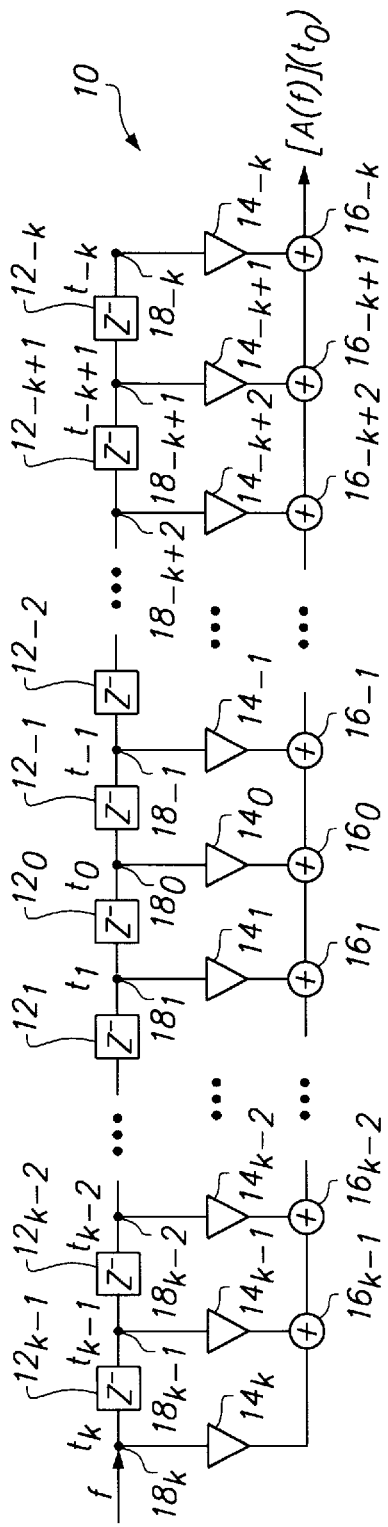
FIG. 8 is a diagram of an embodiment of a first general transversal filter which may be used to compute the output of a linear operator applied to a polynomial approximation of a signal.

In accordance with the invention, an embodiment of a transversal filter which computes the output of a linear operator of a polynomial approximation of a signal f, at a central point 0 of the approximation, may be constructed in a form illustrated in FIG. 8. In FIG. 8, an embodiment of a first general transversal filter 10 is formed by the combination of delay elements 12, amplifiers 14, and adders 16. The first general transversal filter 10 spans 2k+1 sampling times and 2k sampling intervals. The 2k+1 sampling times, corresponding to sampling times from $t_k$ to $t_{-k}$, where $t_k$ represents the current or most recent sampling time, and $t_{-k}$ represents the earliest sampling time in the sequence, i.e. 2k sampling times earlier, are represented by the junctions 18 between the respective delay elements 12.

In descriptions of embodiments of transversal filters herein, a reference to a general component will be by the general reference numeral, e.g. 12, 14, 16, 18. In descriptions of embodiments of transversal filters herein, a reference to a specific component will be by a specific reference numeral which identifies the respective general components, e.g. 12, 14, 16, 18, with a subscript identifying the position of the particular component in the particular transversal filter. For example, each junction 18 is allocated a specific reference numeral corresponding to the sampling time represented by the junction 18, the junction at $t_k$ is identified by reference numeral $18_k$, and the junction at $t_0$ is identified by reference numeral $18_0$. Likewise, each amplifier 14 is allocated a reference numeral corresponding to the junction 18, and hence sampling time, to which the amplifier's 14 input is coupled.

For the purpose of identification only, a delay element 12 is allocated a reference numeral corresponding to the sampling time preceding (to the right of) the interval represented by the delay element, i.e. the junction 18 following and coupled to the output of the respective delay element 12. For example, the delay element 12 between sampling times $t_1$ and $t_0$ is identified by reference numeral $12_0$, and the delay element 12 between sampling times $t_0$ and $t_{-1}$ is identified by reference numeral $12_{-1}$.

Likewise, adders coupled in the configuration illustrated in FIG. 8 will normally be identified by a reference numeral corresponding to the amplifier 14, and hence the junction 18 representing the earliest sampling time (rightmost) coupled to the input of the respective adder 16. Since there would generally be only one input at $t_k$, there typically will not be an adder 16 shown coupled only to the leftmost amplifier $14_k$. A reference to a component at a particular but unspecified position in the first general transversal filter 10 will be reference, e.g., to $12_i$, where i is within the limits (k to $-k$, or k$-1$ to $-k$) corresponding to the respective component.

In descriptions of embodiments of transversal filters implementing two or more linear operators independently operating on polynomial approximations of the same signal, e.g., in FIGS. 11 and 12 (described below), a second set of amplifiers and adders will be identified by the general reference numerals 24, 26, and so on for each additional set of amplifiers and adders.

The interval of time represented by a delay element 12 will generally be an oversampled rate interval, but, if so indicated, may instead be a Nyquist rate interval.

In order to simplify the FIGs. and the descriptions of the FIGs., all of the components are allocated reference numerals only in each of the first four exemplary embodiments of general transversal filters illustrated in FIGS. 8, 9, 11 and 12. In subsequent FIGs., only representative components, including components which are expressly referred to in the specification, are allocated reference numerals. Also, those components in the various embodiments of transversal filters illustrated in the FIGs. are generally allocated the same set of reference numerals as those shown in FIGS. 8, 9, 11 and 12, e.g. 12 representing delay elements, 14 representing amplifiers, 16 representing adders, and 18 representing junctions between delay elements 12. In some instances, these reference numerals may be shown with a prime, e.g. 16' representing a single adder substituted for a plurality of adders in a particular transversal filter.

Referring again to FIG. 8, the 2k delay elements 12 are coupled in sequence, with the most recent sample of the signal at $t_k$, i.e. junction 18k, input to delay element $12_{k-1}$ and amplifier $14_k$, and passed to succeeding delay elements 12 at the specified sampling rate. The 2k+1 amplifiers 14 have their inputs coupled to the respective junctions 18. Coupled to the input of a first adder $16_{k-1}$ are the outputs of the two leftmost amplifiers $14_k$, $14_{k-1}$. Coupled to the input of each succeeding adder $16_i$ is the output of the corresponding respective amplifier $14_i$ and the preceding adder $16_{i+1}$.

The gain of each respective amplifier $14_i$ corresponds to a coefficient, $c_i$, in the polynomial approximation above where, for the linear operator A, each $c_i$ may be calculated $$c_i = A(L^{2n+1}{}_i)(0).$$

The output from the first general transversal filter 10 is the output from the rightmost adder $16_{-k}$, and represents the polynomial approximation of the operator A, applied to the signal f, at central point 0 (corresponding to $t_0$).

Figure 9:
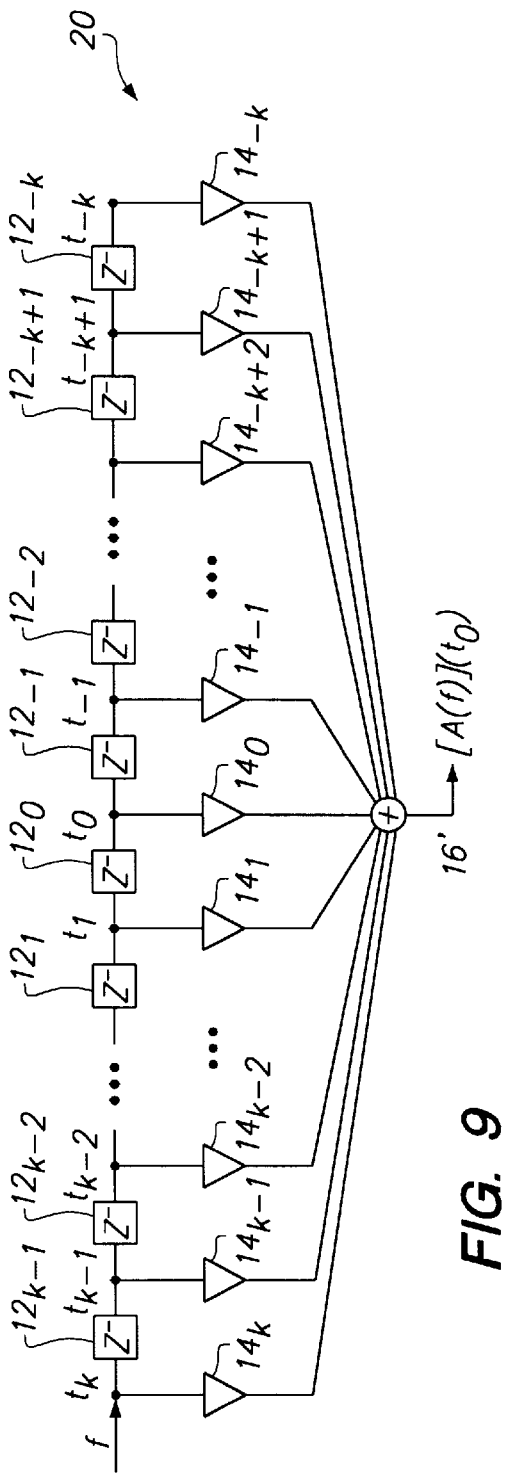
FIG. 9 is a diagram of an embodiment of a second general transversal filter which may be used to compute the output of a linear operator applied to a polynomial approximation of a signal.

The first general transversal filter 10 illustrated in FIG. 8 includes 2k adders 16. While it may be necessary, or useful, in some applications, to have access to interim sums, it is normally the case that the only desired output is from the rightmost adder $16_{-k}$. The configuration illustrated in the embodiment shown in FIG. 9 may then be used. FIG. 9 illustrates a second general transversal filter 20 in which the 2k adders 16 illustrated in the diagram of FIG. 8 are replaced by a single adder 16'. All other components remain unchanged in the configuration illustrated in FIG. 9.

Since, in typical digital implementations, the entire transversal filter may be implemented in a single microprocessor, the distinction between the multiple adders 16 and the single adder 16' becomes an implementation detail. For example, FIG. 10 illustrates a flow chart of an embodiment of a transversal filter routine 30 which is equivalent to the first and second general transversal filters 10, 20 illustrated in FIGS. 8 and 9.

Figure 10:
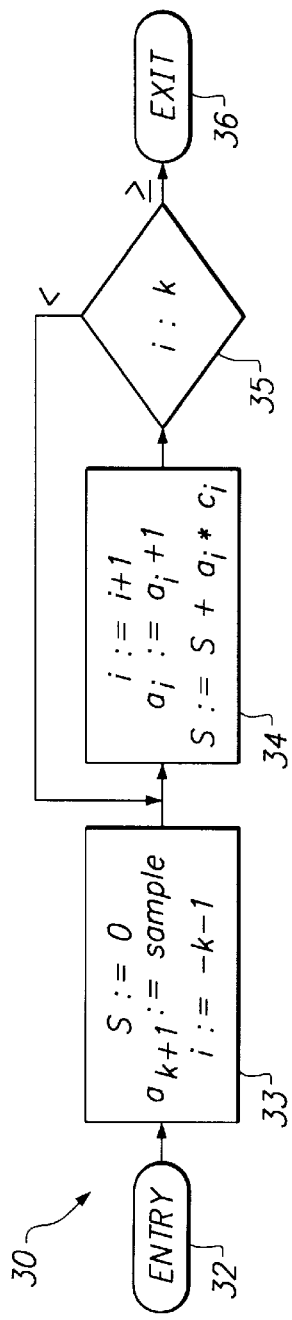
FIG. 10 is a flow chart of an embodiment of a routine which implements the first and second general transversal filters illustrated in FIGS. 8 and 10.

Referring to FIG. 10, the transversal filter routine 30 enters 32 and begins processing in an initialization block 33. In the initialization block 33, a sum S is initialized to 0, a temporary sample value $a_{k+1}$ is assigned the value of the current sample of the signal, and an index i is set equal to $-k-1$ (temporarily pointing to a fictitious junction $18_{-k-1}$). Then, in a processing block 34, i is incremented by 1, now having the value $-k$ (now pointing to the rightmost junction 18, junction $18_{-k}$), and the value of $a_{-k}$ is assigned the value of $a_{-k+1}$. This is equivalent to shifting the value of a sample through delay element $12_{-k}$. The product of $a_{-k}$ and $c_{-k}$ (representing amplifier $14_{-k}$) is then added to the sum S.

In a test block 35, the index i is compared with k (representing junction 18k) to determine if the computation is complete (computation is complete when i=k). If the computation is complete, the transversal filter routine exits 36. If the computation is not complete, processing continues through the loop until the computation is complete.

In the embodiment of the transversal filter routine 30 illustrated in FIG. 10, the processing moves from right to left along the transversal filter. The processing could likewise proceed from left to right, taking care to temporarily save the respective sample values so that they are not overwritten and lost in the shifting process.

As will be seen below in the description of a transversal filter illustrated in FIG. 13, by arranging a diagram of a transversal filter with multiple adders 16, by indicating a direction, or directions, of flow through the adders 16, and by showing the result output from a particular adder, e.g. $16_0$, helps to emphasize the point that the linear operator is applied to the polynomial approximation of the signal at the central point 0.

Figure 11:
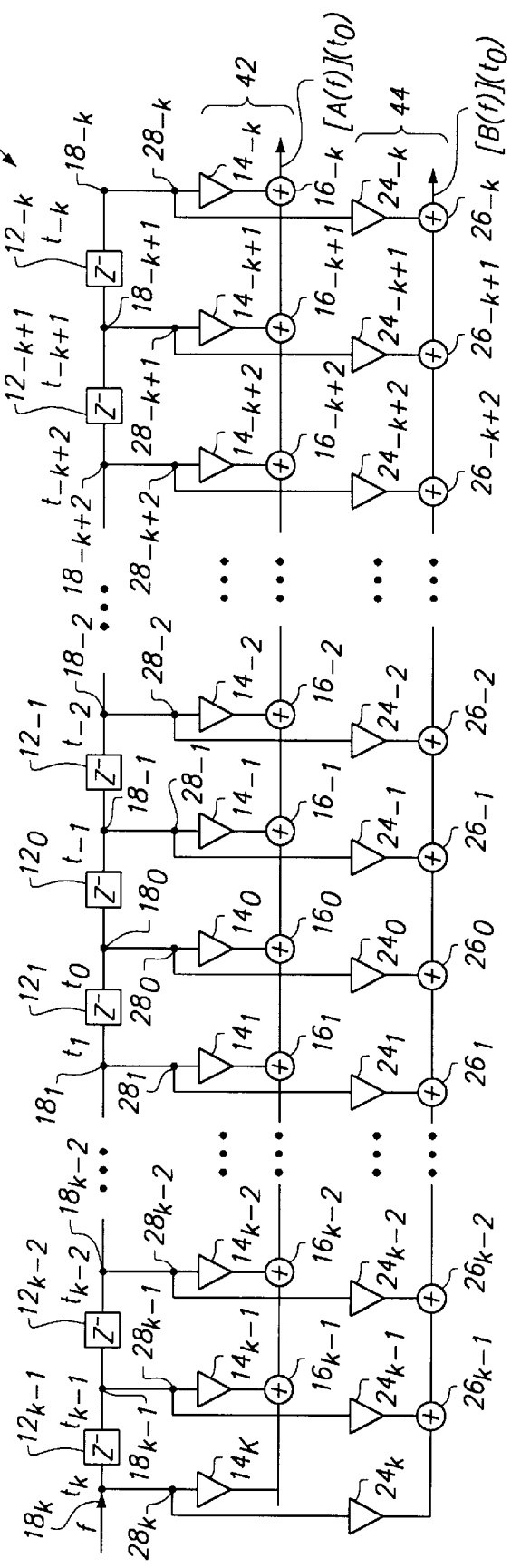
FIG. 11 is a diagram of an embodiment of a third general transversal filter which may be used to compute the outputs of a plurality of linear operators applied to polynomial approximations of a signal.

Two or more linear operators independently operating on polynomial approximations of the same signal may be represented by a third general transversal filter 40 arrangement as illustrated in FIG. 11. In FIG. 11, the third general transversal filter 40 includes a single set of delay elements 12, with two rows each of amplifiers 14, 24 and adders 16, 26. A first combination of amplifiers 14 and adders 16 coupled to the set of delay elements 12 forms a first transversal filter 42, and a second combination of amplifiers 24 and adders 26 coupled to the set of delay elements 12 forms a second transversal filter 44. The first row of amplifiers 14 represents a set of coefficients corresponding to a first linear operator A applied to a polynomial approximation of the input signal, and the second row of amplifiers 24 represents a set of coefficients corresponding to a second linear operator B applied to a polynomial approximation of the input signal. The output of the first transversal filter 42, at adder $16_{-k}$ is $[A(f)](t_0)$, and the output of the second transversal filter 44 at adder $26_{-k}$ is $[B(f)](t_0)$.

The two respective rows of adders 16, 26 in the embodiment illustrated in FIG. 11 may each be represented by a single adder as illustrated in FIG. 9. This is illustrated in an embodiment of a fourth general transversal filter 50 in FIG. 12. In the fourth general transversal filter 50, two rows of adders 16, 26 shown in the diagram of FIG. 11 are each replaced by a single adder 16', 26'.

In both FIGS. 11 and 12, additional linear operators applied to polynomial approximations the input signal may be included in the respective arrangements by coupling additional rows of amplifiers 14 and adders 16 to the respective junctions 18.

Figure 13:
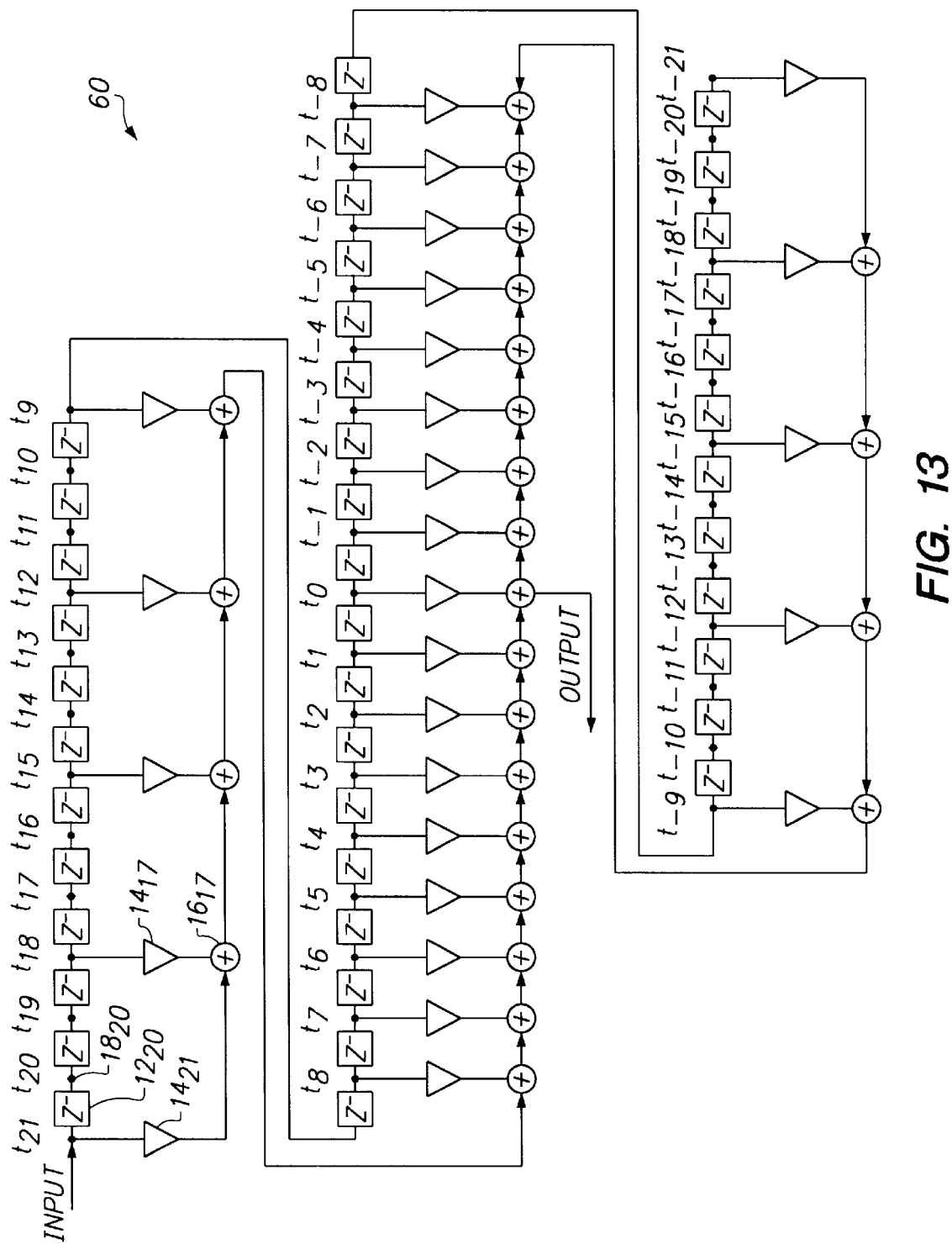
FIG. 13 is a diagram of an embodiment of a fifth general transversal filter which may be used to compute the output of a quadratic optimization procedure involving a polynomial approximation of a signal.
Figure 15A:
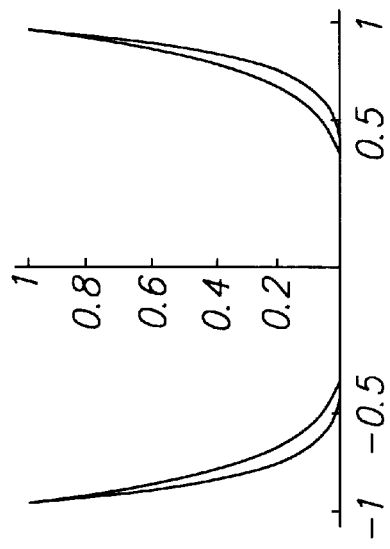
FIGS. 15A–15D are graphs of $|\omega/\pi|^{2j}$ for j=1, 2, 3, 4, 5, 6, 15 and 16.
Figure 15B:
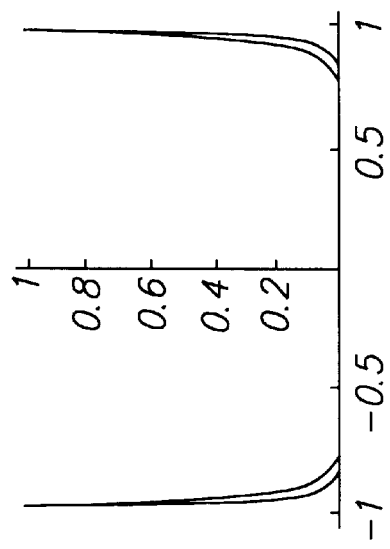
Figure 15C:
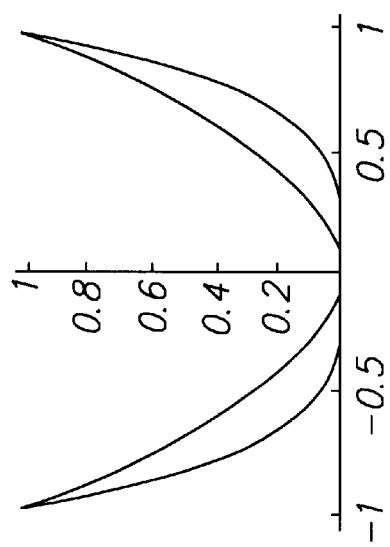
Figure 15D:
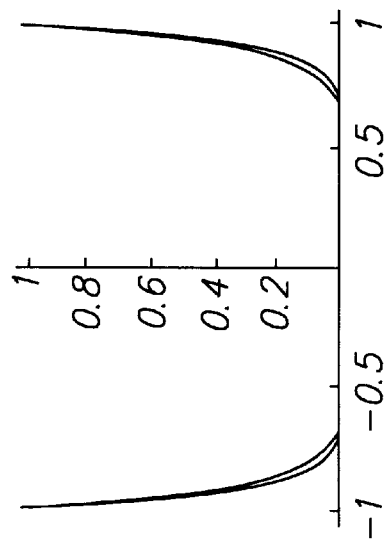

FIG. 13 is a diagram of an embodiment of a fifth general transversal filter 60 which may be used to implement a least square fit procedure applied to a polynomial approximation of an oversampled signal. It will be shown below, in the presentation of the Finite Local $\epsilon$-base Theorem, that a transversal filter of the form of the fifth general transversal filter 60 illustrated in FIG. 13 can be used to obtain a least square fit for oversampled data contained in a small interval I, in which the solution is a linear combination of Nyquist rate samples f(i), $-n \leq i \leq n$, and oversampled values $f(\tau_j)$ of the form $$a_k = \sum_{i=-n}^{n} c_i f(i) + \sum_{\tau \in I} d_i f(\tau).$$

In the fifth general transversal filter 60 illustrated in FIG. 13, the input signal is being sampled (not illustrated), and input to the transversal filter 60 at three times the Nyquist rate. In the embodiment illustrated in FIG. 13, the transversal filter includes 43 sampling times (from $t_{21}$ to $t_{-21}$) and 42 sampling intervals corresponding to 42 delay elements 12. In a "dense" interval corresponding to I, ranging from $t_9$ to $t_{-9}$, the transversal filter 60 includes an amplifier 14 (and corresponding adder 16) coupled to each junction 18 representing a respective sampling time. This dense interval will be shown below to correspond to the "central interval" of either a signal processing "micro-universe" (defined below) represented by the transversal filter, or a union of central intervals of a sequence of such micro-universes, i.e. a "complex" (which is defined below). However, outside the central interval, there is an amplifier 14 and adder 16 coupled to a junction 18 between every third delay element 12 (i.e. every third sampling interval). Thus, outside the central interval, the transversal filter 60 applies the linear operator to the oversampled signal, but only at the Nyquist rate, not at the oversampled rate according to the equation for $a_k$ above. Also, in FIG. 13, emphasizing the point that the linear operator is applied to the polynomial approximation of the signal at the central point 0 of the approximation, the arrows on the lines coupling the adders 16 all point toward the adder $16_0$ corresponding to $t_0$.

In the embodiment of a fifth general transversal filter 60 illustrated in FIG. 13, as shown in FIGS. 9 and 12, the adders 16 may be replaced by a single adder which has the oversampled rate inputs within the central region of the filter and the Nyquist rate inputs elsewhere.

The embodiments of transversal filters illustrated in FIGS. 8, 9, 11, 12 and 13 are general forms of preferred embodiments of transversal filters which may be implemented in accordance with the invention to obtain the output of a linear operator applied to a polynomial approximation of a signal at a central point of the approximation. The form of the equation for such polynomial approximations is shown above, as is the equation for calculating the coefficients which are represented by the respective amplifiers in the transversal filters.

B. Differentiation

The fact that $$\sum_{i=-k}^{k} L_i^{2n+1}(t)f(i) \approx f(t),$$

with an error of the form $$\frac{p(x)f^{(n+1)}(\xi)}{(2n+1)!} \text{ where } p(x) = (x-k)(x-k+1)\ldots x(x+k),$$

can be shown to imply that for $m^{th}$ derivative $$\sum_{i=-k}^{k} (L_i^{2n+1}(t))^{(m)} f(i) \approx f^{(m)}(t),$$

with an error of the form $$\frac{(p(x)f^{(n+1)}(\xi))^{(m)}}{(2n+1)!}.$$

Thus, an approximation of the derivatives of the signal at a given point, can be obtained by differentiating the Lagrangian polynomials $(L^{2n+1}{}_i(t))^{(m)}$ and evaluating these formal derivatives at the given point. This can be performed at the central point of the approximation using the corresponding transversal filter for the $m^{th}$ derivative. In general, for any approximation polynomial $P_j(t)$, the coefficients for differentiation, $c_j$, are calculated as $P^{(m)}{}_j(0)$, where $P^{(m)}{}_j(t)$ are the $m^{th}$ derivatives of the approximation polynomials. For a transversal filter representing the $m^{th}$ derivative, the coefficients, and hence the gain of each respective amplifier, may be calculated as $$c_i = (L^{2n+1}{}_i(0))^{(m)}.$$

FIG. 14 is a diagram of an embodiment of a general transversal filter for the $m^{th}$ derivative 70. The general transversal filter for the $m^{th}$ derivative 70 has the basic layout of the first general transversal filter 10 illustrated in FIG. 8. The coefficients represented by the amplifiers 14 have values, e.g., for amplifier $14_n$, $C_n = (L^{2n+1}{}_n(0))^{(m)}$, for amplifier $14_0$, $c_0 = (L^{2n+1}{}_0(0))^{(m)}$, and for amplifier $14_{-n}$, $c_{-n} = (L^{2n+1}{}_{-n}(0))^{(m)}$.

Problems of Differentiation in Signal Processing

It is known in numerical analysis that narrower spacing produces smaller approximation error in differentiation but dangerously increases the sensitivity to the round-off error. However, band limited signals allow a fundamentally better and more accurate approach by altering the Nyquist rate sampled values in order to ensure a better fit to the oversampled values. Thus, whenever possible, the signal processing method and engine of the invention differentiate only polynomials obtained from the Nyquist rate Lagrange interpolation polynomials, with interpolation values altered through a quadratic minimization procedure using oversampled values. This solves the problem of differentiation for low order derivatives (up to 2–4). However, higher order derivatives suffer from another, very serious problem. The higher order derivatives are, from the point of view of the spectral structure of the signal, non-informative, since their values are entirely determined by an extremely narrow highest band of the spectrum because the low harmonics become negligibly present in the spectrum of the derivative.

FIGS. 15A–15D are graphs of $|\omega/\pi|^{2j}$ for j=1, 2, 3, 4, 5, 6, 15 and 16 appearing as a multiplicative factor in the energy expression, but normalized so that the maximum value of $|\omega/\pi|^{2j}$ is 1:

$$\frac{E_i}{|\pi|^{2j}} = (1/2\pi)^2 \int_{-\pi}^{\pi} |H(\omega)|^2 |\omega/\pi|^{2j} d\omega$$

of the $j^{th}$ derivative $$f^{(j)}(t) = (1/2\pi) \int_{-\pi}^{\pi} |H(\omega)|(i\omega)^j e^{i\omega t} d\omega$$

of f(t).

However, this problem is not in the differentiation per se, but in the fact that derivatives are an extremely inconvenient base for the algebra of linear differential operators. For this purpose, the invention replaces the base consisting of the set $\{f^{(j)}(t): j \in N\}$ by the following recursively defined sequence of differential operators:

$D^{(0)}(f) = f(t)$,
$D^{(1)}(f) = f'(t)/\pi$,
$D^{(2)}(f) = 2f^{(2)}(t)/\pi^2 + f(t)$,
$D^{(3)}(f) = 4f^{(3)}(t)/\pi^3 + 3f'(t)/\pi$,
$D^{(4)}(f) = 8f^{(4)}(t)/\pi^4 + 8f^{(2)}(t)/\pi^2 + f(t)$,
$D^{(5)}(f) = 16f^{(5)}(t)/\pi^5 + 20f^{(3)}(t)/\pi^3 + 5f'(t)/\pi$, and
$D^{(6)}(f) = 32f^{(6)}(t)/\pi^6 + 48f^{(4)}(t)/\pi^4 + 18f^{(2)}(t)/\pi^2 + f(t)$.

In general, the recursion formula is:
$D^{(0)}(f) = f(t)$,
$D^{(1)}(f) = 1/\pi f'(t)$, and for $n \geq 1$,
$D^{(n+1)}(f) = 2/\pi [D^{(n)}(f)]' + D^{(n-1)}(f)$.

A straightforward calculation shows the following property of the above operators:

If $$f(t) = (1/2\pi) \int_{-\pi}^{\pi} H(\omega) e^{i\omega t} d\omega,$$

then $$D^n(f) = (1/2\pi) \int_{-\pi}^{\pi} i^n H(\omega) T_n(\omega/\pi) e^{i\omega t} d\omega,$$

where $T_n(x)$ is the $n^{th}$ Chebychev Polynomial in the variable x, i.e. for $T_0(x) = 1$,
$T_1(x) = x$, and
$T_{n+1}(x) = (2x)T_n(x) - T_{n-1}(x)$.

The significance of this is that $T_n(\omega/\pi) \leq 1$ for all $-\pi < \omega < \pi$, and that $T_n(\omega/\pi)H(\omega)$ encodes the spectrum of the signal very faithfully by comb-filtering the Fourier Transform $H(\omega)$, giving more "detail" to the high end of the spectrum. This is obvious from the graphs of the factor $|T_n(\omega/\pi)|^2$ appearing in the energy expression $$E(D^{(n)}(f)) = (1/2\pi)^2 \int_{-\pi}^{\pi} |H(\omega)|^2 |T_n(\omega/\pi)|^2 d\omega.$$

Figure 16B:
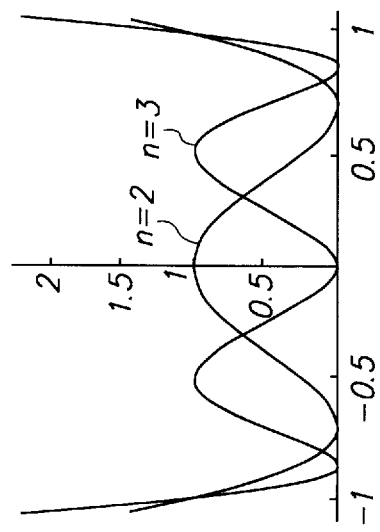
FIGS. 16A–16D are graphs of $|T_n(\omega/\pi)|^2$ for n=0, 1, 2, 3, 4, 5 and 16.
Figure 16D:
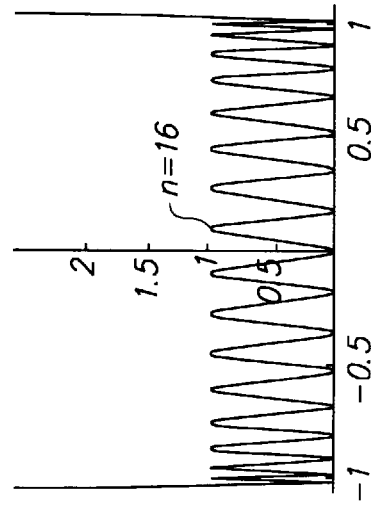
Figure 16A:
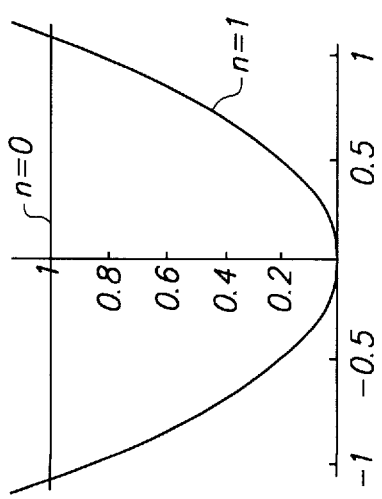
Figure 16C:
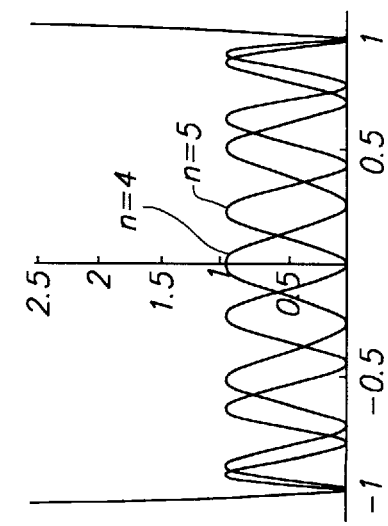

FIG. 16A is a graph of $|T_0(\omega/\pi)|^2$ and $|T_1(\omega/\pi)|^2$. FIG. 16B is a graph of $|T_2(\omega/\pi)|^2$ and $|T_3(\omega/\pi)|^2$. FIG. 16C is a graph of $|T_4(\omega/\pi)|^2$ and $|T_5(\omega/\pi)|^2$. FIG. 16D is a graph of $|T_{16}(\omega/\pi)|^2$. When this basis is compared with regular derivatives, $|f^{(16)}(\omega)|$ for $\omega=\pi$ has an extremely large value, $\pi^{16}$, while for small $\omega$ it is essentially 0, e.g. for $\omega=1/(2\pi)$, $|f^{(16)}(\omega)|<\frac{1}{2}^{16}$.

Because the differential operators $D^{(n)}$ of the invention encode the spectral features of the signal, they are referred to herein as "chromatic derivatives of order n."

There are other orthogonal families of polynomials having similar properties, e.g. Legendre polynomials. However, Chebyshev polynomials have an important property. They provide interpolations of continuous functions with a minimal pointwise ripple. This minimizes the maximal amplitude of spurious harmonics in the spectrum of the approximation error.

The signal processing method and engine of the invention use extensively the fact that polynomials are smooth and that chromatic derivatives evaluated directly by applying a single linear combination without calculating the derivatives separately encode a lot of information on the spectral content of the signal. Thus, e.g., $D^{(4)}(f)(\tau)$ may be obtained by a transversal filter with coefficients computed directly by evaluating $$((8\ P_i^{(4)}(t))/\pi^4) + ((8\ P_i^{(2)}(t))/\pi^2) + P_i(t)$$

using analytic differentiation, combining the resulting polynomials, dividing the coefficients by $\pi^4$ and only then substituting $t=\tau$. This prevents the accumulation of round-off error.

Chromatic derivatives are the basis for the Taylorian paradigm. Nyquist rate data is collected by polynomial approximations, additional oversampled data is added by enhancing the Nyquist rate data through a least square fit procedure, and then spectral content of the signal, with emphasis on the high end of the spectrum is encoded into a Taylorian paradigm using chromatic derivatives. Essentially, such differential operators account for the predictive features of the invention. They also bridge the global-local behavior of band-limited signals by encoding the spectral (thus global) features of the signal in the most local possible way, by the values of the chromatic derivatives.

C. Integration

As described above in the case of differentiation $$\sum_{i=-k}^{k} L_i^{2n+1}(t) f(i) \approx f(t)$$

implies $$\sum_{i=-k}^{k} L_i^{2n+1}(s) ds f(i) \approx f(s) ds.$$

Whenever the interval [a, b] is of length at most one unit interval long, with the error given by $$E(x) = \frac{p(x) f^{(2n+1)}(\xi)}{(2n+1)!}.$$

In all relevant applications it is determined that these approximations are of sufficient accuracy.

Given Nyquist rate sampling points $t_0$ and $t_1$ several Nyquist rate intervals apart, and an approximation polynomial $P(x,f)$ defined as a linear combination of polynomials $P_i(x)$ multiplied by the sampled values of the signal $f(t)$, then the integral $$\int_{t_0}^{t_i} f(x) dx$$

is obtained by recursion from the locally supported integral operators $$\int_{t_j}^{t_{j+1}} P(x, f) dx$$

as follows:

$$\int_{t_0}^{t_i} f(x) dx = \sum_{j=0}^{i-1} \int_{t_j}^{t_{j+1}} P(x, f) dx.$$

Figure 17:
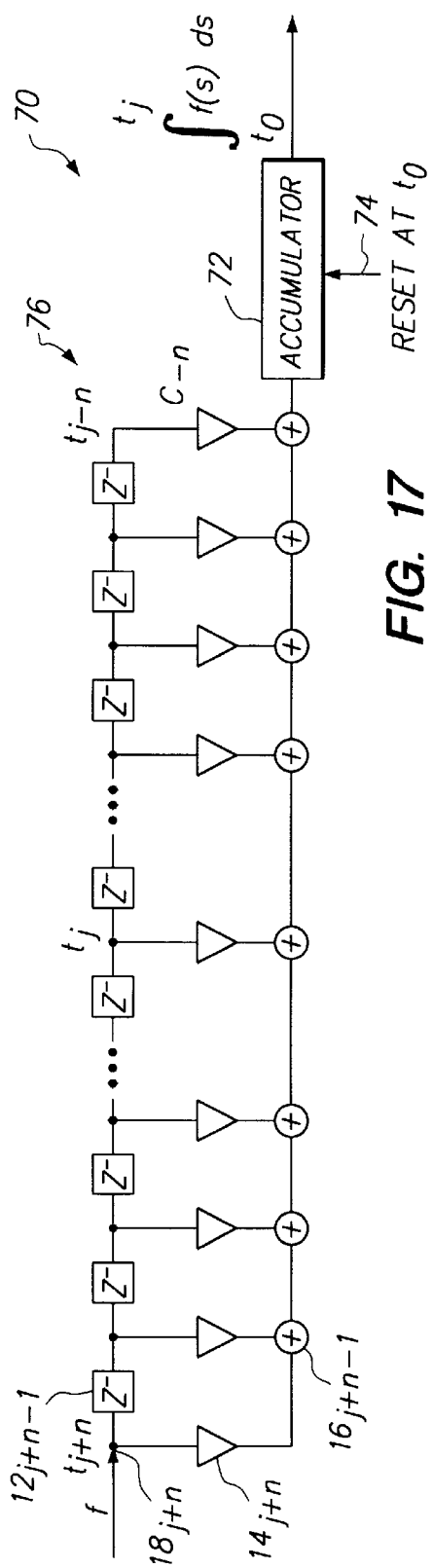
FIG. 17 is a diagram of an embodiment of a recursive infinite response (IIR) system performing integration of the input signal from a fixed point in time up to the time $t_j$.

This is accomplished by a recursive infinite impulse response (IIR) system as illustrated in FIG. 17.

In FIG. 17, an IIR system 70 includes a transversal filter 76 coupled to the input of an accumulator 72. The output of the accumulator is the polynomial approximation of the integral above. The transversal filter 76 produces an approximation of $$\int_{j-1}^{t_j} f(s) ds$$

The accumulator 72 sums these integrals to obtain $$\int_{t_0}^{t_i} f(s) ds$$

for some fixed starting point $t_0$ corresponding to the reset time of the accumulator.

Clearly the earliest sample used in the above calculation is $t_{0-n}=t_{-n}$; $t_0$ is the reset instant of the accumulator A. The values $c_j$ of $c_{-n}$ to $c_n$ are equal to $$\int_0^1 P_j(t) dt$$

which is explicitly calculated from the definition of $P_j(t)$ analytically (e.g. using Mathematica).

Integrals of the form $$\int_{-\infty}^{t_i} f(x) dx$$

are intrinsically unstable, because IIR operators are sensitive to low frequencies. A variant of the IIR system 83 in FIG. 17 without a reset would calculate such integrals, but the accumulator 82 can easily overflow unless appropriate measures are taken. Integration can be made "leaky" if, for example, an accumulator for $S_{i+1}:=S_i+x_{i+1}$ is replaced by $S_{i+1}:=qS_i+x_{i+1}$ where $q<1$ and $q\approx 1$, e.g. $q=0.999$. (As used herein, :=is the assignment operator, commonly also represented by the left arrow ←.) This clearly introduces some distortion on the low end of the spectrum, but all integration procedures over long intervals suffer from such "drifts". If such integration is followed by a differentiation as in Σ-Δ filtering procedures, then the impact of the drift is relatively small. However, a more accurate solution applicable to Σ-Δ procedures, is described below.

D. Σ-Δ Procedures

If the signal is given in an analog format or on an oversampled scale, then either an analog integration can first be used, or an integration using summation of integrals over the unit length intervals obtained from the appropriate polynomial approximations on an oversampled scale, can be used as described above. If the signal is very substantially oversampled, then a summation of the oversampled values can be divided by the length of the oversampling interval to produce a good approximation of the integral $$I(t) = \int_{-\infty}^{t} f(x)dx.$$

Figure 18:
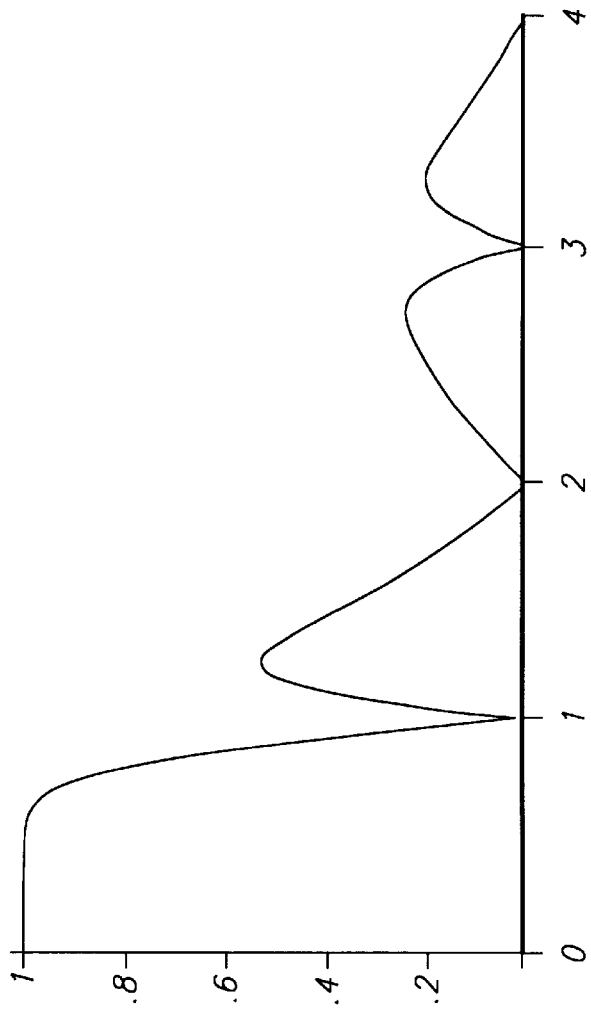
FIG. 18 is a graph of the characteristic of an embodiment of a $\Sigma$-$\Delta$ filter.

The value I(t) can be then either sampled at the Nyquist rate scale (if the signal is given in the analog format) or, if the value of the above integral is obtained by polynomial approximations and summation, these values can be decimated to obtain values of this integral at sampling points spaced at the Nyquist rate unit interval. Applying differentiation using Lagrangian polynomials produces a low pass filtering on the input signal which has been integrated. Thus, this is a Σ-Δ (sigma delta) filtering procedure. If the signal is oversampled at a rate of only 4 times the Nyquist rate, then a filter with the characteristics illustrated in FIG. 18 is obtained. In a preferred embodiment, this Σ-Δ procedure may be integrated with a least square fit approach designed for the case of signals with a very large level of out of band noise. The least square fit approach is provided by a transversal filter of the form of the fifth general transversal filter 60 illustrated in FIG. 13, and described below in the presentation of the Finite Local ε-base Theorem. This theorem produces a filter with an extremely sharp cut off and low out of band ripple.

Figure 19:
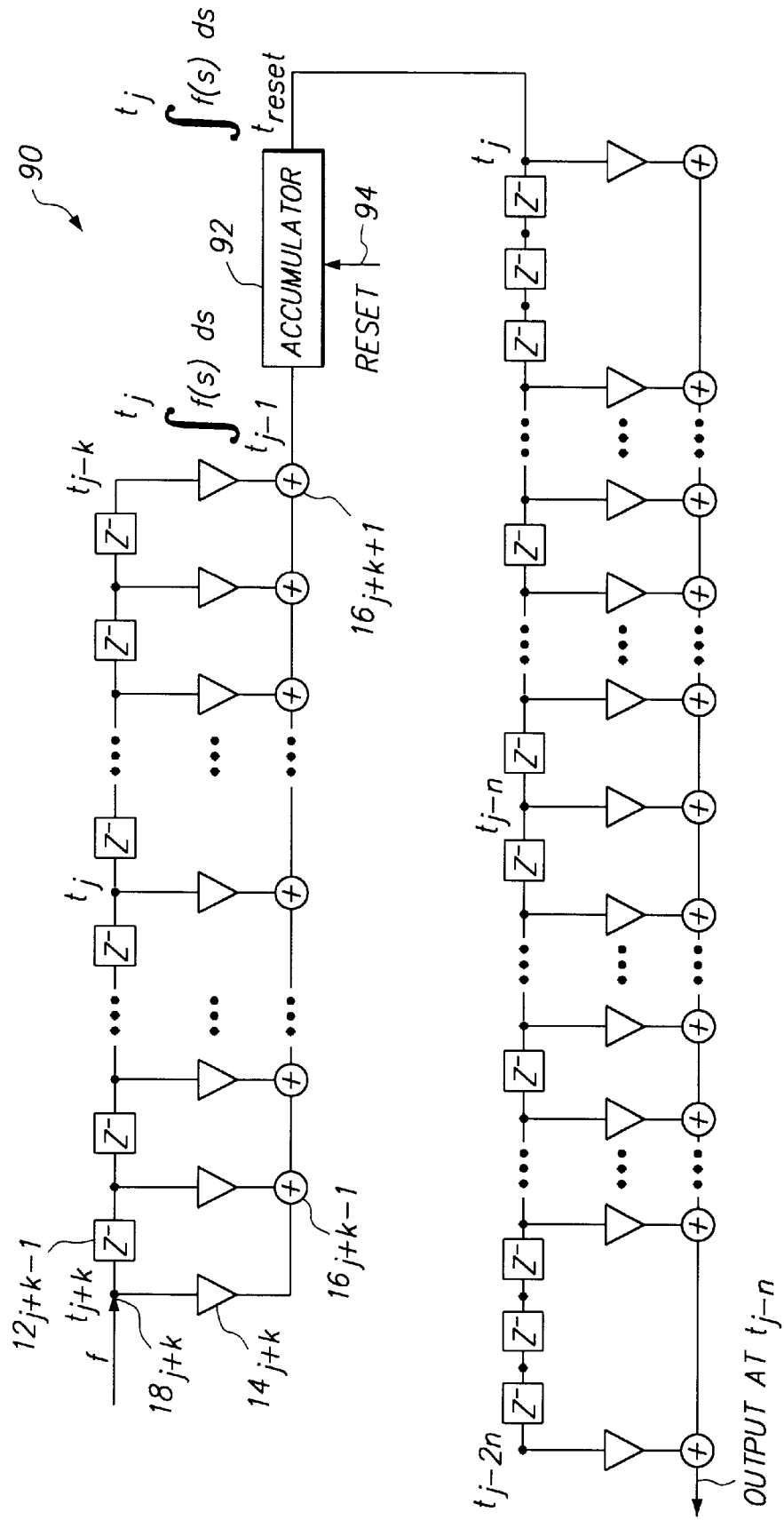
FIG. 19 is a diagram of an embodiment of a $\Sigma$-$\Delta$ filter which has the characteristic illustrated in FIG. 18.

This procedure may be implemented by a filter of the structure shown in FIG. 19. Filter F1 is an integration transversal filter which produces $$\int_{t_{i-1}}^{t_j} f(s)ds.$$

The accumulator provides $$\int_{t-\infty}^{t_j} f(s)ds$$

calculated on the oversampled scale. Filter F2 differentiates this integral on the Nyquist rate (cut-off frequency) scale.

Figure 20:
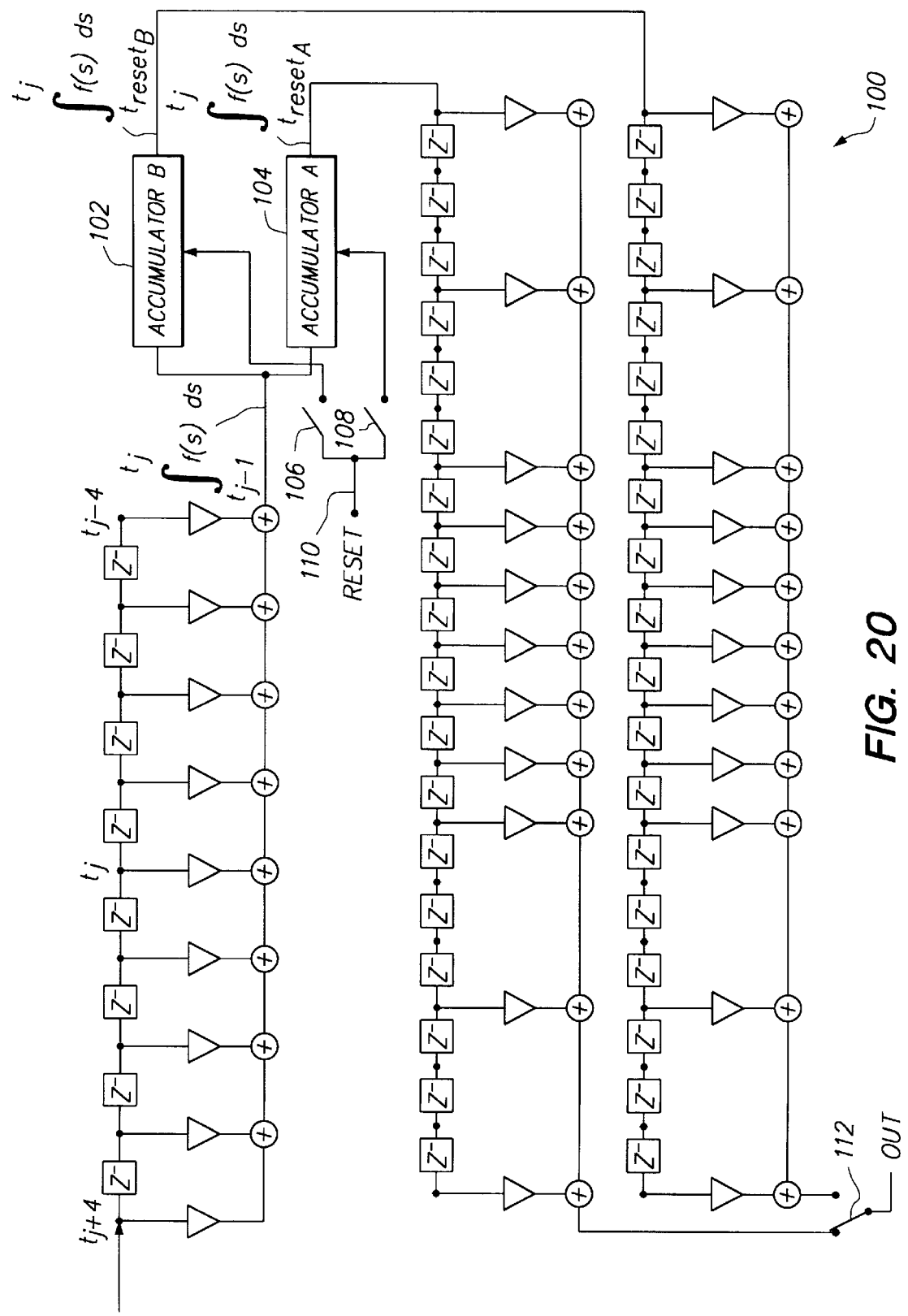
FIG. 20 is a diagram of an embodiment of a $\Sigma$-$\Delta$ filter of FIG. 19 having two accumulators.

In order to avoid overflow of the accumulator the fact that differentiation uses only finitely many values may be used, and the fact that the value of the derivative does not change if the same number is subtracted from all of the samples, i.e. $(f(t)+\text{constant})'=f'(t)$. Thus, the accumulator A can be replaced by two accumulators as shown in FIG. 20.

While integrator A is in use, the accumulator of the integrator B is reset. Integrator A is used until the values from integrator B reach the end of the delay chain b. At this instant, the switch S connects to the output of the transversal filter B, which has different values from the values on the filter A, but the same differences between these values. This implies that the value of the derivative calculated by A and by B are the same. However, now integrator A can be reset and the cycle repeats. In this manner, the integrators do not overflow, because they are reset frequently.

Such Σ-Δ procedures have no phase shifts (but possibly only delays. If the predictive complex [to be introduced later] is used, no delay occurs at the expense of larger ripple). Note the importance of the fact that in such Σ-Δ procedures, integration and differentiation are on two different scales. They can be implemented using charge coupled device (CCD) technology.

E. Solving Linear Differential Equation Using Lagrangian Polynomial Approximations In order to solve linear differential operators it is enough to solve such equations of the first order, since any other equation can be reduced to a system of linear differential equations. The method described below entirely depends on the fact that increasing the number of the Nyquist rate interpolation points improves the accuracy of the approximation. Thus, to solve linear differential equations, a low degree polynomial is not needed for a predictor—corrector method. Instead, if in the equation $$f'(t)+af(t)=g(t)$$

if both f(t) and g(t) are given at the Nyquist rate samples, one can approximate g(t) by a polynomial of relatively large degree, for example 17 or above. Then the above equation implies $$f(t)=g(t)a^{-1}-f'(t)a^{-1},$$

and by differentiating both sides results in a sequence of the form $$f^{(2)}(t)=g'(t)a^{-1}-g(t)a^{-2}+f(t)a^{-2},$$

$$f^{(3)}(t)=g^{(2)}(t)a^{-1}-g'(t)a^{-2}+g(t)a^{-3}-f(t)a^{-3},$$

therefore $$f^{(m)}(t)=g^{(m-1)}(t)a^{-1}g^{(m-2)}(t)a^{-2}+\ldots+(-1)^i g^{(m-i)}(t)a^{-i}\ldots$$
$$-(-1)^m g(t)a^{-m}+(-1)^m f(t)a^{-m}.$$

Thus, Taylor's formula implies that $$f(t+1) \approx f(t) + f'(t) + f''(t)/2! + \ldots + f^{(m)}(t)/m!$$
$$= f(t)\left(1 - a^{-1} + (2!a^2)^{-1} + (3!a^3)^{-1} + \ldots + (-1)^m(m!a^m)^{-1}\right) + g(t)\left(a^{-1} - (1!a^2)^{-1} + (2!a^3)^{-1} + \ldots + (-1)^m(m!a^m)^{-1}\right) +$$
$$g'(t)\left((2!a)^{-1} - (3!a^2)^{-1} + \ldots + (-1)^m(m!a^m)^{-1}\right) +$$
$$g^{(2)}(t)\left((3!a)^{-1} - (4!a^2)^{-1} + (5!a^3)^{-1} + \ldots +$$
$$(-1)^m(m!a^m)^{-1}\right) + \ldots + g^{(m-1)}(t)(m!a^m)^{-1}).$$

Let P(t,g) be an interpolation polynomial for g, and assume that f(i) has already been obtained. In the unit interval (i, i+1) this polynomial approximates g with a high accuracy. Thus, in order to obtain the solution in the same interval, Taylor's formula can be used with the derivatives of g(t) replaced by the derivatives of the approximating polynomial P(t,g):

$$f(t+1) \approx f(t) + f'(t)f''(t)/2! + \ldots + f^{(m)}(t)/m!$$
$$= f(t)\left(1 - a^{-1} + (2!a^2)^{-1} + (3!a^3)^{-1} + \ldots + \right.$$
$$\left. (-1)^m(m!a^m)^{-1}\right) + P(t,g)\left(a^{-1}(1!a^2)^{-1} + \right.$$
$$(2!a^3)^{-1} + \ldots + (-1)^m(m!a^m)^{-1}\right) +$$
$$P'(t,g)\left((2!a)^{-1} - (3!a^2)^{-1} + \ldots + (-1)^m(m!a^m)^{-1}\right) +$$
$$P''(t,g)\left((3!a)^{-1} - (4!a^2)^{-1} + (5!a^3) + \ldots + \right.$$
$$\left. (-1)^m(m!a^m)^{-1}\right) + \ldots + P^{(m-1)}(t,g)(m!a^m)^{-1}.$$

In order to evaluate the above expression the polynomial P(t,g) is represented as a sum of basic polynomials multiplied by the sampled values of the signal:

$$P(t,g) = \sum_{j=0}^{i-1} P_i(t)f(i)$$

and differentiation is performed on each of these polynomials separately. The coefficients are then multiplied by the factors containing the parameter a, and thus producing values of constants (depending on a) which are then used to form the appropriate linear combination of the sampled values. The reason for performing the procedure in this order is to reduce the round-off error, because the coefficients of higher order derivatives grow in size with the order of differentiation.

Decreasing accuracy of approximations of higher order derivatives of g(t) by the derivatives of P(t,g) is offset by the fact that higher order derivatives are divided by factorials of large numbers. This reflects the fact that an approximation of the solution f(t) is sought within a small, unit length interval, and correctness of the method relies again on the fact that the solution f(x) can be approximated by a Lagrangian polynomial and that Taylor's formula for polynomials is exact. In fact, on such small intervals, the truncated Taylor's form of a Nyquist rate spaced interpolation polynomial accurately represents the higher degree polynomial. Thus, the number m above can be smaller than the degree of the polynomial P(t,g). Also, the error of polynomial approximations which is in the high part of the spectrum is attenuated when an integration procedure is applied.

A significant improvement of the above method consists in expressing Taylor's formula using the chromatic derivatives. Not only are the coefficients thus obtained much smaller than the corresponding coefficients for the "standard" derivatives, but then the increased degree of approximation by Taylor's polynomial provides a better match of the spectral features of the solution and less out of band noise.

If the signal is oversampled, the procedure described in the processing part of the engine is capable of performing both differentiation and integration with exceedingly high accuracy surpassing the harmonic methods by orders of magnitude.

V. Basic Signal Processing Local Universes

Signal processing in accordance with the invention is performed in small overlapping "local micro-universes," also referred to herein as "local universes," each local universe associated with a Nyquist rate sampling point and containing a relatively small number of samples of the signal. The set of the corresponding sampling points for these available samples in a local universe is called the "support" of this local universe. Such local universes have their "local" versions of the signal, and signal processing operators act using only data available in the corresponding local universes. However, by external conditions relating several such local universes, the "local" versions of the signal and the actions of the signal processing operators are made consistent with each other. In this way, on the global scale, statistical laws of error distribution insure low error in the global features of the signal in the frequency domain.

A Finite Local $\epsilon$-base Theorem, which I posed and proved, is presented next. This theorem provides the justification why such processing is possible. While functions (sin $\pi(x-i))/(\pi(x-i))$ form an orthonormal system, and are thus linearly independent, the Finite Local $\epsilon$-base Theorem shows that over a short interval (−1, 1), and for any given small number $\epsilon$, finitely many of such functions are sufficient to represent the signal over the interval (−1, 1) with pointwise error smaller than ($\epsilon \times A_{max}$), where $A_{max}$ is the maximal amplitude of the signal.

A. Finite Local $\epsilon$-base Theorem

For every $\epsilon>0$, there exists n and numbers $a_1, \ldots a_n<1$ such that $$\left| \sum_{j=-\infty}^{\infty} \frac{\sin\pi(t-j)}{\pi(t-j)} f(j) - \sum_{i=-n}^{n} \frac{\sin\pi(t-j)}{\pi(t-j)} a_i \right| < \varepsilon$$

for all t such that $-1 \leq t \leq 1$.

The above theorem implies that given sufficiently large n, one can alter the values of Nyquist rate points $f(-n)', \ldots, f(0), \ldots, f(n)$ into $a_{-n}, \ldots, a_0, \ldots, a_n$ such that in the interval (−1,1) the signal f*(t), defined such that f*(m)=0 for |m|>n and f*(i)=$a_i$ for i<|n|, is an $\epsilon$ fit, i.e. a close fit, of f on the interval (−1,1).

It is possible to show that the energy of the difference $$\sum_{i=-n}^{n} (a_i - f(i))^2$$

needed to accomplish the above local fit depends on the total energy of the signal and its distribution on the samples in the interval (−n, n) versus the samples outside this interval.

The main application of the above theorem is for obtaining a least square fit for the oversampled data contained in a small interval I, using a Lagrangian interpolation polynomial with the interpolation values which are variations of the Nyquist rate sampled values of the signal. In such applications, instead of trying to accomplish the best possible fit, a quadratic optimization is used to find a "compromise" between minimization of each of the following two magnitudes:

(1) the "energy" of the difference between the signal and its altered values on the interpolation points of the polynomial approximation, both windowed by the windowing function corresponding to the polynomial approximation $$Y_1 = \sum_{j=-n}^{n} (a_j - f(i))^2 W(j)^2,$$

-continued $$\text{for } W(j) = \left(\frac{(n!)^2}{(n-j)!(n+j)!}\right);$$

(2) the deviation of the interpolated values from the real oversampled values of the signal in the interval I:

$$Y_2 = \sum_{\tau \in I}\left(\sum_{i=-n}^{n} L_i(\tau)a_i - f(\tau)\right)^2$$

$$\approx \sum_{\tau \in I}\left(\sum_{j=-n}^{n} \frac{\sin\pi(\tau-j)}{\pi(\tau-j)} W(j)a_j - f(\tau)\right)^2.$$

Thus, a weighted sum of the form $Y_1+vY_2$ is minimized with a large weight v heavily emphasizing the second term. This allows that a very significant part of the energy of the signal outside the interpolation interval be taken into account.

Minimization of the above quadratic expression, $Y_1+vY_2$, is done in the usual way. Partial derivatives of $Y_1+vY_2$ with respect to each of $a_{-n}, \ldots, a_0, \ldots, a_n$ are found and set equal to 0. This results in a system of linear equations in variables $a_{-n}, \ldots, a_0, \ldots, a_n$. The solution of this system is a linear combination of Nyquist rate samples $f(i)$, $-n \leq i \leq n$, and oversampled values $f(\tau_j)$ of the form $$a_k = \sum_{i=-n}^{n} c_i f(i) + \sum_{\tau \in I} d_\tau f(\tau),$$

where i ranges over the Nyquist rate sampling points from $-n$ to n, and $\tau$ ranges over the oversampling rate points, including the Nyquist rate points, within I. Thus each $a_k$ for $-n \leq k \leq n$ is the output of a transversal filter implementing the above linear combination.

B. k-Monad

A k-monad M (also referred to herein as a "monad", k referring to the number of Nyquist rate sampling points in the support of the monad) consists of i. An interval of time $D_M$, beginning and ending with Nyquist rate sampling points, the interval containing either 2n or 2n+1 Nyquist rate sampling points, which interval of time is called the domain of the monad M;

ii. An interval of time $S_M$, beginning and ending with Nyquist rate sampling points, the interval containing either 2k or 2k+1 Nyquist rate sampling points for some k<n, which interval of time is called the support of the monad M;

iii. A collection of real numbers, $a_i$, each associated with the sampling point i belonging to $S_M$. These numbers can be, but are not necessarily the sampled values of a signal. They can also be obtained through a computational procedure, e.g. a least square fit. For all sampling points in $D_M$ which are not in $S_M$, it is assumed that the "local" value of the signal at these sampling points is equal to zero (the corresponding a, are considered all equal to 0 and thus they are not introduced at all.)

iv. An interval of time $C_M$ of length one to two Nyquist rate unit intervals, either centered about the central point of the domain $D_M$ (if $D_M$ has an odd number of points) or centered between the two central points if $D_M$ has an even number of points); and V. An interpolation polynomial $\overline{P}(t, a)$, of the form $$\overline{P}(t, a) = \sum_{i \in S_M} P_i(t)a_i$$

(bold a signifying a vector quantity).

Thus, the basic polynomial approximation can be seen as a monad with $a_i=f(i)$, with the interpolation polynomial evaluated at interpolation points belonging to $C_M$. The values of $a_i$ are called the output of the monad.

Monads can be used to capture local signal behavior if the signal is not too noisy and the oversampled rate is sufficiently high. However, a monad will typically be used to build more complex structures. Thus, monads may be viewed as elementary local universes of the signal processing method and engine of the invention.

Polynomial approximations naturally induce a windowing of the signal. Thus, a monad can be seen as containing an internal version of the signal f(t) with windowed samples $$\frac{(n!)^2}{(n-i)!(n+i)!}f(i).$$

This follows from the Polynomial Approximation Theorem, with only the part of the signal in the central interval C being explicitly described by the corresponding polynomial approximation. The domain of the monad is "the local version of the entire time", while the support of a monad is the interval in time where the entire energy of the signal comes from, since the energy is equal to the sum of the squares of the Nyquist rate sampled values, and the support contains all samples which are not equal to 0. Notice that the signal itself is not equal to 0 at all points between the samples, but decays rapidly due to exponential windowing. In the central interval C the "internal" version of a signal $g(i)=a_i$ is given by the values of the polynomial approximation $$\overline{P}(t, a) = \sum_{i \in S_M} P_i(t)a_i.$$

This has the effect of windowing the signal g(i) by an exponential window $$w(i) = \frac{(n!)^2}{(n-i)!(n+i)!}$$

which implies that $$\overline{P}(t, a) \approx \sum_{i=-\infty}^{\infty} \frac{\sin\pi(t-i)}{\pi(t-i)} \frac{e^{-i^2/n}a_i}{\sqrt{n^2-i^2}}$$

because it is assumed that for all i which are outside the support $S_M$, $a_i=0$.

Figure 21:
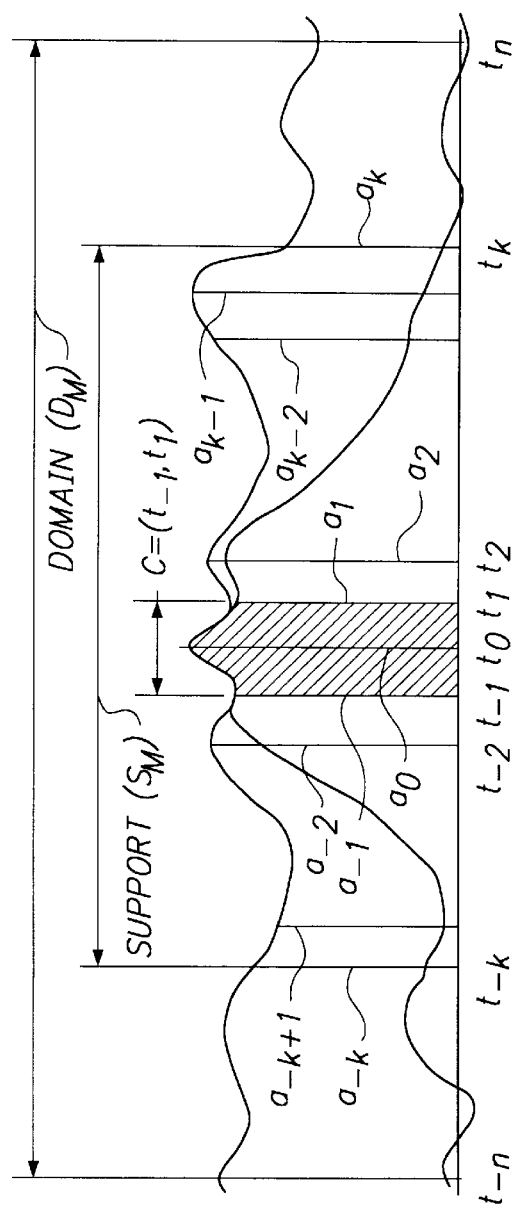
FIG. 21 is a graph which illustrates the characteristics of a monad.

FIG. 21 is a graph which illustrates the characteristics of a monad.

C. p-Simplex

A p-simplex (also referred to herein as a "simplex", p referring to the number of Nyquist rate sampling intervals in the central interval) is a collection of monads parameterized by the same set of parameters $a_i$, and with a piece-wise polynomial approximation defined as a weighted combination of approximation polynomials of individual monads, with polynomial weights. Thus, a simplex consists of:

i. A sequence of monads, $M_1, \ldots, M_k$ with domains $D_1, \ldots, D_k$, supports $S_1, \ldots, S_k$, and central regions $C_1, \ldots, C_k$. The domain, support or central region of a monad can partly overlap or be a subset of the domain, support or central region of another monad;

ii. An interval of time $D_S$ beginning and ending with Nyquist rate sampling points, such that $D_S = D_1 \cup \ldots \cup D_k$;

iii. An interval of time $S_S$ beginning and ending with Nyquist rate sampling points, such that $S_S = S_1 \cup \ldots \cup S_k$;

iv. A sequence a of real numbers, $a = \{a_i, i \in S_S\}$, each $a_i$ associated with a Nyquist rate sampling point $i \in S_S$; Thus, each monad $M_j$ uses the same value $a_i$ for $i \in M_j$;

v. iv. A central interval $C_S$ containing p Nyquist rate sampling intervals, with p usually equal to 2 or 3. The centers of $C_S$ and $D_S$ need not coincide, but the center of $D_S$ must belong to the center of $C_S$, and $C_S = C_1 \cup \ldots \cup C_k$; and vi. A piece-wise polynomial approximation $Q(t,a)$, for $a = \{a_i, i \in S_S\}$, defined as follows:

Let $P_1(t, a_1), \ldots, P_k(t, a_k)$ be polynomial approximations associated with monads $M_1, \ldots, M_k$, where $a_j = \{a_i, i \in S_j\}$. Let $(t_s, t_{s+1})$ be a Nyquist rate unit subinterval of $C_S$. Then there are polynomials $R^S_1(t), \ldots, R^S_k(t)$ such that $$R^S_1(t) + \ldots + R^S_k(t) = 1 \quad \text{(condition 1)},$$

and such that $$Q(t,a) = Q_S(t,a) = R^S_1(t) P(t,a) + \ldots + R^S_k(t) P_k(t,a) \quad \text{(condition 2)},$$

where some $R^S_i$ can be 0 polynomials and are in fact 0 polynomials whenever $(t_s, t_{s+1})$ is not a sub-interval of the central interval $C_i$ of the corresponding monad $M_i$. At the end points of such intervals, i.e. at the Nyquist rate sampling points in $C_S$.

$$Q(t_S, a) = (Q_S(t,a) + Q_{S-1}(t,a))/2 .$$

Clearly, this, together with conditions 1 and 2 implies $$Q(t_S, a) = a_S.$$

Figure 22:
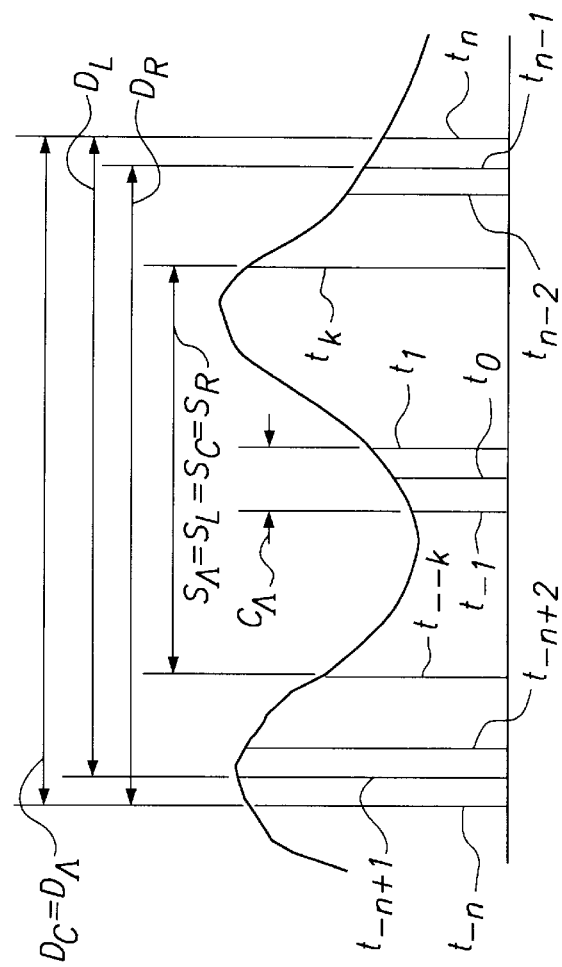
FIG. 22 is a graph which illustrates a link.

A primary example of a simplex is called a "link", denoted by $\Lambda$. FIG. 22 is a graph which illustrates a link. A link consists of three monads $M_L$, $M_R$ and $M_C$, which are the left, right and central monads, respectively. The domain $D_\Lambda$ of $\Lambda$ contains $2n+1$ Nyquist rate sampling points $t_{-n}, \ldots, t_0, \ldots, t_n$. The domain $D_C$ of the central monad is the entire domain $D_\Lambda$ of the link $\Lambda$. The domain of the left monad contains an even number of points $\{t_{-n}, \ldots, t_{n-1}\}$ while the domain of the right monad contains points $\{t_{-n+1}, \ldots, t_n\}$. Thus, the domain of $M_L$ is missing only the right-most point $t_{-n}$ of $D_\Lambda$, and the domain of $M_R$ is missing only the leftmost point $t_{-n}$. The support $S_\Lambda$ of $\Lambda$ contains $2k+1$ Nyquist rate sampling points $t_{-k}, \ldots t_0, \ldots, t_k$, and all three monads have the same support. The central region of $\Lambda$, $C_\Lambda$, is the interval $(t_{-1}, t_1)$ and has the following piece-wise polynomial approximation associated with it:

For $t \in (t_0, t_1)$ $$Q(t,a) = Q_1(t,a) = (1-t) P_C(t,a) + t P^*_R(t,a).$$

Thus, $R^1_1(t) = 1 - t$ and $R^1_2(t) = t$, $P_C(t,a)$ is the Lagrangian polynomial associated with the central monad (odd number of interpolation points) and $P^*_R(t,a)$ is obtained from the Lagrangian polynomial associated with the right monad $P_R(t,a)$ (even number of interpolation points), with the window adjusted to coincide with the window of the central monad.

Similarly, for $t \in (t_{-1}, t_0)$ $$Q(t,a) = Q_{-1}(t,a) = (1+t) P_C(t,a) - t P^*_L(t,a)$$

For the case of Lagrangian interpolation polynomials this results in $$Q_1(t, a) = \left[ (1+t) \prod_{\substack{i=-n \\ i \neq j}}^{n} \frac{t-j}{j-i} - t \prod_{\substack{i=n+1 \\ i \neq j}}^{n} \frac{t-j}{j-i} \frac{n}{n-j} \right] a_j$$

for $t \in (t_{-1}, t_0)$, $$Q_1(t, a) = \left[ (1-t) \prod_{\substack{i=-n \\ i \neq j}}^{n} \frac{t-j}{j-i} + t \prod_{\substack{i=-n \\ i \neq j}}^{n-1} \frac{t-j}{j-i} \frac{n}{i+j} \right] a_j$$

for $t \in (t_{-0}, t_1)$.

Another convenient definition for $Q(t,a)$ which produces slightly more out of band interpolation noise is given by a single polynomial $$Q(t,a) = (1-t)/2 P^*_L(t,a) + (1+t)/2 P^*_R(t,a).$$

Note that this does not reduce the simplex into a monad because the domains of $M_L$ and $M_R$ are different, i.e. $P_L(t,a)$ and $P_R(t,a)$ are equal to 0 over two different sets of sampling points. Both definitions are extremely accurate. The following illustrates the accuracy of the first piece-wise polynomial approximation given above for the signal $f(t) = (\sin \pi t)/(\pi t)$. $M_j$ denotes the maximal value of the $j^{th}$ derivative of the signal, i.e. max $\{f^{(j)}(t)\}$.

$$|Q(t,a) - f(t)| \leq 4 \times 10^{-5} \times M_0,$$

$$|Q'(t,a) - f'(t)| \leq 1 \times 10^{-4} \times M_1,$$

$$|Q^{(2)}(t,a) - f^{(2)}(t)| \leq 5 \times 10^{-4} \times M_2,$$

$$|Q^{(3)}(t,a) - f^{(3)}(t)| \leq 1.5 \times 10^{-3} M_3,$$

$$|Q^{(4)}(t,a) - f^{(4)}(t)| \leq 2.5 \times 10^{-3} \times M_4,$$

$$|Q^{(5)}(t,a) - f^{(5)}(t)| \leq 8 \times 10^{-3} \times M_5,$$

and $$|Q^{(6)}(t,a) - f^{(6)}(t)| \leq 1.3 \times 10^{-2} \times M_6.$$

Approximations of $(\sin \pi(t-j))/(\pi(t-j))$, $j > 0$, due to windowing, have even smaller errors.

A simplex can be used to capture local signal behavior in a more precise way than using a monad. However, as monads may be considered elementary particles, a simplex may be viewed as an "atom" in the main sequence of signal processing micro-universes, i.e. in an m-complex, defined below.

D. m-Complex, Sequences of Local Universes

An m-complex, X, (also referred to herein as a "complex", m referring to the number of links) is a sequence of m links $\Lambda_i$ with domains $D_i$, supports $S_i$ and central regions $C_i$ such that:

1. For any two adjacent links the right monad of $\Lambda_i$ and the left monad of $\Lambda_{i+1}$ share the same domain;

2. The supports $S_i$ and $S_{i+1}$ of each two consecutive links share all points except the leftmost point of $S_i$ and the rightmost point of $S_{i+1}$; and 3. The central regions $C_i$ and $C_{i+1}$ overlap on one unit interval.
4. Each link $\Lambda_i$ has its own parameterization $\{a^i_j | j \in D_i\}$.

The condition 4 explains why a complex is not a local universe but a sequence of local universes. Each link has its own internal version of the signal, and these versions can be different. However, a complex will have conditions constraining to what degree these versions can be different.

The focal point $F_X$ of a complex X consisting of m links is the central point of any link $\Lambda_i$. The choice of the focal point depends on the particular application of the complex. The most important complexes are the complexes with an odd number of links and with the focal point $F_X$ coinciding with the central point of the domain of the central link, as well as a complex with the focal point coinciding with the central point of the leftmost link or of the rightmost link.

Figure 24:
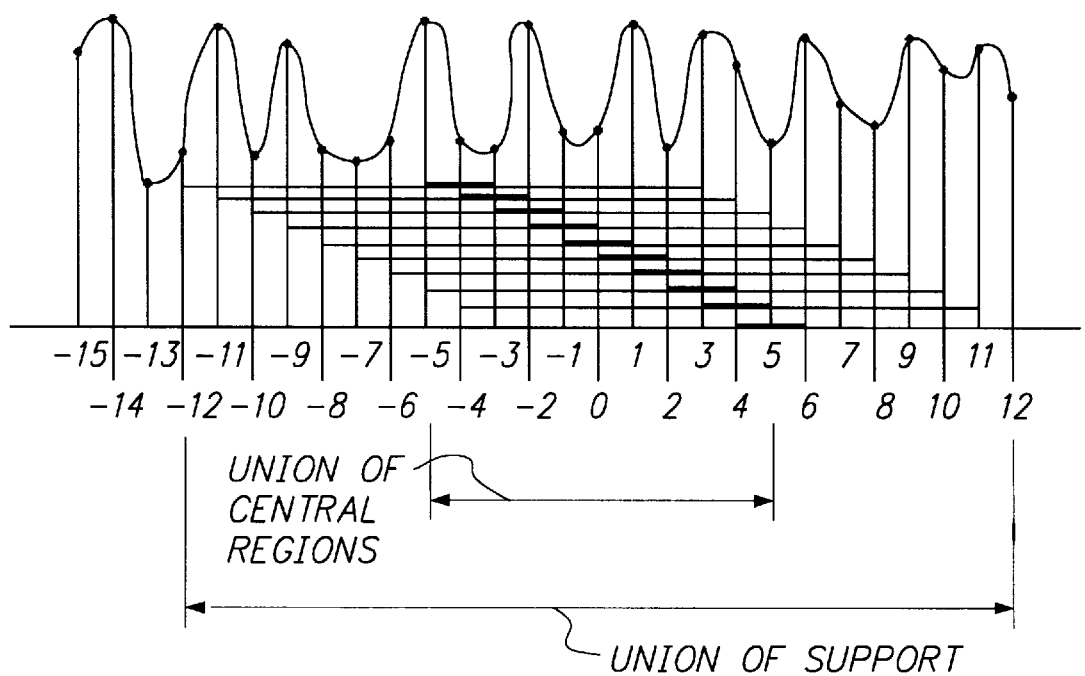
FIG. 24 is a graph which illustrates an intermediate complex.

The graph of FIG. 24, below, illustrates a complex with 9 links and with the focal point $F_C$ coinciding with the central point of the support of the central link.

An independent signal processing is performed within each link, with data available within each respective link support and accordingly windowed. However, an external condition is imposed which insures that adjacent links are in agreement as to what are the signals within the shared part of their corresponding supports. Also, wherever the sampled values are available, the internal versions of these values for each link are ensured to be sufficiently close to the actual sampled values. The deviation of all such parameters is weighted and the sum of such weighted deviation is minimized. This procedure is described in detail below in Section VIII pertaining to the derivation of local signal behavior processing parameters.

The output of a complex can be either
1. the sequence of values $\{D^{(0)}(f(F_X)), \ldots, D^{(m)}f(F_X))\}$ where the number of chromatic derivatives evaluated depends on application, but is typically between 4–8, or
2. The sequence $\{a^c_j, | j \in D_c\}$ where $\Lambda_C$ is the central link containing the focal point.

The choice of which data is to be output depends on the nature of the subsequent processing of the output data.

The m-complex is the core of the basic engine for LSB signal processing in accordance with the invention. The complex allows simple and uniform designs of many algorithms. This will be clear from the applications of complexes for the purpose of derivation of local signal behavior processing parameters.

VI. Local Signal Behavior Parameters

The local signal behavior parameters for the class of $\pi$-band limited signals is a set of linear operators $\{\delta_0(f), \ldots, \delta_k(f)\}$ which has the following properties for every set of Nyquist rate sampling points $t_i$, i an integer.

1. For every $\epsilon, \underline{\epsilon}$ there exists a sequence $\epsilon_0, \ldots, \epsilon_n$ such that for arbitrary two $\pi$-band limited signals f and g the following holds. If for every sampling point $t_i$ and for all $j \leq k$ $|(\delta_j(f)(t_i) - (\delta_j(g)(t_i)| < \epsilon_j$, then:
   a. $|f(t)-g(t)| < \epsilon$, for all t; and
   b. Fourier transforms $H_f$ and $H_g$ of f and g respectively, satisfy $|H_f(\omega) - H_g(\omega)| < \underline{\epsilon}$ for all $-\pi < \omega < \pi$.

2. The values $(\delta_0(f)(t_i), \ldots, (\delta_n(f)(t_i)$ can all be obtained from the samples of f(t) taken at sampling points belonging to the interval $(t_{i-1}, t_{i+1})$ at an oversampling rate which depends on
   a. The presence of noise in these samples (including the quantization noise);
   b. The level of accuracy required, i.e. on the magnitudes of $\epsilon$ and $\underline{\epsilon}$;

and c. The delay allowed.

In practice an interval containing oversampled values of the signal will be used, lasting 2–20 Nyquist rate unit intervals.

A primary example of local signal behavior parameters are the chromatic derivatives. They are clearly linear operators. Since chromatic derivatives up to the order k allow an approximation of the standard derivatives up to the same order, Taylor's formula ensures the property i-a., above. It can be shown that the fact that Chebychev polynomials approximate any continuous function with minimal pointwise error (and most often with a minimal number of terms) ensures property i.b. above.

VII. Interpolation Polynomials in General

The invention contemplates that polynomial approximations, or piecewise polynomial approximations, other than Lagrangian polynomial approximations may be used. In accordance with the signal processing method and engine of the invention, several types of polynomial approximations may be used to represent the behavior of a signal on the local level. For longer intervals, polynomial approximations become very unsuitable since the degree of the polynomial needed to approximate the signal accurately grows very rapidly (see the error estimate for Taylor's polynomials). On the local level, polynomial approximations are most suitable for the following reasons:

1. Polynomial approximations are computationally the simplest possible approximations; and
2. Polynomial approximations are stable to differentiate, by evaluating the actual formal derivatives. The degree of smoothness is limited only by their degree.

However, not all polynomial approximations are equally suitable for representing the local signal behavior. The criteria which should be satisfied by polynomial approximation suitable for use in accordance with the invention are:

1. Both the approximation polynomials and their derivatives of sufficiently high order must have a form with small coefficients in order to be sufficiently stable with respect to the round off error.
2. The polynomials must be represented in a form directly parameterized by the sampled values, i.e. as a sum $$P(t, f) = \sum_{i=-k_1}^{k_2} P_i(t) f(i)$$

where $P_i(t)$ are some polynomial factors, and f(i) are the sampled values of the signal.

3. The polynomials must be "frequency selective," i.e. for $\tau$ in the interval (t-1, t+1) $P(\tau,f) \approx g(\tau)$ where g is a band limited signal. Lagrangian interpolation polynomials have this property due to their natural notion of scale, which is the distance between their equally spaced interpolation points. In fact, this distance defines the Nyquist frequency for their band-limit.
4. The band limited signal g(t) above, such that $P(\tau,f) \approx g(\tau)$, must be a suitable windowed version of $f(\tau)$. For the Lagrangian polynomial with 2n+1 interpolation points, this is the windowed signal f(t) with the following window:

$$L^{2n+1}(t, f) \approx \sum_{i=-k}^{k} \frac{\sin \pi(t-i)}{\pi(t-i)} \frac{(n!)^2}{(n-i)!(n+i)!} f(i)$$

$$\approx \sum_{i=-k}^{k} \frac{\sin \pi(t-i)}{\pi(t-i)} \frac{n}{\sqrt{n^2 - i^2}} e^{-i^2/n} f(i).$$

This property ensures an adequate preservation of the spectral features of the signal.

Thus the linear operators defined using Lagrangian polynomials will also have rational coefficients in their corresponding matrices. Using software for symbolic manipulations, such operators may be composed without any round-off error accumulation. The rounding off and multiplication with the sampled values can be done in the final stage of computation only.

This is important because relatively unstable operators can be composed as long as the entire composition is a stable operator. Examples are predictions which are an intermediate stage for evaluating the values of differential operators at the very end of the data stream. Predictions of the Nyquist rate future values of the signal rapidly deteriorates in accuracy, but mostly by a low-frequency off-set. However, the fact that the coefficients of the Lagrangian derivatives rapidly decrease toward the end-points of the interpolation interval very significantly reduces the impact of the fact that the predicted values become increasingly inaccurate.

The "globalizing" operators which combine past Nyquist rate data and past oversampled data in order to obtain Nyquist rate predicted data are intrinsically unstable, i.e. they produce decreasingly accurate data toward the end of the prediction interval, due to the windowing features of polynomial approximations. However, when such "globalizing" operators are composed with highly "localizing" operators like differentiation, the resulting composition is a stable "local+global→local" operator.

In general, the result of applying a composition of a sequence of operators to the signal should always be obtained by operating on the coefficients obtained from the corresponding polynomial approximations which are used to define these operators, and only then the resulting coefficients will be multiplied with the sampled data. This maintains the size of the coefficients as small as possible, prevents the round-off error accumulation, and minimizes the total number of multiplications required during the actual signal processing.

VIII. Derivation of Local Signal Behavior Processing Parameters

The invention employs oversampling to enable capturing the local behavior of a signal. As defined herein, oversampling means sampling at n times the band limit of the signal, where n is greater than 2 (with n=2 commonly referred to as the Nyquist rate), In accordance with the signal processing method and engine of the invention, the particular embodiment of the invention used, and the parameters captured to describe the local signal behavior may depend on several factors including the degree of out of band noise in the signal, the degree of oversampling to be employed and the maximal allowed delay.

Example: The delay allowed is at least 10 Nyquist rate unit intervals.

Figure 23:
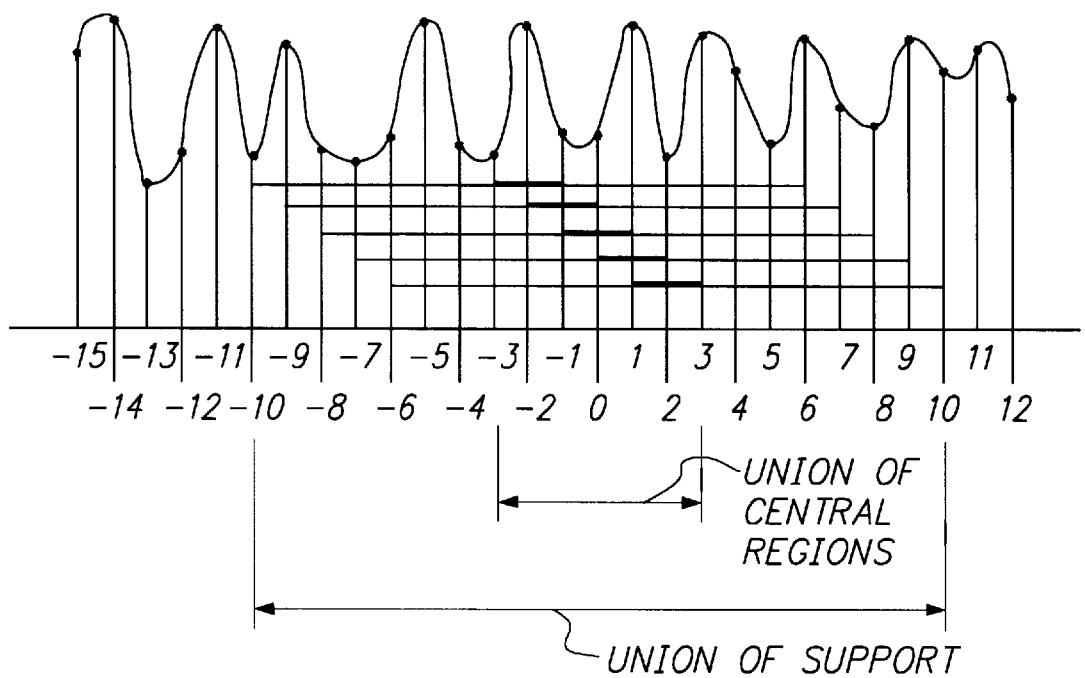
FIG. 23 is a graph which illustrates a complex having 5 links.

A complex is formed having 3 to 7 links depending on the level of noise. FIG. 23 shows a 5-link complex. The local behavior parameters are to be found at point $t_0$, (which, for simplicity, will be assumed to correspond to 0) given that sampled values of the signal are known for the next 10 Nyquist rate sampling intervals. Oversampled data will be used only from the interval (−3,3) which is the union of the central intervals $C_{-2}$, $C_{-1}$, $C_0$, $C_1$, and $C_2$ of the five links $\Lambda_{-2}, \Lambda_{-1}, \Lambda_0, \Lambda_1$, and $\Lambda_2$. Outside the interval (−3,3) only the Nyquist rate samples of the signal are used. A quadratic expression, S, is constructed which will provide the data needed to determine local behavior processing parameters. Consider an arbitrary link $\Lambda_i$ from the complex. The following expressions are formed for each link $\Lambda_i$.

1. The error of interpolation: the sum of the squares of the differences between the interpolated values and the oversampled values of the signal, using the interpolation function of $\Lambda_i$ parametrized by the internal values $v_j^i$ of the signal for the link $\Lambda_i$ with parameters $v_j^i$ for all integers j between −k and k.

$$S_1^i = \sum_{\tau \in C_i} (Q^i(\tau) - f(\tau))^2$$

$$= \sum_{\tau \in [i-1, i)} (Q_{-1}^i(\tau) - f(\tau))^2 + \sum_{\tau \in [i, i+1]} (Q_1^i(\tau) - f(\tau))^2$$

where [i−1,1) is closed on the left and open on the right, and [i,i+1] is closed on both the right and left.

Here the summation $$\sum_{\tau \in C_i} (Q^i(\tau) - f(\tau))^2$$

refers to the sum of all values of term $(Q^i(\tau) - f(\tau))^2$ when $\tau$ takes as values the oversampling points from the interval $C_i$. The $v_j^i$ are variables which are used to formulate the constraint equation for the complex. Recall that $Q_{-1}^i$ is the interpolation polynomial for the left half of the central interval, and $Q_1^i(\tau)$ for its right half.

2. Deviation of the internal values $v_j^i$ from the sampling values f(j) at the Nyquist rate sampling points, both windowed by the window W(j) corresponding to the interpolation function of the links. Thus, the following expression is formed:

$$S_i^2 = \sum_{j=-k}^{k} W(j)^2 (f(i+j) - v_j^i)^2$$

For the Lagrangian link $$\frac{n}{\sqrt{n^2 - j^2}} e^{-j^2/n}$$

$$W(j) = \frac{(n!)^2}{(n-i)!(n+i)!}$$

Thus, $S_i^2$ expresses the total energy of the difference between the "internal" values of the signal, and the sampled values. This sum controls the low frequency drift. Thus, minimizing the sum $$\sum_{i=-k}^{k} (S_i^2 + uS_1^i)$$

would produce a trade off between the accuracy of the match of oversampled data, (and thus the highest end of the spectrum) and the low frequency drift. The possibility to find an arbitrarily close least square fit at the expense of accumulating the low frequency drift is insured by the Finite Local ε-base Theorem.

However, the central interval of a single link is not sufficient to insure an accurate match of oversampled data in the presence of noise with a lower degree of oversampling. This is the reason why a complex is used. The next condition insures that any two consecutive links are highly consistent in terms of the internal values of the signal. Consider $\Lambda_i$ and $\Lambda_{i+1}$. The following sums are formed:

$$S_3^i = \sum_{t \in [i, i+1]} (u_k(Q^i(\tau) - Q^{i+1}(\tau)))^2$$

$$S_4^i = \sum_{k=1}^{m} (u_k(D^{(k)}(Q^i)(i+1/2) - D^{(k)}(Q^{i-1})(i+1/2)))^2$$

$$S_4^i = \sum_{j=-k}^{k-1} (V(j))^2 (v_{j+1}^i - v_j^{i+1})^2$$

Where $V(j)=(n!(n-1)!)/((n-j)!(n+j)!)$ is the windowing function for $L^{2k}(t)$ since the two consecutive links, each having an odd number of points, intersect over an even support. Thus, $S_4^i$ is an appropriate measurement of the deviation of the successive internal versions of the signal in the two consecutive links, appropriately adjusted due to the fact that for each such value the windowing is different in the two links. The fact that appropriately weighted sum of squares of these differences, i.e.

$$\sum_{i=0}^{k} S_4^i$$

can be made small can be deduced from considerations leading to the proof of the Finite Local ε-base Theorem. This condition controls the sizes of predictions when a complex is used close to the end of the data stream.

$S_3^i$ is a measure of differences of the interpolations by the link $\Lambda_i$ and $\Lambda_{i+1}$. A more realistic measure would be the integral over the intersecting interval, but this one is more convenient and sufficiently accurate. This condition controls the low-frequency error of the procedure.

Condition $S_4^i$ is important because it ensures that at any central point between the two consecutive Nyquist rate points, the differences between the chromatic derivatives are small. In this way local the "spectral features" i.e. the values of chromatic derivatives become more global, which ensures the consistencies of the "local spectra." For small intervals there are many aliases having the same chromatic derivatives, but if these values are forced into consistency over longer periods of time, this constrains what signals satisfy these conditions to those signals whose upper parts of the Fourier transform have minimal differences. In this way over longer periods of time the spectra of the replica of the signal and the signal will closely resemble each other.

In some applications requiring the highest accuracy in a particular part of the spectrum, condition $S_3^i$ can be replaced by the more general condition of the form $$S_3^i = \sum_{k=1}^{m} v_k \left( \sum_{j=0}^{k} \lambda_j D^{(j)}(Q^i)(i+1/2) - \lambda_j D^{(j)}(Q^{i-1})(i+1/2) \right)^2$$

where $$\sum_{j=0}^{k} \lambda_j D^{(j)}$$

is chosen so that it has particular frequency selection features. The time is measured "externally" as for the signal f(i).

In practice it is enough take operators involving chromatic derivatives up to the order 3–7 to determine with small error the form of the signal between any two consecutive sampling points.

The weighted sum $$S = \sum_{i,j} m_j^i S_j^i$$

where i ranges over indices of all links of the complex is a consistency measurement. The orders of magnitude of the weights involved should reflect the error intrinsic to the corresponding quantity and the nature of approximation, but there is also a lot of space for adaptive or just tunable algorithms.

Having formed the above quadratic expression, the expression can be minimized in the usual manner. Thus, partial derivatives with respect to the variables involved are taken and the corresponding system of linear equations is solved. This in fact produces a large system which should be generated and solved by a symbolic manipulation program like Mathematica. Only the values of $v_j$ for the focal point of the link have to be found as linear combinations of the Nyquist rate samples and oversampled values of the signal, and they can be the output of the complex. The coefficients of these linear combinations are then used in the transversal filter structure as illustrated in FIG. 13.

The number of oversampled taps on the transversal filter for each $v_j$ corresponds to the number of oversampling points in the union of the central regions (thick central part of the longer line denoting the support of each link) and the Nyquist rate taps correspond to the union of all supports of the links.

Note that the above equations are solved off-line and any parameters (weights) are substituted to obtain expressions with constant coefficients to be used in real time.

If the signal is noisy, one combine an integration procedure can be followed by the above procedure with immediate differentiation of the approximation function at the focal point, thus obtaining a highly noise robust filter.

For some applications the output of the complex can be replaced by a sequence of values of chromatic derivatives at the focal point.

Figure 25:
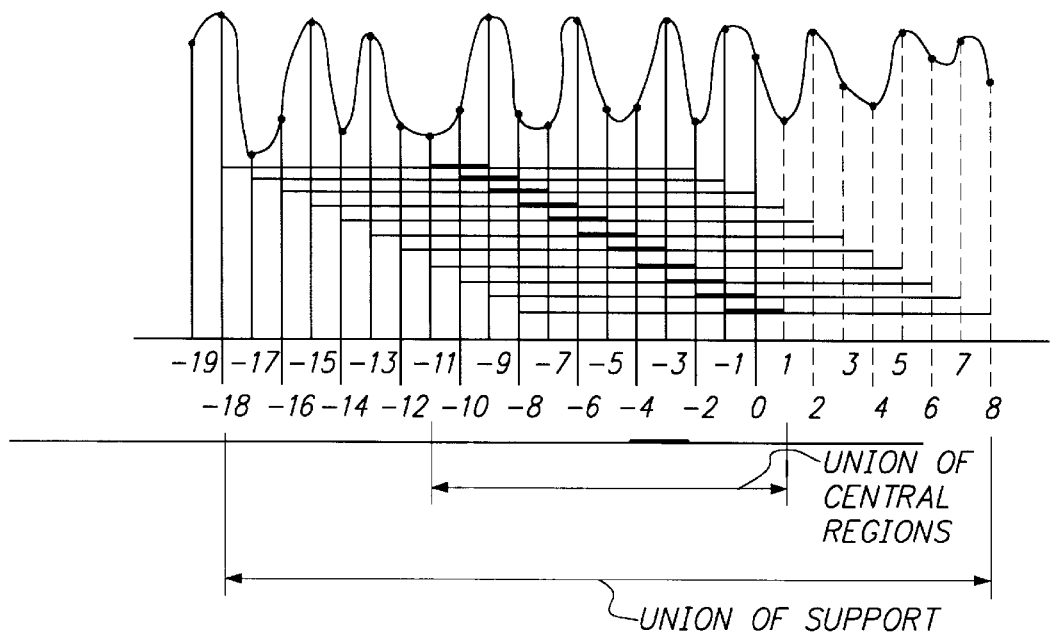
FIG. 25 is a graph which illustrates a fully predictive complex.

The mode described above satisfies the property that for every point in the support of each link there exists a sampled value of the signal, and is called the fully grounded mode. If the delay allowed is not sufficient that for every point $v_j^i$ in the support of each link $\Lambda_i$ there corresponds a sampled value f(i+j), then the complex operates in a predictive mode. The most complex case is if k points (assuming that each link has 2k+1 points in its support) of the last link do not have the corresponding sampled values, i.e. such values are "suspended" and related to the sampled values of the signal only through the constraints described above. This mode will be called the fully predictive mode. Intermediate cases in which less than k points in the support of the link do not have the sampled values of the signal associated with them is analogous to the case of a fully predictive complex, and are treated accordingly. An intermediate complex is illustrated in FIG. 24 and a fully predictive complex is illustrated in FIG. 25.

In the case of a fully predictive complex the second sum is of the form $$S_2^i = \sum_{j=-k}^{0} W(j)^2 (f(i+j) - v_j^i)$$

thus, the sum is truncated up to 0. To prevent instability of the corresponding system of linear equations obtained after differentiation, the number of links must be increased, so that there are several fully grounded links. An optimum must be found between the round-off error accumulation and numerical stability of the system of equations. If necessary, other constraints can be added to limit the energy in the suspended part of the last link:

$$S^* = z \sum_{i=0}^{k} (W(i) v_j^k)^2$$

Finally, in the presence of a high degree of noise, integration, followed by the above, can be combined with differentiation of the output of the last link.

IX. Signal Processing Engine

Figure 26:
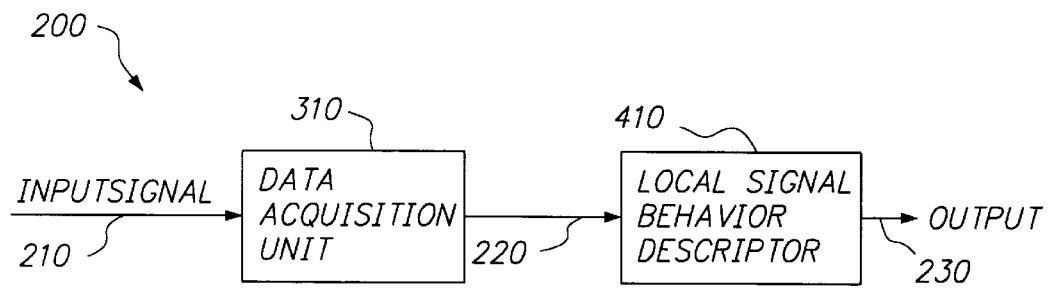
FIG. 26 is a block diagram illustrating the top level components of an embodiment of a signal processing engine according to a first aspect of the invention.

FIG. 26 is a block diagram illustrating the top level components of an embodiment of a signal processing engine 200 according to a first aspect of the invention.

The signal processing engine 200 includes a data acquisition unit 310 and a local signal behavior descriptor 410. The data acquisition unit 310 accepts the input signal 210, sampling the input signal 210 at a rate which is n times the band limit of the signal, where n is greater than 2, and outputs a digital representation 220 of the input signal 210 to the local signal behavior descriptor 410. The local signal behavior descriptor 410 calculates and outputs polynomial approximations 230. Depending on the particular application of the signal processing engine 200, the output of the local signal behavior descriptor 410 may be input to a processor which applies a second set of linear operators to extract information from the polynomial approximation 230 in order to provide a processed signal or to allow decisions to be made, e.g. pulse width modulator switching, or other applications.

The processing may include, for example, finding values of differential operators solving certain differential equations, or interpolation and extrapolation for the case of a fully predictive complex. Such predictions become increasingly inaccurate as the prediction point moves to the right; their main purpose is to define local signal behavior at the end of the data stream, or extrapolations over a short period of time. The length of this period depends on the allowed error. The operations applied are the standard polynomial interpolation/extrapolation as provided by the output of the complex.

Figures 27, 31:
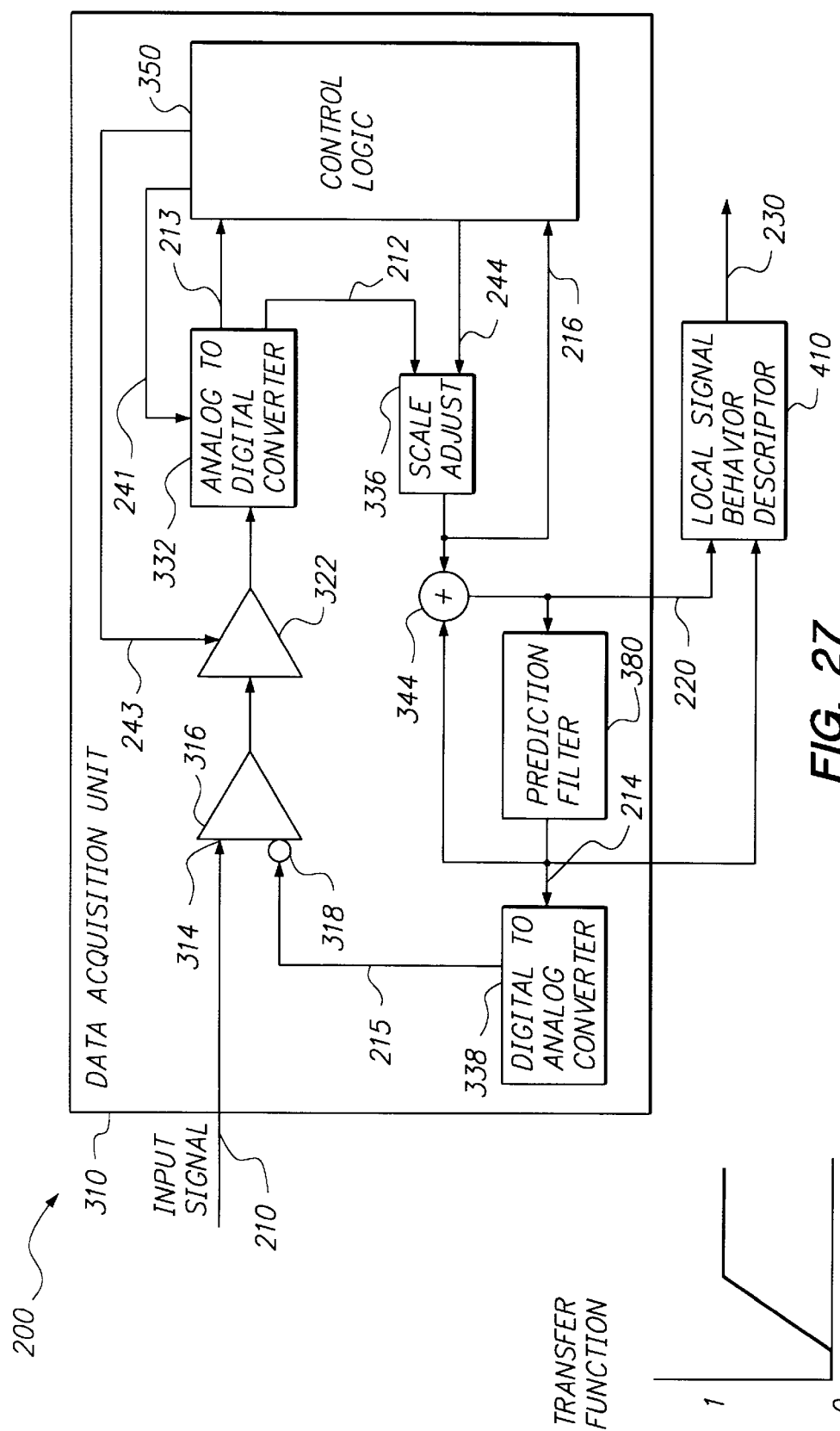
FIG. 27 is a block diagram illustrating the components of an embodiment of a data acquisition unit of a signal processing engine according to a first aspect of the invention.
FIG. 31 is a graph illustrating the transfer function of an embodiment of a soft-start window of a signal processing engine according to a first aspect of the invention.
Figure 30:
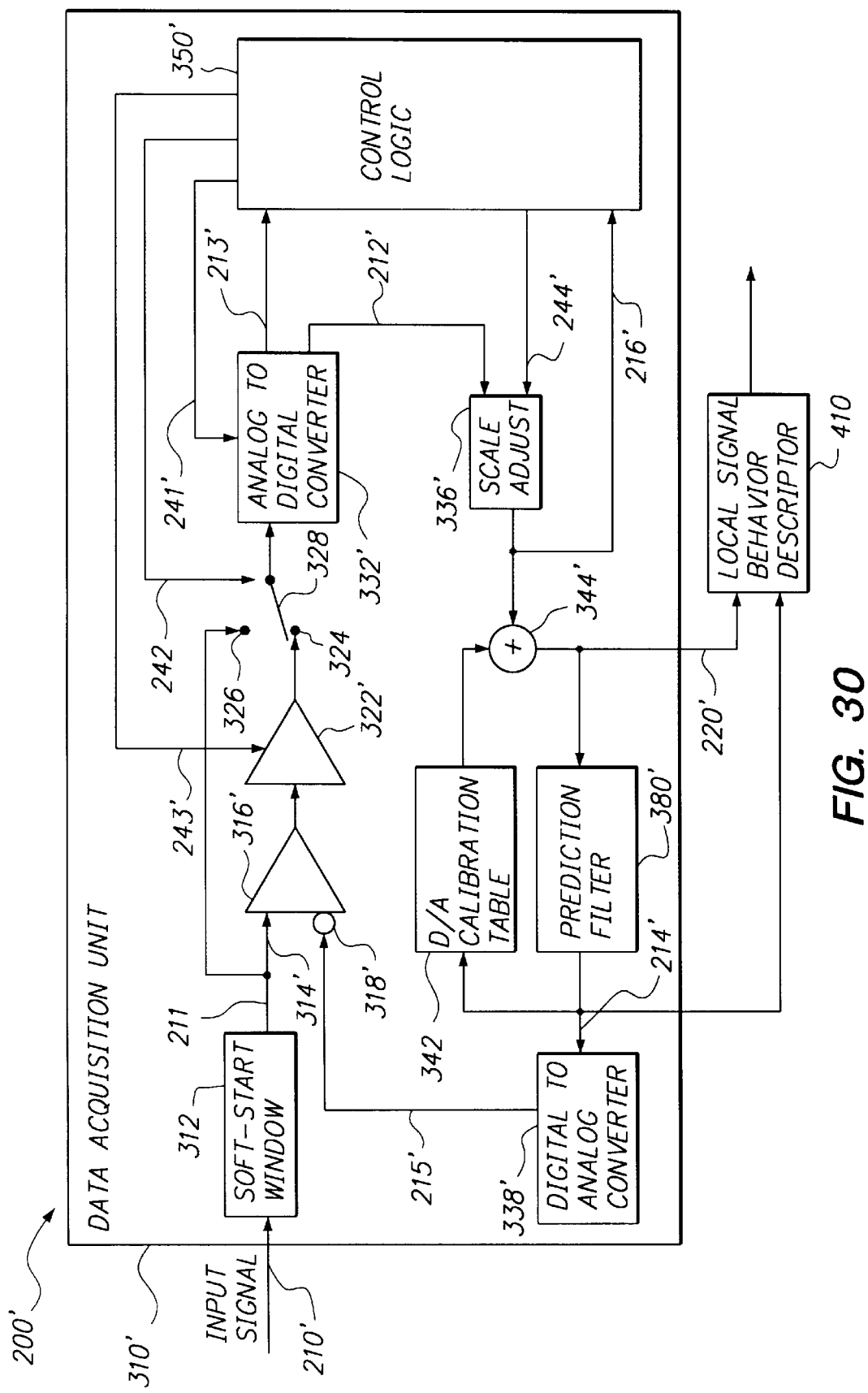
FIG. 30 is a block diagram illustrating the components of a second embodiment of a data acquisition unit of a signal processing engine according to a first aspect of the invention.

FIG. 27 is a block diagram illustrating the components of an embodiment of a data acquisition unit 310 of a signal processing engine according to a first aspect of the invention. FIG. 30 is a block diagram illustrating the components of a second embodiment of a data acquisition unit 310' of a signal processing engine according to a first aspect of the invention. The block diagram in FIG. 27 represents a basic, or idealized, data acquisition unit 310 according to the invention. The block diagram in FIG. 30 represents the basic data acquisition unit 310 augmented with certain additional features for responding to start-up transients and other transients which may occur during operation of the signal processing engine 200. The embodiment illustrated in FIG. 27 will be described first, and then the embodiment illustrated in FIG. 30, illustrating primarily the differences between the two embodiments. The components in both FIGS. 27 and 30 which serve the same function in both embodiments have the same reference numerals with the addition of a "'" ("prime") to the corresponding reference numerals in FIG. 30.

Referring now to FIG. 27, within the data acquisition unit 310, the input signal 210 is input to a non-inverting input 314 of a summing amplifier 316 (e.g., differential amplifier). The output of the summing amplifier 316 is coupled to the input of a programmable gain amplifier 322, and the output of the programmable gain amplifier 322 is coupled to the input of an analog to digital (A/D) converter 332.

The gain of the programmable gain amplifier 322 is controlled by a gain control signal 243 provided by a control logic 350 module within the data acquisition unit 310. The control logic 350 also provides a variable reference voltage signal 241 to the A/D converter 332. The variable reference voltage signal 241 is used to set the full scale range of the A/D converter 332. Through a procedure (described below) by which the gain of the programmable gain amplifier 322 and the full scale range of the A/D converter 332 are adjusted, the resolution of the A/D converter 332 is increased, i.e., the full scale of the A/D converter range 332 is set up to measure small changes in the input signal 210.

The A/D converter 332 digital output 212 represents a high resolution measurement of the difference between a predicted value of the input signal 210 and the actual value of the input signal 210. The A/D converter 332 digital output 212 is input to a scale adjust module 336. The scale adjust module 336 rescales the A/D converter 332 digital output 212 back to the full scale of the input signal 210, while preserving the high resolution of the A/D Converter 332 measurement of the difference between the predicted value of the input signal 210 and the actual value of the input signal 210. The scale adjust module 336 receives a scale adjust control signal 244 from the control logic 350. The scale adjust control signal 244 sets up parameters in the scale adjust module 336 corresponding to the gain of the programmable gain amplifier 322 and the full scale reference in the A/D converter 332.

The output of the scale adjust module output 336 is coupled to one input of an adder 344 and also fed back to the control logic 350. The output of the adder 344 is coupled to the input of a prediction filter 380 (which may also be referred to as an extrapolation filter). The prediction filter output 214 is coupled to the input of a digital to analog (D/A) converter 338 and to a second input of the adder 344. Thus, the output of the adder 344 is the sum of the output of the prediction filter 344, which is a predicted value of the input signal 210, and the output of the scale adjust module 336, which represents the difference between the predicted value of the input signal 210 and the actual value of the input signal 210. Therefore, the output of the adder 344 is a high resolution measurement of the input signal 210. This high resolution measurement of the input signal 210, output from the adder 344, is the digital representation 220 which is output from the data acquisition unit 310 to the local signal behavior descriptor 410.

The output of the D/A converter 338 is coupled to an inverting input 318 of the differential amplifier 316. Thus, the output of the differential amplifier 316, and the signal which is passed through the programmable gain amplifier 322 to be sampled by the A/D converter 332, is the difference between the current value of the input signal 210 and a predicted value 214, 215 of the input signal. This is described in detail below.

The local signal behavior descriptor 410 receives the digital representation 220 from the data acquisition unit 310, and calculates the outputs of linear operators applied to a polynomial approximation of the digital representation 220 of the sampled input signal 210. The structure and operation of the local signal behavior descriptor 410 is described below.

FIG. 28 is a block diagram illustrating the components of an embodiment of a prediction filter 110 of a signal processing engine according to a first aspect of the invention. The prediction filter is a transversal filter corresponding to a fully predictive complex with coefficients determined in the following manner:

The output of a fully predictive complex is of the form $v^0_{-k}, \ldots, v^0_0, \ldots, v^0_k$, where the complex consists of links $\Lambda_{-m}, \ldots, \Lambda_0$, with the present time $t_0$ as the focal point of the link $\Lambda_0$.

Let P(t,v) (bold v denoting a vector quantity) be the approximation polynomial corresponding to the link $\Lambda_0$. Then the predicted value b(t) is found as $$b(t) = P(t_1, v) = \sum_{j=-k}^{k} P_k(t_1) v^0_j$$

Here, $t_1$ is the first oversampling point following $t_0$. Since all of $v^0_{-k}, \ldots, v^0_0, \ldots, v^0_k$ are linear combinations of sampled values of the signal as provided by the complex, $$b(t) = \sum_m c_m ft(m) + \sum_\tau d_\tau f(\tau).$$

The coefficients $c_m$ for Nyquist rate samples f(m), and $d_\tau$ for the oversampling rate values of f, i.e. f(τ), are obtained from the equation for b(t) above by substituting for $v^0_j$ with the corresponding linear combinations for $v_i$ as given by the equations resulting from the complex. Since there are no Nyquist rate points and no oversampling rate points to the right of $t_0$, the resulting linear combination $$Z(t1) = \sum_m a_m f(m) + \sum_\tau b_\tau f(\tau)$$

is realized by a transversal filter of the form illustrated in FIG. 36, if the complex used is of the form illustrated in FIG. 25. The transversal filter includes 7 Nyquist rate taps and 11×6=66 taps on the oversampled scale, corresponding to the sampled values in the union of the central regions of all links.

Figure 29A:
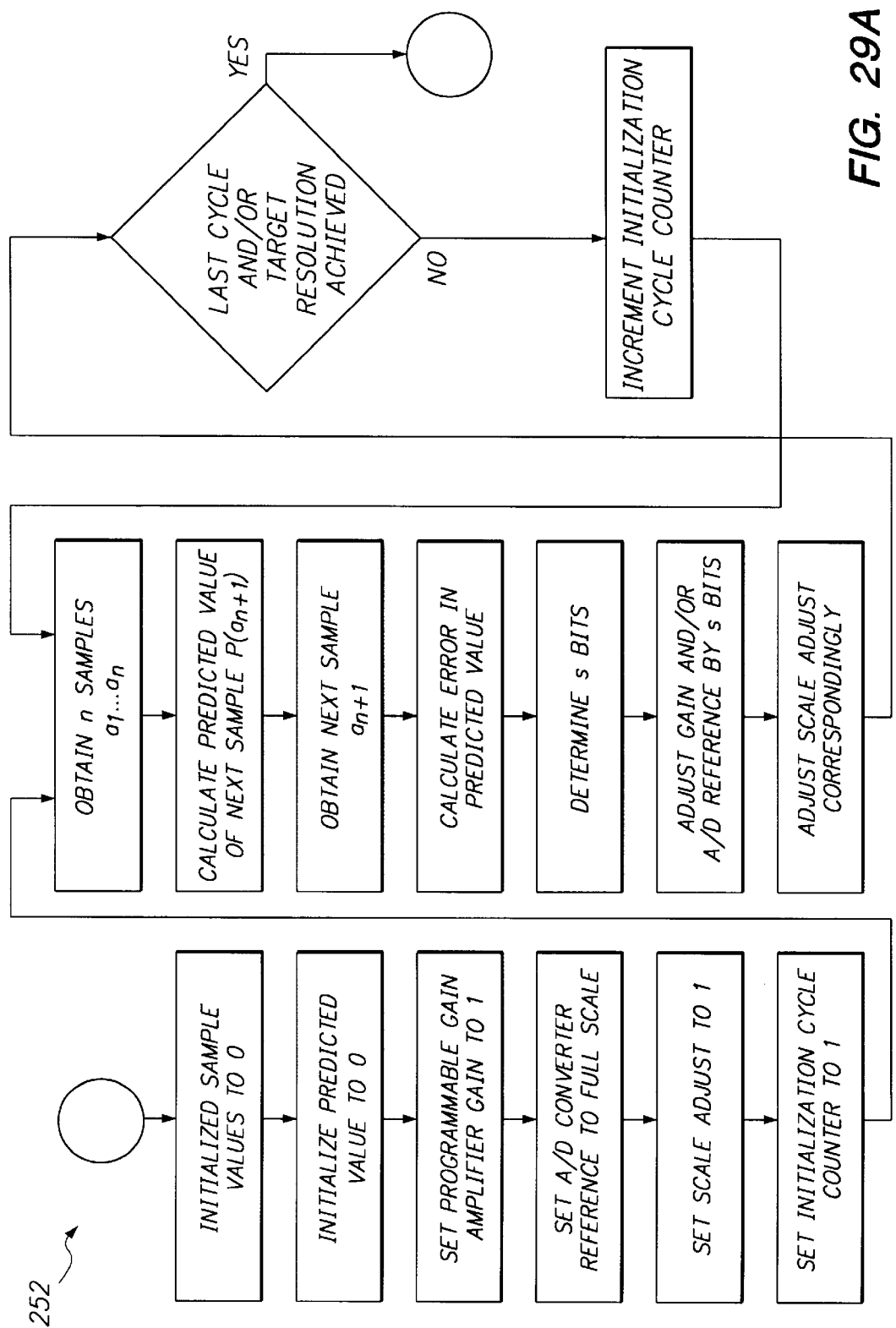
FIGS. 29A and 29B are flow charts which illustrate aspects of the operation of an embodiment of a control logic module of a signal processing engine according to a first aspect of the invention.
Figure 29B:
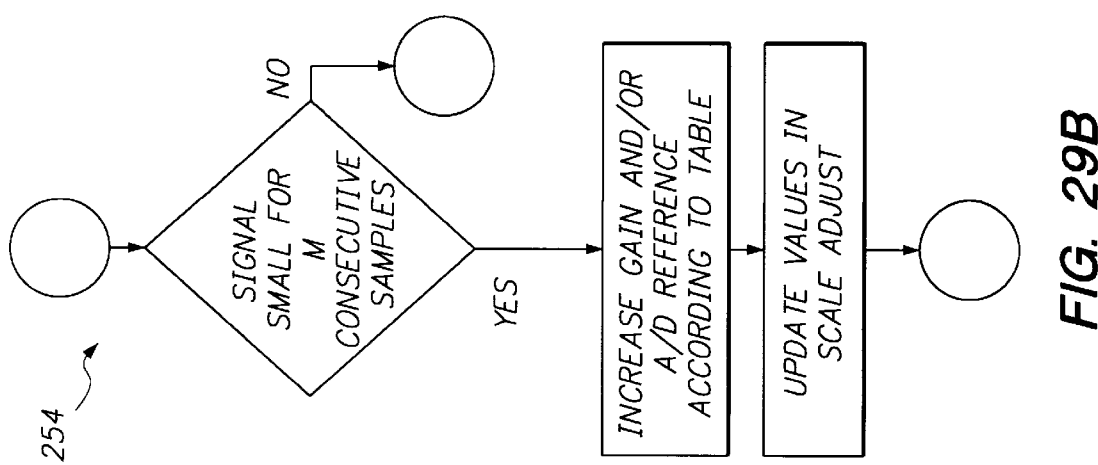

FIGS. 29A and 29B are flow charts which illustrate aspects of the operation of an embodiment of a control logic module of a signal processing engine according to a first aspect of the invention. The flow chart of FIG. 29A illustrates an initialization process 352 for the data acquisition unit 210. The flow chart of FIG. 29B illustrates a process for increasing the resolution of the A/D converter 332 during normal operation of the signal processing engine 200.

Referring to FIGS. 27, 28 and 29A, the operation of the data acquisition unit 310 proceeds as follows. At start-up of the signal processing engine 200, the control logic 350 initializes the data acquisition unit 310, setting all sample values to zero. The predicted value 214 output from the prediction filter 380 is set to zero, the programmable gain amplifier 322 is set to unit gain, and the reference voltage for the A/D converter 332 is set to its highest level. This level is chosen so that the full scale of the D/A converter 338 corresponds to the full scale of the A/D converter 332, i.e. the maximum amplitude of the input signal 210.

The A/D converter 332 begins sampling the input signal 210. After the A/D converter 332 has sampled n samples, at sampling points $t=a_1, a_2, \ldots a_n$, and the corresponding sampled values of the input signal $f(a_1), \ldots f(a_n)$ are obtained, the prediction filter 380 calculates a predicted value $P(a_{n+1})$ for the next sampling point $t=a_{n+1}$. This value is sent from the prediction filter 380 to the D/A converter 338. The D/A converter 338 converts the predicted value for the next sampling point to analog, and the converted predicted value for the next sampling point is input to the differential amplifier 316 where it is subtracted from the current value of the input signal 210.

The total error of the prediction filter 380 is the sum of the round off error which comes from the quantization error of the A/D converter 332 and the error of the polynomial approximation of the prediction filter 380. The resolution of the A/D converter 332 and the degree of the polynomial approximation of the prediction filter 380 are chosen so that the total sum of these two errors is smaller than a fraction $\frac{1}{2}^s$ (for some $s \geq 1$) of the full scale of the input. Thus, the difference voltage at the output of the differential amplifier 316 will be smaller than $\frac{1}{2}^s$ of the full scale of the input. FIG. 30 illustrates why polynomial approximations reduce the size of a signal which is to be sampled, i.e., instead of the full signal, the output of the differential amplifier 316 represents the approximation error from the prediction filter 380 combined with the quantization error of the A/D converter 332.

Referring again to FIGS. 27, 28 and 29A, for the next sample, i.e., at $t=a_{n+2}$, the gain of the programmable gain amplifier 316 and the full scale reference of the A/D converter 332 are adjusted to set the full scale of the A/D converter 332 to $\frac{1}{2}^s$ of the full scale of the input signal 210. This increases the resolution of the A/D converter 332, and hence the digital representation 220, by s bits. After n more samples, the resolution adjustment procedure is repeated and the resolution is again increased by s bits. Thus, each time the resolution is improved, the size of the quantization error is reduced, thereby allowing a higher resolution.

After a number of cycles, a "baseline" resolution, is achieved. The data acquisition unit 310 finishes the initialization procedure, and the signal processing engine 200 begins normal operation. The number of cycles the initialization procedure takes to establish the baseline resolution may be a predetermined number of cycles, or the procedure may run until a desired baseline resolution is achieved.

The resolution achieved during the initialization procedure is referred to as a baseline resolution because the resolution may also be increased during normal operation of the engine. Referring to FIG. 29B, the resolution may be increased in the following manner. The control logic 350 continually monitors the output of the scale adjust module 336. If the output of the scale adjust module 336 is less than a predetermined value for a specified number of consecutive samples, then the control logic 350 causes the gain of the programmable gain amplifier 316 and/or the full scale reference of the A/D converter 332 to be adjusted to again set the full scale of the A/D converter 332 to $\frac{1}{2}^s$ of the full scale of the input signal 210. The scale adjust module 336 is also updated to match any changes made to the gain of the programmable gain amplifier 316 and/or the full scale reference of the A/D converter 332. Although not illustrated in the FIGs., the control logic 350 may also be configured to reduce the resolution of the A/D converter 332 by adjusting the gain of the programmable gain amplifier 316 and/or the full scale reference of the A/D converter 332, if the output of the scale adjust module 336 exceeds specified criteria.

The topology of the data acquisition unit 310 differs from the usual "pipeline" architecture of A/D converters in two fundamental ways. First, the predicted value of the input signal is known well in advance since the predicted value is produced by simple computations from the values of the signal at previous sampling points. Thus, the D/A converter 338 has an ample amount of time to settle, and higher precision can be achieved much easier. Second, the procedure is dependent on the spectral content of the signal which makes sampling adaptive, and maintains a high resolution only when justified by the particular application, and is controlled entirely by parameters obtained internally with relatively simple computations.

During normal operation, the signal processing engine 200 may continue to increase its resolution whenever the approximation error is low. However, increased sampling resolution may not be immediately reflected in the number of digits used to code the sample values in the output of the signal processing engine 200. Instead, the increased resolution sharply reduces the quantization (round-off) error, making the intrinsic error of the polynomial approximation the larger contributor to the total error. The prediction error is averaged over a reasonably long period of time. Generally, the total error E(t) of a polynomial extrapolation is the sum of the error of the polynomial approximation itself and the cumulative effect of the round-off error. As the round-off error, caused by quantization, decreases sharply with increased resolution, the total error becomes approximately equal to the error of the approximation $E_{app}(t)=|f(t)-Y(t)|$. However, in general, the error of polynomial approximations can be bounded by a bound which depends on the value of a certain derivative of the signal, the order of the derivative depending on the number of points in the approximation. This bound is expressible in terms of the energy of the signal and is highly frequency-dependent. This is due to the filtering characteristics of derivation. The average value of error reflects the energy of transients. Thus, a suitable look-up table can be used to calculate the timing for increasing resolution according to the effect of the masking phenomena.

The maximal possible increase in resolution is eventually limited by the limitations imposed by the noise of the hardware.

As indicated above, the embodiment of a data acquisition unit 310 illustrated in FIG. 27, is a basic, or idealized, data acquisition unit. The block diagram in FIG. 30 represents a data acquisition unit 310' augmented with certain additional features for responding to start-up transients and other transients which may occur during operation of the signal processing engine.

Referring now to FIG. 30, within the data acquisition unit 310', the input signal 210 is input to a soft-start window 312. The purpose of the soft-start window 312 is to dampen initialization transients upon start-up of the signal processing engine 200, and particularly in order to facilitate the initialization of the prediction filter 380'. FIG. 31 is a graph which illustrates the transfer function of the soft-start window 312 as a function of time, and shows that the soft-start window 312 simply acts as a variable attenuator. Upon start-up, the output of the soft-start window 312 is initially forced to zero, i.e. 100 percent attenuation. After a brief delay, the attenuation of the soft-start window 312 is reduced, thereby permitting the output range to increase. When the attenuation reaches zero, the soft-start window 312 appears as a switch in the closed position. The length of the delay prior to reducing the attenuation, and the rate at which the attenuation is reduced will depend on the particular application of the signal processing engine 200.

The soft-start output 211 is coupled to a non-inverting input 314' of the differential amplifier 316'. The output of the differential amplifier 316' is coupled to the input of the programmable gain amplifier 322', and the output of the programmable gain amplifier 322' is coupled to a normally closed (N.C.) position 324 of an A/D input selection switch 328. The soft-start output 211 is also directly coupled to a normally open (N.O.) position 326 of the A/D input selection switch 328. The A/D input selection switch 328 is coupled to the input of the A/D converter 332'.

The gain of the programmable gain amplifier 322' is controlled by the gain control signal 243' provided by the control logic 350' module. The control logic 350' also provides the variable reference voltage signal 241' to the A/D converter 332'. The variable reference voltage signal 241' is used to set the full scale input range of the A/D converter 332'.

The A/D converter 332' digital output 212' is input to the scale adjust module 336'. The scale adjust module 336' receives a scale adjust control signal 244' from the control logic 350'. The scale adjust control signal 244' sets up parameters in the scale adjust module 336' corresponding to the gain of the programmable gain amplifier 322' and the full scale reference in the A/D converter 332'.

The output of the scale adjust module 336' is coupled to a first input of the adder 344'. The output of the adder 344' is coupled to the prediction filter 380', and the output of the prediction filter 380' is coupled to the input of the D/A converter 338' and to a D/A calibration table 342. The output of the D/A calibration table 242 is coupled to a second input of the adder 344'. The output of the D/A converter 338' is coupled to an inverting input 318' of the differential amplifier 316'.

The differences between the basic data acquisition unit 310 illustrated in FIG. 27, and the augmented data acquisition unit 310' illustrated in FIG. 31, include the soft-start window 312, the A/D input selection switch 328 with the direct coupling from the output of the soft-start window 312, the D/A calibration table 342, and certain transient recovery functions performed by the control logic 350'.

The function of the soft-start window 312 is described above. The D/A calibration table 342 is a table which calibrates the output of the D/A converter 338' against an ideal D/A converter. It is important that the value which is input to the adder 344' accurately represent the value which is actually output by the D/A converter 338', i.e., including any error inherent in the D/A converter 338', and input to the differential amplifier 316'. Therefore, the D/A calibration table 342 inputs the predicted value 214' from the prediction filter 380', and feeds back to the adder 344' a digital value which represents the analog value output from the D/A converter 338'.

Figure 32:
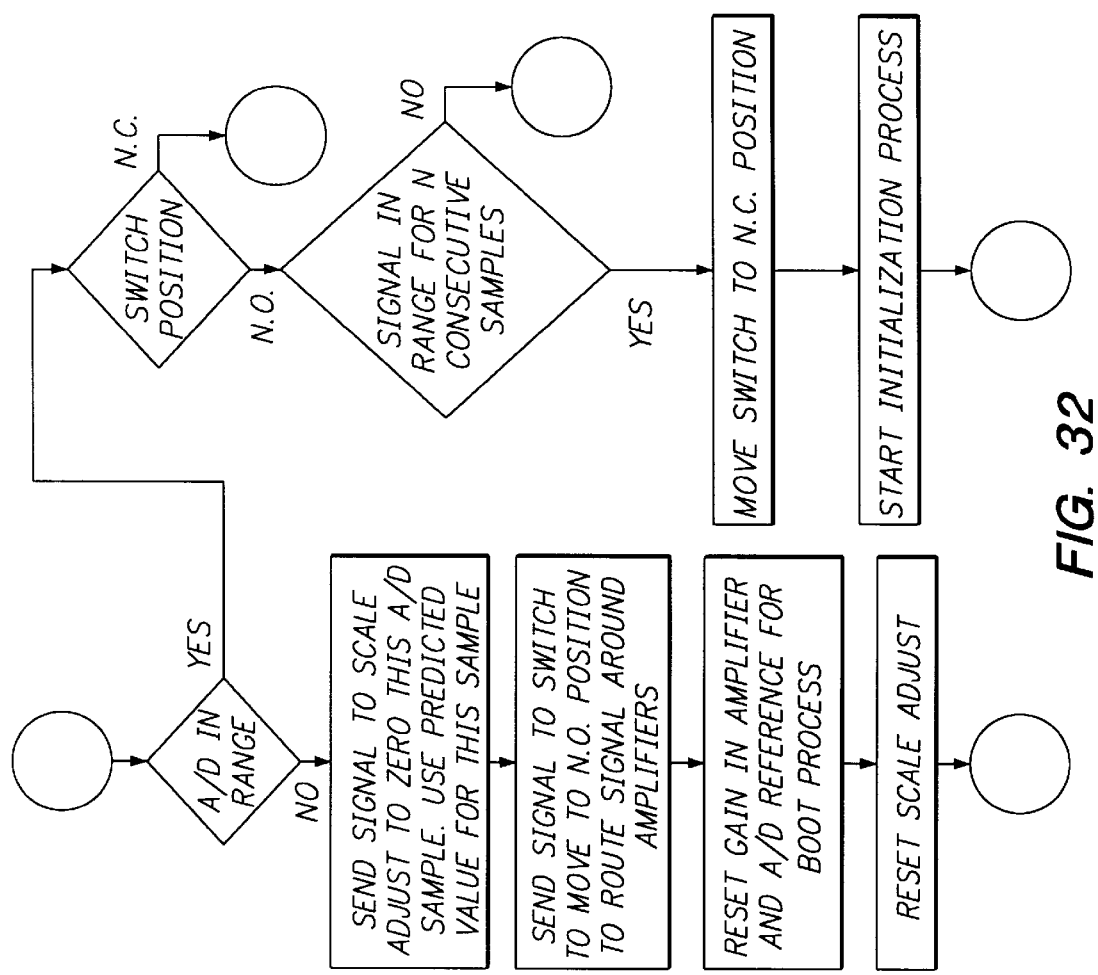
FIG. 32 is a flow chart which illustrates the transient recovery operation of the control logic in the second embodiment of a data acquisition unit illustrated in FIG. 30.

The flow chart in FIG. 32 illustrates the transient recovery operation of the control logic 350'. Referring briefly to FIG. 30, the control logic 350' monitors an A/D in range signal 213 from the A/D converter 332'. Under normal operation, the A/D in range signal 213 should indicate that the signal input to the A/D converter 332' from the programmable gain amplifier 322' is within the range of the A/D converter 332'. However, if, for example, due to a transient in the input signal 210', the signal input to the A/D converter 332' saturates the A/D converter 332' and exceeds the full scale range of the A/D converter 332', the control logic 350' sends a scale adjust control signal 244' to the scale adjust module 336' to ignore the current sample from the A/D converter 332', and to use the current predicted value as the actual value for the current sample. The control logic 350' also sends an A/D input switch signal 242 to the A/D input selection switch 328 causing the A/D input selection switch 328 to switch to the N.O. position 326, thereby coupling the output of the soft-start window 312 directly to the input of the A/D converter 332'. The control logic 350' also sends a variable reference voltage signal 241' to reset the full scale range of the A/D converter 332', a gain control signal 243' to reset the gain of the programmable gain amplifier 322' to unity, and a scale adjust control signal 244' to reset the scale adjust module 336.

On a subsequent sample, the A/D in range signal 213 will indicate that the signal input to the A/D converter 332' is within the range of the A/D converter 332'. The control logic 350' then tests to determine the position of the A/D input selection switch 328. The first N times through this path, N representing a predetermined period to allow settling of a transient on the input, the A/D input selection switch 328 will be in the N.O. position 326 having been set when the out of range condition was first detected. After the signal input to the A/D converter 332' is within the full scale range of the A/D converter 332' for N consecutive samples, the control logic 350' sends an A/D input switch signal 242 to the A/D input selection switch 328 causing the A/D input selection switch 328 to switch to the N.C. position 324, thereby coupling the output of the soft-start window 312 to the input of the A/D converter 332' through the differential amplifier 316' and programmable gain amplifier 322'. The control logic 350' then starts the initialization process illustrated by the flow chart of FIG. 29A.

The output of the polynomial approximator in the data acquisition unit is a (2k+1) tuple of values of the complex implemented in the data acquisition unit. Thus, it might seem that the oversampled data was not compressed since each Nyquist rate sampling point produced (2k+1) many values which can be substantially more than the degree of oversampling. However, this is not the case, since in processing data at each sampling point, only these 2k+1 points are used, due to the fact that all operators are defined from locally supported operators (recursion involving the previous value of computation can be used, but not any new sampling points.)

Thus, any filtering computes the value from the previous value of the filtered signal using only 2k+1 (e.g. 17 in this embodiment) new local behavior parameters associated with the new point.

The derivation of local behavior parameters can be achieved using a "smart" LSB based A/D converter using, for example, a CCD implemented transversal filter.

Once the configuration of a transversal filter for an application has been determined, including number of Nyquist rate taps, number of oversampled rate taps, coefficients represented by the amplifiers, etc., the implementation of the filter may be "hardwired," i.e. it need not be programmable because the configuration and coefficients will not change. Also, a processor implementing the data acquisition unit can use oversampled data not only to obtain the local behavior parameters, but also to predict the new value of the signal and thus significantly reduce the dynamic range of the A/D converter. This prediction is obtained by evaluating the approximation function of the last link at the point in the future corresponding to the next sampling point.

Within the processor the basic calculations (differentiation, integration, solution of differential equations etc) are performed using an interpolation with 2k+1 points, or just 4–7 values of the chromatic derivatives.

Implementations of the LSB method and engine of the invention can be layered with significantly lower Nyquist rates, correcting the low frequency error of the primary stage. Also, for example, filtering can be implemented in a mix of LSB plus harmonic technologies. For example, FIG. 34 is a diagram which illustrates an arrangement 140 which includes a combination of an LSB Engine 142 and a harmonic low pass filter 144. In the arrangement 140 illustrated in FIG. 34, a signal is input to both the LSB Engine 142 and to a non-inverting input of a unit gain differential amplifier 143. The output of the LSB Engine 142 is coupled to an inverting input of the unit gain differential amplifier 143 and to a first input of an adder 145. The output of the unit gain differential amplifier 143 is coupled to the input of the harmonic low pass filter 144, and the output of the harmonic low pass filter 144 is coupled to a second input of the adder 145.

The cut off frequency of the harmonic low pass filter 144 is chosen to be sufficiently within the pass band of the LSB Engine 142. The harmonic low pass filter 144 does not "see" any frequencies near its cut-off frequency, and therefore it introduces no significant phase shift. The role of the harmonic low pass filter 144 is confined to isolating the low frequency error of the LSB Engine 142. This arrangement will be illustrated in the following description of a switch mode amplifier which employs the LSB signal processing method and engine of the invention.

X. Switch Mode Amplifier

Figure 35:
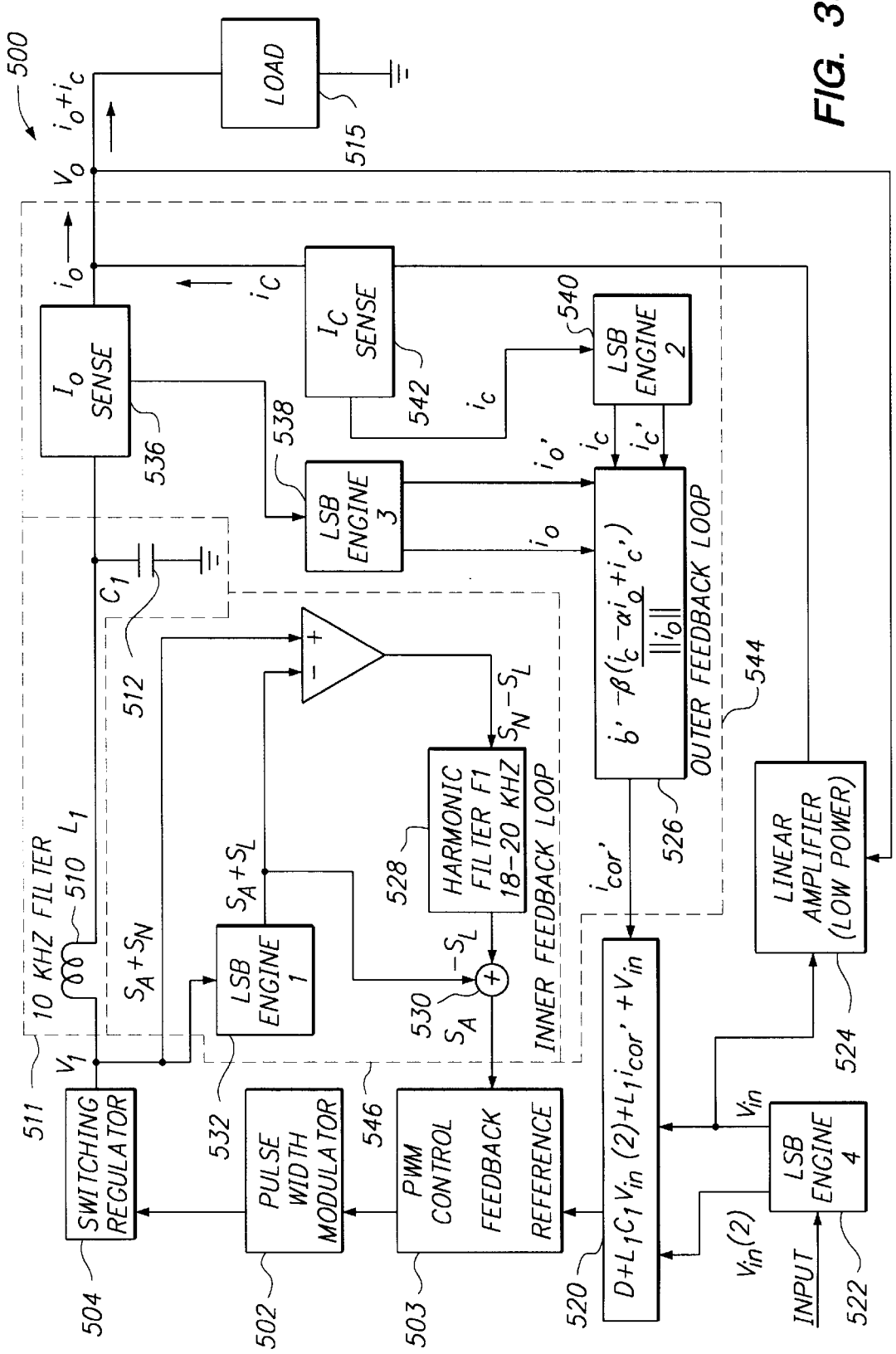
FIG. 35 is a diagram illustrating an embodiment of a switch mode power amplifier employing the signal processing engine of the invention.
Figure 39:
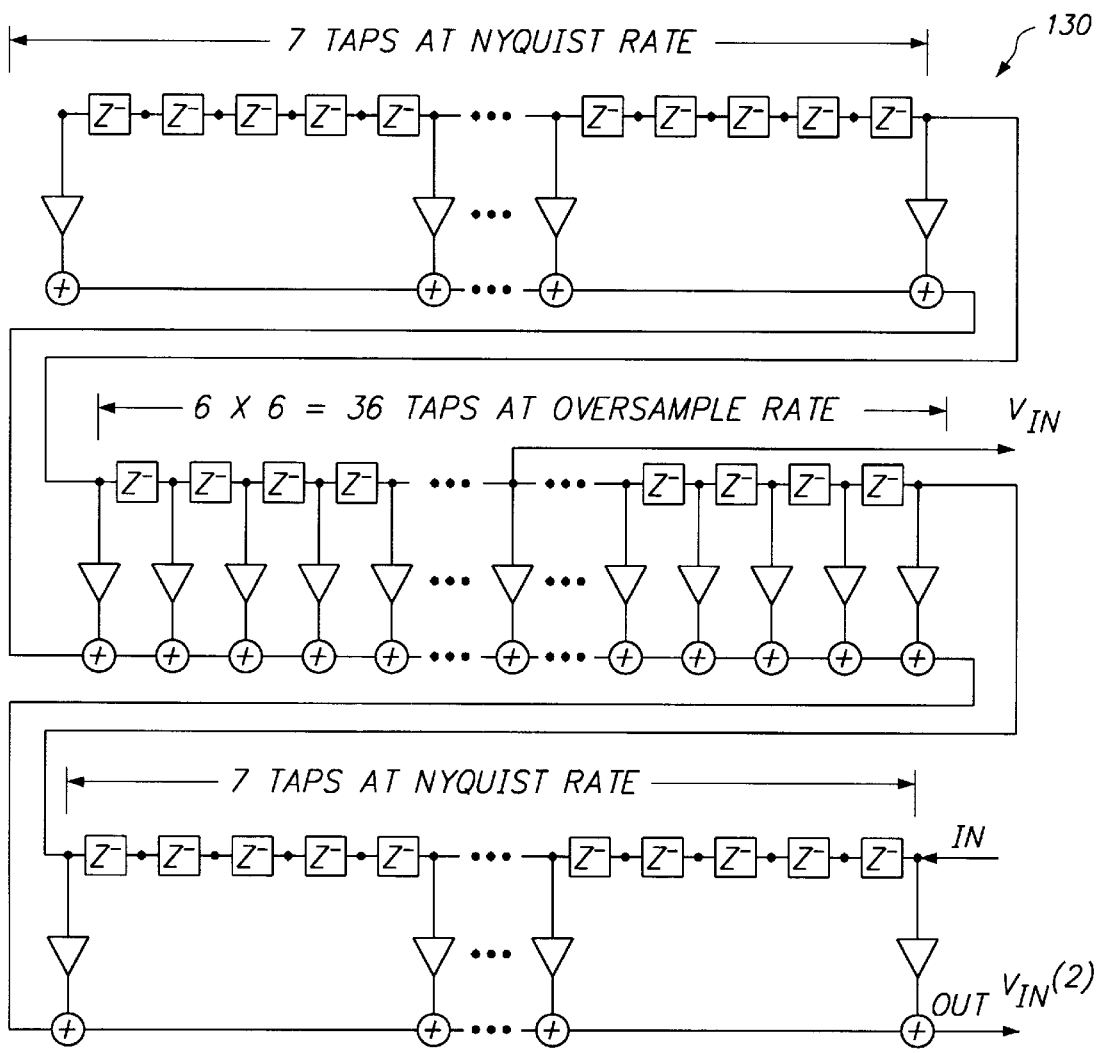
FIG. 39 is a diagram of an embodiment of a transversal filter suitable for use in LSB Engine 4 in the switch mode amplifier illustrated in FIG. 35.

FIG. 35 is a diagram of an embodiment of a switch mode power amplifier 500 employing the signal processing method and engine of the invention. The application of the signal processing method and engine of the invention to the design of a switch mode power amplifier overcomes shortcomings of existing switching amplifiers, e.g. class "D" amplifiers. These shortcomings include: poor handling of highly reactive complex loads (e.g., speakers), usually requiring a duty cycle or feed-back adjustment with the change of the load; poor performance in the upper part of the bandwidth, including numerous switching artifacts; and high distortion, especially in the upper part of the spectrum. These shortcomings are all overcome using the local signal behavior signal processing method and engine of the invention.

Referring first to FIG. 36, illustrated is a circuit diagram of certain components of the switch mode amplifier 500 illustrated in FIG. 35. The arrangement includes a pulse width modulator (PWM) 502 which is coupled to a switching regulator 504. The switching regulator 504 may be a push-pull or other switching regulator known to those skilled in the art. The output of the switching regulator 504 is coupled to a 10 kHz filter 511 which includes a series inductor 510 and a parallel capacitor C1 512. The output of the 10 kHz filter 511 is coupled to a reactive load 515. It can be shown that, in the circuit of FIG. 36, $$V_1(t) = L_1 C_1 V_{in}^{(2)}(t) + L_1 i_o'(t) + V_{in}(t).$$

Using elementary relationships between the voltages and currents, and the derivatives of the voltages and currents in the circuit of FIG. 36, it can be established that, in order that at any time t the voltage $V_o(t)$ on the output of the circuit is equal to a given voltage $V_{in}$ (where $V_{in}(t)$ is the input voltage multiplied by the voltage gain), the voltage $V_1(t)$ must be equal to the value of the following differential operator:

$$D(V_{in}, i_o) = L_1 C_1 V_{in}^{(2)}(t) + L_1 i_o'(t) + V_{in}(t)$$

Thus, the voltage $V_1(t) = D(V_{in}, i_o)(t)$ depends on the input voltage $V_{in}(t)$ and the output current $i_o(t)$. Here, $i_o(t)$ is treated as a fully independent parameter and this allows the amplifier to drive any reactive load, since no assumption is being made about the relationships between the output voltage $V_o(t)$ and the output current $i_o(t)$. In this manner, the output voltage of the circuit is always in perfect phase with $V_{in}(t)$. Thus, the differential operator $D(V_{in}, i_o)$ essentially performs reverse filtering. This allows a small linear power amplifier to correct any error made by the switching circuit, by simple comparison of the voltages $V_o(t)$ and $V_{in}(t)$.

The $L_1 C_1$ network 510, 512 is chosen so that the cut-off frequency of the filter 511 is well within the audible spectrum (e.g., 10 kHz). This strongly suppresses the switching noise and the high frequency artifacts of switching, leaving for the linear amplifier an easy task of correcting the remaining low level error in the presence of a very low switching noise.

Referring again to FIG. 35, the details of operation of the amplifier circuit are described below. The control unit of the amplifier exemplifies applications of the signal processing method and engine of the invention in control systems in general, and also how harmonic means can be used in conjunction with the LSB engine. Also, despite the obvious fact that the design can be realized purely in digital technology, those skilled in the art will recognize that the embodiment illustrated can also be conveniently realized in CCD technology.

Since the value $D(t) = L_1 C_1 V_{in}^{(2)}(t) + L_1 i_o'(t) + V_{in}(t)$ involves values of inductors and capacitors which may be known with limited accuracy and which are subject to change over time due, for example, to aging, , and due to the intrinsic error of the signal processing used to determine $V_{in}^{(2)}(t)$ and $i_o'(t)$, the amplifier must rely on the feed back to ensure the accuracy of $V_o$. Since the switching frequency is only 5 times the Nyquist rate, the number of recursive iterations in the feedback loop due to the digital delay (action can be taken only once per switching cycle) is very low.

The amplifier circuit includes the switching regulator 504, a 10 kHz LC filter 511, a low power linear amplifier 524 and two feedback loops. An inner feedback loop 546 includes an LSB Engine 1 532 with weights "tuned" maximally toward the upper part of the spectrum, allowing substantial error (drift) in the low end of the spectrum. This means that $S^2_i$ has low weight allowing that parameters $V^i_j$, depart significantly from the values f(i+j), while differential operators are kept tight from one link to another link. In this way, the output of LSB Engine 1 532 is of the form $S_A + S_L$, where $S_A$ is the signal (the audible part of the spectrum of the voltage $V_1$) and $S_L$ is the low frequency error signal produced by LSB Engine 1 532.

The voltage $V_1$ contains also the high frequency noise $S_N$. By subtracting the output of LSB Engine 1 532 from $V_1 = S_A + S_N$, the signal $S_N - S_L$ is obtained, which is then filtered by a harmonic filter F1 528. However, the input to harmonic filter F1 528 does not have any significant component around its cutoff frequency of about 12–18 kHz. Thus, no significant delay or phase shift is produced, and the output is $S_L$, with negligible delay and phase shift.

An adder 530 adds the output of the harmonic filter F1 528 to the output of LSB Engine 1 532, and provides $S_A$ with no phase shift or delay. This provides the feedback voltage for the pulse width modulator 502.

The noise on the input of LSB Engine 1 532 is very high. Thus, LSB Engine 1 532 comprises a $\Sigma$-$\Delta$ filter as illustrated in FIG. 37, preferably with an analog leaky integrator as illustrated in FIG. 38. Integration is done on an "infinitely fine" scale by analog integration, and differentiation is performed by LSB Engine 1 532 to which the analog leaky integrator sends its output. In FIG. 38, the analog leaky integrator 150 is shown coupled directly to the input of the transversal filter 120 of FIG. 37. Although not illustrated, a data acquisition unit 310, as illustrated in FIGS. 26, 27 and 30 would be coupled between the leaky integrator 150 and the transversal filter 120. The low end of the spectrum of the error is corrected by the harmonic filter F1 528.

The driving signal for the amplifier 500 is provided by an LSB Engine 4 522, producing on its output $V_{in}$ and $L_1 C_1 V_{in}^{(2)} + V_{in}$. $V_{in}$ is only delayed by LSB Engine 4 522. This filter has the easiest task since it provides $V_{in}^{(2)}$ in conditions of high oversampling (the delay chain can be made with, for example, 4 $\mu$sec delay units corresponding to about 5× oversampling). The input signal is essentially noise free and small delay <1 msec introduced by this filter is inconsequential. Thus, LSB Engine 4 522 provides a fully grounded complex. LSB Engine 4 522 comprises a transversal filter 130 as illustrated in FIG. 38.

The input for the PWM 502 is provided by a differential operator 520

$$D = L_1 C_1 V_{in}^{(2)} + L_1 i_o' + V_{in}$$

with $i_o'$ being altered by the outer feedback loop 544.

The operation of the outer feedback loop 544 is as follows. The linear amplifier 524 maintains the output voltage to the exact level $V_{in}$, and the correction current, $i_c$, supplied by the linear amplifier 524 is sensed and processed by LSB Engine 2 540 which provides $i_c$ and $i_c'$. The current $i_c$ is maintained to a small fraction, typically one percent, of the output current $i_o$.

Any deviation from this nominal value is compensated for by the outer feedback loop 544 operating as follows. The value $i_o'$ is altered in two ways. First, to insure tracking and the prevent the error build up, $i_o'$ is corrected for the value of the derivative of the correction current $i_c'$. This prevents the error accumulation. The reduction by further error correction for the factor $$\frac{\beta(i_c - \alpha i_o)}{\|i_o\|}$$

where $\|i_o\| = |i_o|$ for $|i_o| > c$ $= c$ for $|i_o| \leq c$ i.e., $\|i_o\|$ is equal to the absolute value of the current $i_o$, and is set to a small constant, c, if the absolute value of $i_o$ drops below c.

The coefficient $\alpha$ is chosen so that $\alpha$ is the quotient determining the nominal value of $i_c$ compared with the value of the output current. The coefficient $\beta$ corresponds to the feedback slope since it determines the rate of convergence of the correction. Altering $i_o'$ in such a way to obtain $i_{cor}'$ essentially factors in the compensation for the error with a stable convergence rate and prevents the further buildup of the current error.

LSB Engine 2 540 comprises a filter 120 as illustrated in FIG. 37. LSB Engine 3 538 has an input with much smaller ripple that does LSB Engine 1 532. No Σ-Δ filtering is needed for LSB Engine 3 538. Thus, LSB Engine 3 538 is a differentiator operating on the end of the data stream, and is a fully predictive complex as illustrated in the graph of FIG. 25. LSB Engine 3 538 is also implemented as a transversal filter 120 illustrated in FIG. 37.

In reference to the description of the switch mode amplifier 500 illustrated in FIG. 35, the descriptions of LSB Engine 1 532, LSB Engine 2 540, LSB Engine 3 538 and LSB Engine 4 522 indicate the configurations of transversal filters which may be used in an implementation of each respective LSB engine 532, 540, 538, 522. The transversal filter in each respective LSB engine 532, 540, 538, 522 corresponds to a polynomial approximator within the local signal behavior descriptor 410 illustrated in FIG. 33. In particular implementations of the switch mode amplifier 500, each of the LSB engines 532, 540, 538, 522 may have its own respective data acquisition unit 310 (illustrated in FIGS. 26, 27 and 30), or the four LSB engines 532, 540, 538, 522 may share a single multiplexed data acquisition unit 310.

XI. Summary: Harmonic Analysis and Local Signal Behavior Processing

Figure 40:
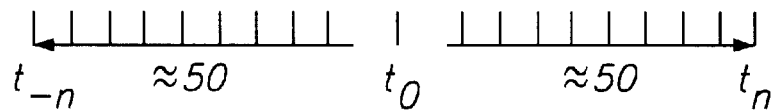
FIGS. 40, 41 and 42 are diagrams which illustrate differences between the approach used by harmonic analysis and the approach used by the local signal behavior processing method and engine of the invention.
Figure 41:
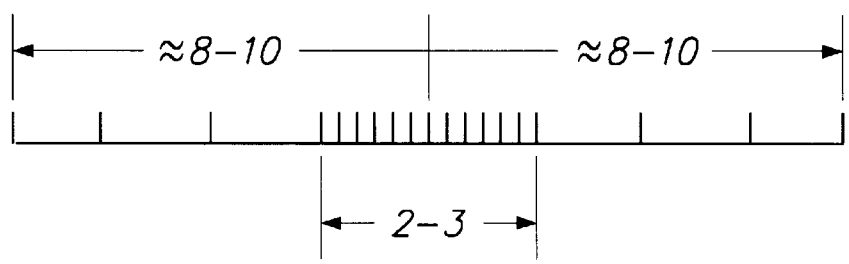
Figure 42:
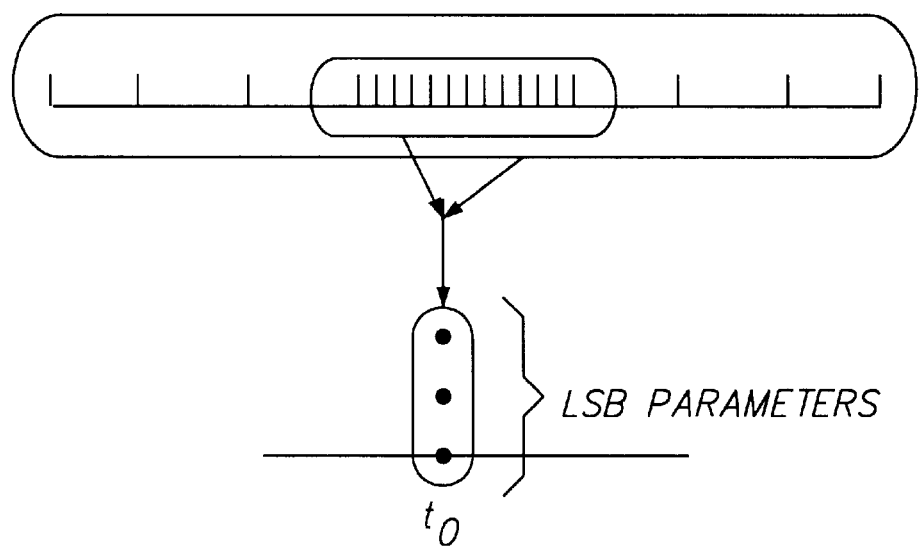

FIGS. 40, 41 and 42 are diagrams which illustrate differences between the approach used by harmonic analysis and the approach used by the local signal behavior processing method and engine of the invention.

As illustrated in FIG. 40, in order to find the value of the output of a procedure at a point $t_0$, harmonic analysis uses a large number of Nyquist rate data points (specific example shown uses about 100), and uses the Nyquist rate sampled values f(i) directly in the computations.

As illustrated in FIG. 41, the local signal behavior processing method and engine of the invention, instead, use a much smaller number of Nyquist rate data points, e.g. 12–24 (specific example shown uses 16–20), and use oversampled data points from a short interval, e.g. a 1–5 Nyquist rate interval (specific example shown uses 2–3).

As illustrated in FIG. 42, the local signal behavior processing method and engine of the invention do not output the sampled values directly, but instead transform the sampled data points into local signal description parameters. Each point is assigned its respective local signal description parameters, Processing at each point $t_0$ uses only the local signal description parameters assigned to to and previous results of the procedure, but does not use the values of other points or local signal description parameters assigned to other points.

All operators of the signal processing method and engine of the invention act locally, or are defined by recursion from operators which act locally.

Therefore, in accordance with the invention, extraction of local signal behavior description parameters is uniform, and once configured, needs no program changes. Implementations of the signal processing engine of the invention can be "hard wired."

It will be readily apparent to a person skilled in the art that numerous modifications and variations of the present invention are possible in light of the above teachings. It is therefore to be understood that, within the scope of the appended claims, the invention may be practiced other than as specifically describe.

I claim:

1. A signal processor comprising data description means for characterizing a local behavior of a band limited signal, the data description means comprising data acquisition means for sampling the signal at a rate which is n times the band limit of the signal, where n is greater than 2, and local signal behavior descriptor means for calculating an output of a linear operator applied to a polynomial approximation of the sampled signal.

2. A signal processor according to claim 1, wherein the linear operator comprises a locally supported operator.

3. A signal processor according to claim 2, wherein the locally supported operator comprises a differential operator, an integral operator, an interpolation operator, or an extrapolation operator.

4. A signal processor according to claim 3, wherein the locally supported operator comprises a differential operator, and the differential operator comprises a first derivative, a second derivative, a third derivative, a fourth derivative, a fifth derivative, or a sixth derivative.

5. A signal processor according to claim 4, wherein the differential operator comprises a chromatic derivative.

6. A signal processor according to claim 1, wherein the linear operator comprises an operator which is recursively defined from a locally supported operator.

7. A signal processor according to claim 1, wherein the polynomial approximation comprises a piecewise polynomial approximation.

8. A signal processor according to claim 1, wherein the polynomial approximation comprises a Lagrange polynomial approximation.

9. A signal processor according to claim 1, wherein the local behavior descriptor means comprises a transversal filter.

10. A signal processor according to claim 1, wherein the data acquisition means comprises analog to digital conversion means for sampling a signal and outputting a digital representation of the sampled signal.

11. A signal processor according to claim 1, wherein the data acquisition means comprises soft-start means for dampening initialization transients upon start-up of the signal processor.

12. A signal processor according to claim 1, wherein the data acquisition means has a full scale and a resolution, and comprises prediction means for providing a predicted value of the sampled signal, differencing means for determining the difference between the sampled signal and the predicted value of the sampled signal, and adjustment means for adjusting the full scale and the resolution in response to the difference between the sampled signal and the predicted value of the sampled signal.

13. A switch mode amplifier comprising input means for receiving an input voltage, a low pass filter for providing an output voltage and output current to a load a switching regulator for regulating a voltage input to the low pass filter, pulse width modulation control means for controlling the switching regulator, correction means for comparing the output voltage with the input voltage and supplying a correction current to the load based on the results of the comparison, an inner feedback loop for sensing a switching regulator output voltage at an output of the switching regulator and providing an inner feedback loop input to the pulse width modulation control means, the inner feedback loop input responsive to the switching regulator output voltage, the inner feedback loop comprising a first signal processor according to claim 1, the first signal processor adapted to input the switching regulator output voltage and providing an audible component of the switching regulator output voltage, an outer feedback loop for sensing the output current and the correction current and providing an outer feedback loop input to the pulse width modulation control means, the outer feedback loop input responsive to the output current and the correction current, the outer feedback loop comprising a second signal processor according to claim 1, the second signal processor adapted to input the sensed value of the correction current and to output a first derivative of the correction current, and a third signal processor according to claim 1, the third signal processor adapted to input the sensed value of the output current, and to output a first derivative of the output current, and a fourth signal processor according to claim 1, the fourth signal processor adapted to receive the input voltage and to output a second derivative of the input voltage to the pulse width modulation control means.

14. A signal processor according to claim 1, the signal processor comprising means for creating one or more monads, each monad having its own interpolation polynomial and joining means for joining adjacent monads into a simplex or a complex.

15. A signal processor according to claim 14, wherein the means for linking adjacent monads comprises using least square fit procedures to match polynomial approximations of adjacent monads.

16. A signal processor according to claim 14 wherein the means for linking adjacent monads comprises using least square fit procedures to match chromatic derivatives of adjacent monads.

17. A signal processing method for characterizing a local behavior of a band limited signal, the signal processing method comprising the steps of a. sampling the signal at a rate which is n times the band limit of the signal, where n is greater than 2, b. calculating an output of a linear operator applied to a polynomial approximation of the sampled signal.

18. A signal processing method according to claim 17, wherein the linear operator comprises a locally supported operator.

19. A signal processing method according to claim 18, wherein the locally supported operator comprises a differential operator, an integral operator, an interpolation operator, or an extrapolation operator.

20. A signal processing method according to claim 19, wherein the locally supported operator comprises a differential operator, and the differential operator comprises a first derivative, a second derivative, a third derivative, a fourth derivative, a fifth derivative, or a sixth derivative.

21. A signal processing method according to claim 20, wherein the differential operator comprises a chromatic derivative.

22. A signal processing method according to claim 17, wherein the linear operator comprises an operator which is recursively defined from a locally supported operator.

23. A signal processing method according to claim 17, wherein the polynomial approximation comprises a piecewise polynomial approximation.

24. A signal processing method according to claim 17, wherein the polynomial approximation comprises a Lagrange polynomial approximation.

25. A signal processing method according to claim 17, wherein the step of sampling the signal comprises converting sampling an analog signal and converting the analog samples to a digital representation of the sampled signal.

26. A signal processing method according to claim 17, wherein the step of sampling the signal comprises a soft-start step for dampening initialization transients.

27. A signal processing method according to claim 17, wherein the step of sampling the signal comprises establishing a full scale and a resolution for sampling the signal, calculating a predicted value of the sampled signal, determining the difference between the value of the sampled signal and the predicted value of the sampled signal, and adjusting the full scale and the resolution in response to the difference between the value of the sampled signal and the predicted value of the sampled signal.

28. A signal processing method according to claim 17, the method comprising the steps of c. creating one or more monads each having it's own interpolation polynomial; and d. joining adjacent monads together into a simplex or complex by using least square fit procedures to match the polynomial approximations and chromatic derivatives of adjacent monads.

29. A signal processing method for characterizing a local behavior of a band limited signal, the signal processing method comprising the steps of a. sampling the signal at a rate which is m times the Nyquist rate for the band limit of the signal, where m is greater than 1, every mth sample being a Nyquist rate sample, the time between two successive Nyquist rate samples being a Nyquist rate interval, and b. calculating a local signal description parameter for a sampled value of the signal at a time $t_0$, the local signal description parameter comprising an output of a linear operator applied to a polynomial approximation of the signal at the time $t_0$, the polynomial approximation comprising not more than 24 Nyquist rate samples of the signal and all of the samples of the signal from not more than about 5 Nyquist rate intervals.

30. A signal processing method according to claim 29, wherein the linear operator comprises a locally supported operator.

31. A signal processing method according to claim 30, wherein the locally supported operator comprises a differential operator, an integral operator, an interpolation operator, or an extrapolation operator.

32. A signal processing method according to claim 29, wherein the linear operator comprises an operator which is recursively defined from a locally supported operator.

33. A signal processing method according to claim 29, wherein the polynomial approximation comprises not more than 12 Nyquist rate samples of the signal.

34. A signal processing method according to claim 29, wherein the polynomial approximation comprises not more than 1 Nyquist rate interval.

35. A signal processing method according claim 29, the method comprising the steps of c. creating a monad at each Nyquist rate sampling point, each monad having its own interpolation polynomial, and d. joining adjacent monads together into a simplex or complex by using least square fit procedures to match the polynomial approximations and chromatic derivatives of adjacent monads.

* * * * *